(12) United States Patent
Lu et al.

(10) Patent No.: US 11,515,332 B2
(45) Date of Patent: Nov. 29, 2022

(54) FERROELECTRIC MEMORY DEVICE AND METHOD OF FORMING THE SAME

(71) Applicant: Taiwan Semiconductor Manufacturing Co., Ltd., Hsin-Chu (TW)

(72) Inventors: Chun-Chieh Lu, Taipei (TW); Sai-Hooi Yeong, Zhubei (TW); Bo-Feng Young, Taipei (TW); Yu-Ming Lin, Hsinchu (TW); Chih-Yu Chang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/108,218

(22) Filed: Dec. 1, 2020

(65) Prior Publication Data

US 2021/0375930 A1  Dec. 2, 2021

Related U.S. Application Data

(60) Provisional application No. 63/031,033, filed on May 28, 2020.

(51) Int. Cl.
| | | |
|---|---|---|
| H01L 21/00 | (2006.01) | |
| H01L 27/11597 | (2017.01) | |
| H01L 29/24 | (2006.01) | |
| H01L 27/1159 | (2017.01) | |
| H01L 21/477 | (2006.01) | |
| H01L 21/425 | (2006.01) | |
| H01L 21/383 | (2006.01) | |
| H01L 21/02 | (2006.01) | |

(52) U.S. Cl.
CPC .. *H01L 27/11597* (2013.01); *H01L 21/02565* (2013.01); *H01L 21/383* (2013.01); *H01L 21/425* (2013.01); *H01L 21/477* (2013.01); *H01L 27/1159* (2013.01); *H01L 29/24* (2013.01)

(58) Field of Classification Search
CPC ......... H01L 27/11597; H01L 21/02565; H01L 21/383; H01L 21/425; H01L 21/477; H01L 27/1159; H01L 29/24
See application file for complete search history.

(56) References Cited

U.S. PATENT DOCUMENTS

| | | | |
|---|---|---|---|
| 9,825,181 B2 | 11/2017 | Tsubuku et al. | |
| 10,008,614 B1 | 6/2018 | He et al. | |
| 10,056,463 B2 | 8/2018 | Xing et al. | |
| 2006/0118844 A1 | 6/2006 | Kijima et al. | |
| 2019/0131456 A1 | 5/2019 | Wu et al. | |
| 2020/0227439 A1* | 7/2020 | Sato | H01L 27/11587 |
| 2020/0234750 A1 | 7/2020 | Sharma et al. | |
| 2021/0375937 A1* | 12/2021 | Wu | H01L 27/11587 |

(Continued)

*Primary Examiner* — Richard A Booth
(74) *Attorney, Agent, or Firm* — Eschweiler & Potashnik, LLC

(57) ABSTRACT

A memory cell includes a transistor over a semiconductor substrate. The transistor includes a ferroelectric layer arranged along a sidewall of a word line. The ferroelectric layer includes a species with valence of 5, valence of 7, or a combination thereof. An oxide semiconductor layer is electrically coupled to a source line and a bit line. The ferroelectric layer is disposed between the oxide semiconductor layer and the word line.

20 Claims, 60 Drawing Sheets

(56) References Cited

U.S. PATENT DOCUMENTS

2022/0005830 A1\* 1/2022 Wu .................. H01L 27/11597
2022/0139960 A1\* 5/2022 Said ................. H01L 29/78391
257/295

\* cited by examiner

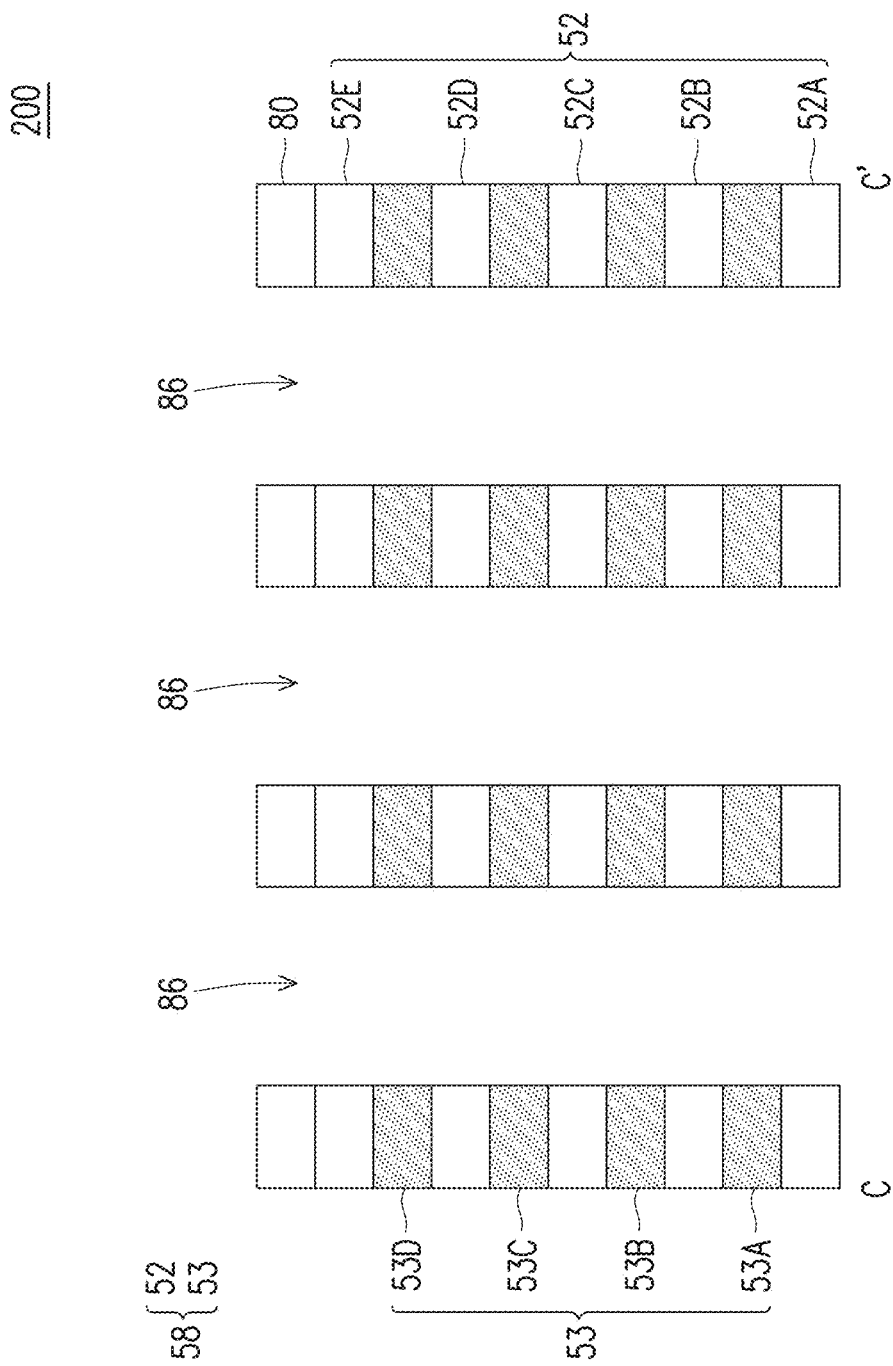

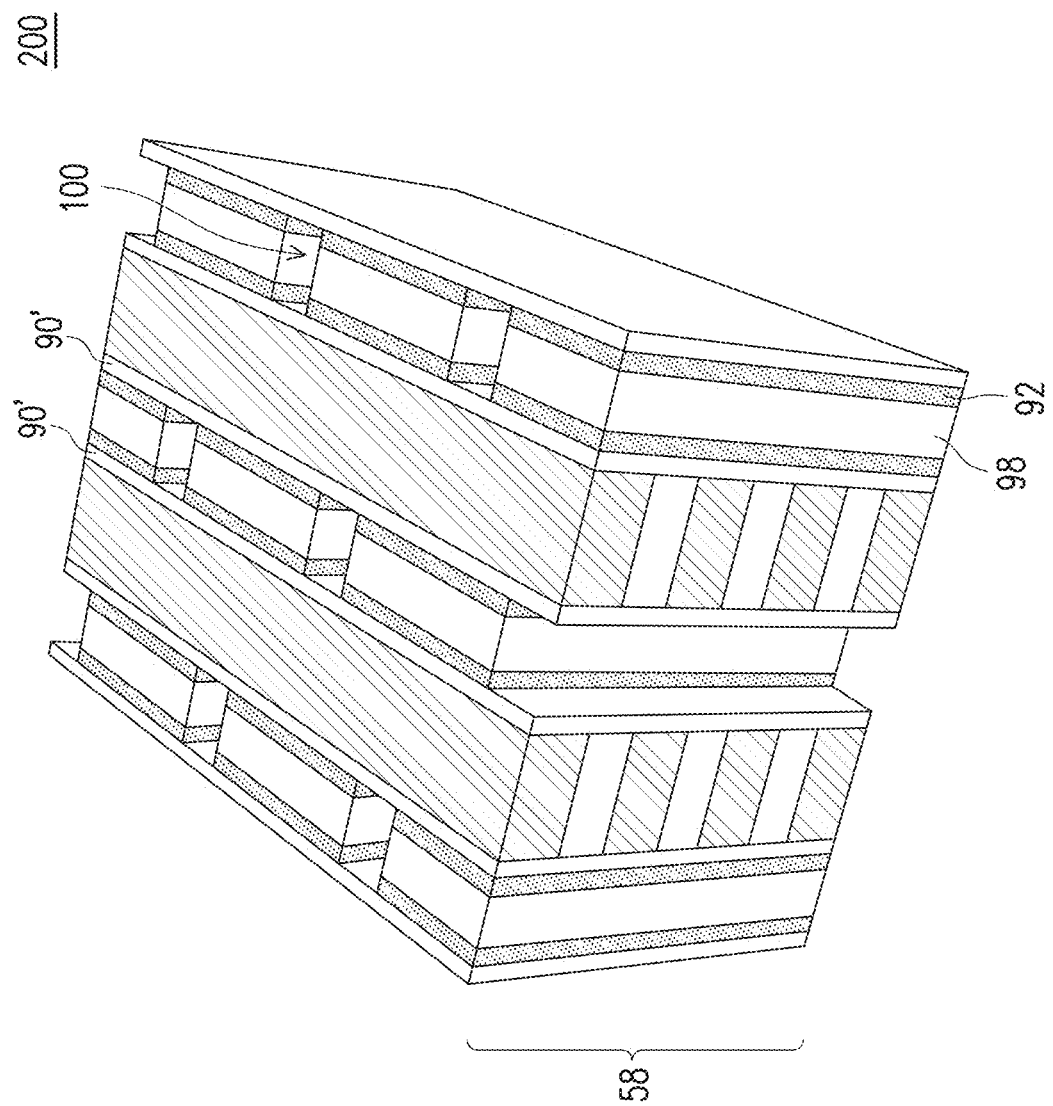

FERROELECTRIC MEMORY DEVICE AND METHOD OF FORMING THE SAME

REFERENCE TO RELATED APPLICATION

This Application claims the benefit of U.S. Provisional Application No. 63/031,033, filed on May 28, 2020, the contents of which are hereby incorporated by reference in their entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12, 13, 14, 15A, 15B, 16A, 16B, 17A, 17B, 18A, 18B, 18C, 18D, 19A, 19B, 20A, 20B, 20C, 22, 23, 24, 25A, 25B, 26A, 26B, 27A, 27B, 28A, 28B, 29A, 29B, 30A, 30B, 30C, 30D and 30E illustrate varying views of manufacturing a ferroelectric memory device in accordance with some embodiments.

DETAILED DESCRIPTION

Figure 1A:
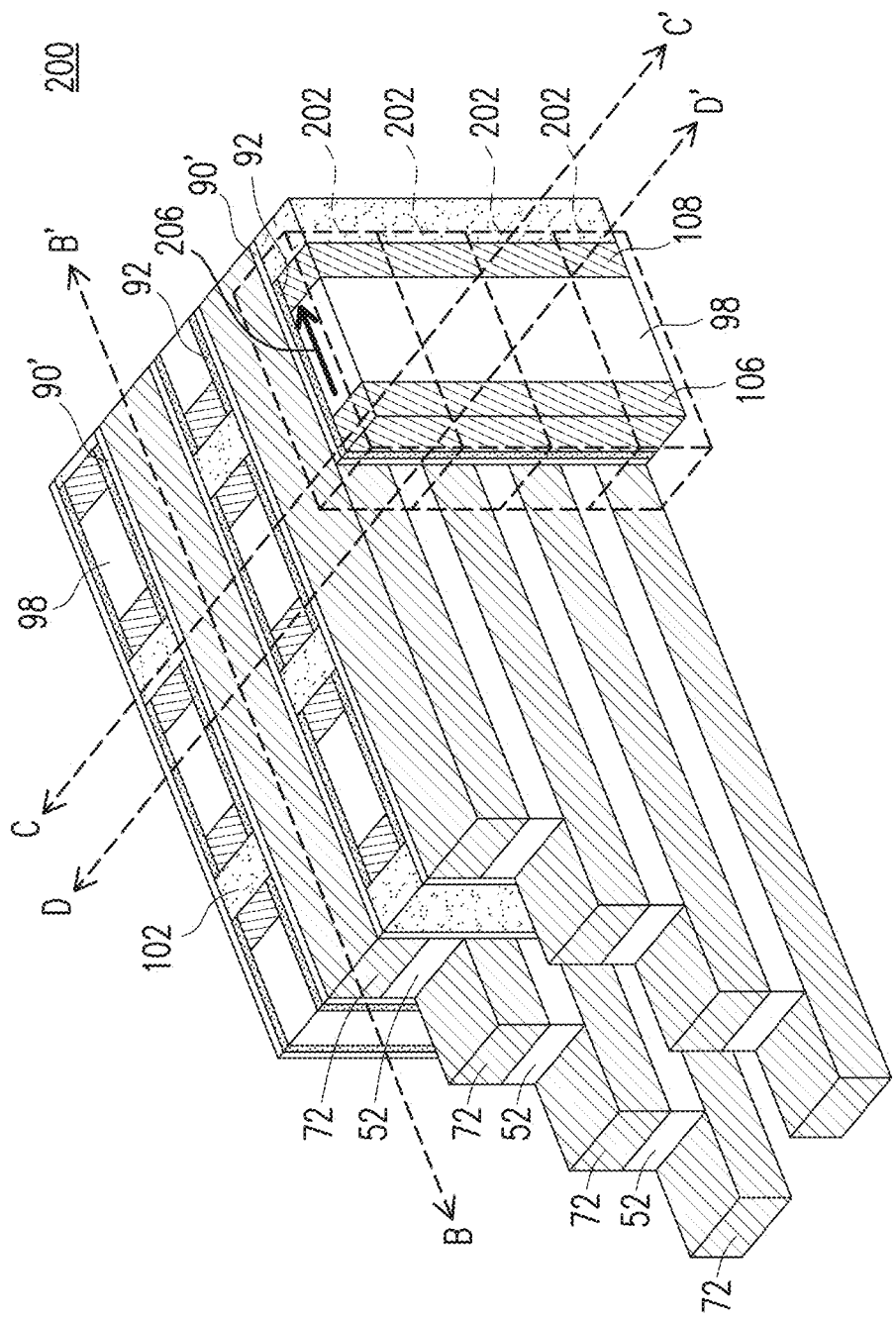
FIGS. 1A, 1B, and 1C illustrate a simplified perspective view, a circuit diagram, and a top down view of a ferroelectric memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a ferroelectric field effect transistor (FeFET) memory circuit including a plurality of vertically stacked memory cells. In some embodiments, respective memory cells are regarded as a FeFET that includes a word line region acting as a gate electrode, a bit line region acting as a first source/drain electrode, and a source line region acting as a second source/drain electrode, a ferroelectric material as a gate dielectric, and an oxide semiconductor (OS) as a channel region. In some embodiments, respective memory cells are regarded as a thin film transistor (TFT).

Figure 1B:
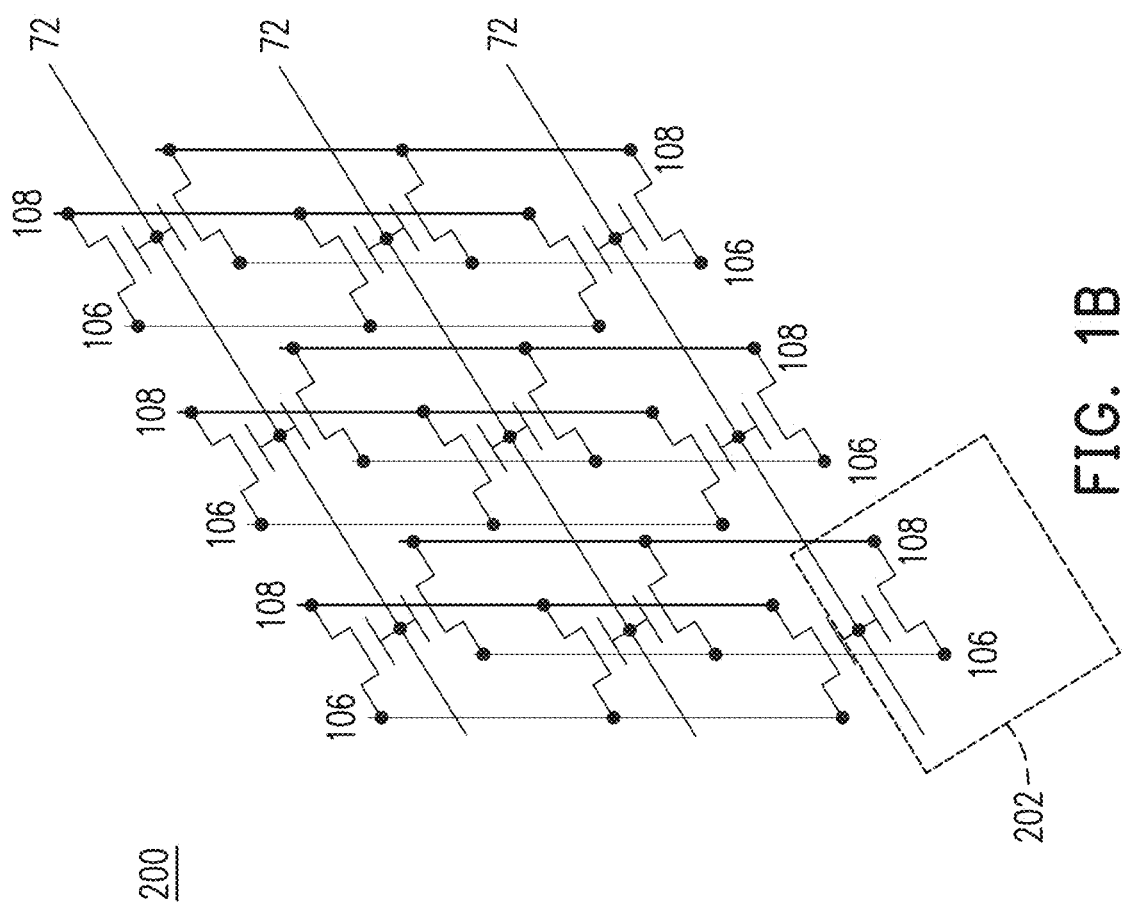
Figure 1C:
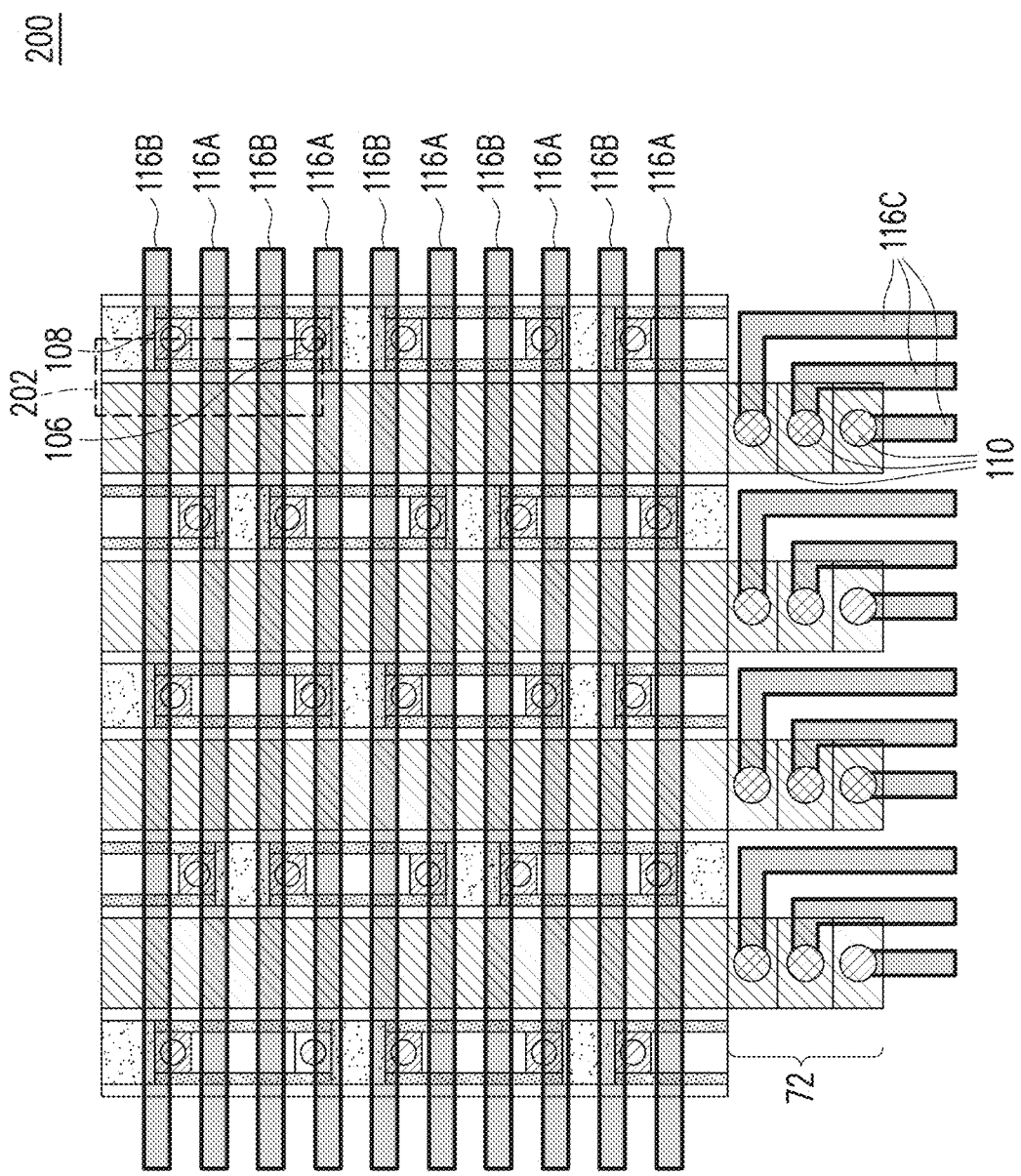

FIGS. 1A, 1B, and 1C illustrate examples of a memory array according to some embodiments. FIG. 1A illustrates an example of a portion of a simplified memory array 200 in a partial three-dimensional view; FIG. 1B illustrates a circuit diagram of the memory array 200; and FIG. 1C illustrates a top down view of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 200 is a memory array, such as a NOR memory array, or the like. In some embodiments, a gate of each memory cell 202 is electrically coupled to a respective word line (e.g., conductive line 72), a first source/drain region of each memory cell 202 is electrically coupled to a respective bit line (e.g., conductive line 116B), and a second source/drain region of each memory cell 202 is electrically coupled to a respective source line (e.g., conductive line 116A), which electrically couples the second source/drain region to ground. The memory cells 202 in a same horizontal row of the memory array 200 may share a common word line while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to exposed portions of the conductive lines 72, respectively.

The memory array 200 further includes conductive pillars 106 (e.g., electrically connected to bit lines) and conductive pillars 108 (e.g., electrically connected to source lines) arranged alternately. The conductive pillars 106 and 108 may each extend in a direction perpendicular to the conductive lines 72. A dielectric material 98 is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

In some embodiments, the memory array 200 may also include an oxide semiconductor (OS) material as a channel layer 92. The channel layer 92 may provide channel regions for the memory cells 202. For example, when an appropriate voltage (e.g., higher than a respective threshold voltage ($V_{th}$) of a corresponding memory cell 202) is applied through a corresponding conductive line 72, a region of the channel layer 92 that intersects the conductive line 72 may allow current to flow from the conductive pillars 106 to the conductive pillars 108 (e.g., in the direction indicated by arrow 206).

In some embodiments, a ferroelectric layer 90' is disposed between the channel layer 92 and each of the conductive lines 72 and the dielectric layers 52, and the ferroelectric layer 90' may serve as a gate dielectric for each memory cell 202. In some embodiments, the ferroelectric layer 90' includes a ferroelectric material, such as a hafnium oxide, hafnium zirconium oxide, silicon-doped hafnium oxide, or the like.

The ferroelectric layer 90' may be polarized in one of two different directions, and the polarization direction may be changed by applying an appropriate voltage differential across the ferroelectric layer 90' and generating an appropriate electric field. The polarization may be relatively localized (e.g., generally contained within each boundaries of the memory cells 202), and a continuous region of the ferroelectric layer 90' may extend across a plurality of memory cells 202. Depending on a polarization direction of a particular region of the ferroelectric layer 90', a threshold voltage of a corresponding memory cell 202 varies, and a digital value (e.g., 0 or 1) can be stored. For example, when a region of the ferroelectric layer 90' has a first electrical polarization direction, the corresponding memory cell 202 may have a relatively low threshold voltage, and when the region of the ferroelectric layer 90' has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

In some embodiments, the ferroelectric layer 90' contains a species (e.g., an additional species) with valence of 5, e.g., nitrogen (N), or valence of 7 e.g., fluorine (F) or a combination thereof so as to eliminate or block traps or defects in an interface IF2 between the ferroelectric layer 90'/190' and the channel layer 92/192', and/or to occupy oxygen vacancies in the ferroelectric layer 90'/190' and serve as a passivation to suppress interdiffusion of oxygen, hydrogen and vacancies, so that the intrinsic fatigue performance and endurance of the ferroelectric layer 90'/190' may be improved.

To perform a write operation on a memory cell 202 in such embodiments, a write voltage is applied across a portion of the ferroelectric layer 90' corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). By applying the write voltage across the portion of the ferroelectric layer 90', a polarization direction of the region of the ferroelectric layer 90' may be changed. As a result, the corresponding threshold voltage of the corresponding memory cell 202 may also be switched from a low threshold voltage to a high threshold voltage or vice versa, and a digital value may be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the ferroelectric layer 90', the memory cell 202 may or may not be turned on. As a result, the conductive pillar 106 may or may not be discharged through the conductive pillar 108 (e.g., a source line that is coupled to ground), and the digital value stored in the memory cell 202 can be determined. Because the conductive lines 72 intersect the conductive pillars 106 and 108, individual memory cells 202 may be selected for the read operation.

The partial three-dimensional view of FIG. 1A further illustrates lines corresponding to reference cross-sections of the memory array 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98 and the isolation pillars 102. Cross-section D-D' is perpendicular to cross-section B-B' and extends through the dielectric materials 98 and the conductive pillars 106. Subsequent figures refer to these reference cross-sections for clarity.

Figure 2:
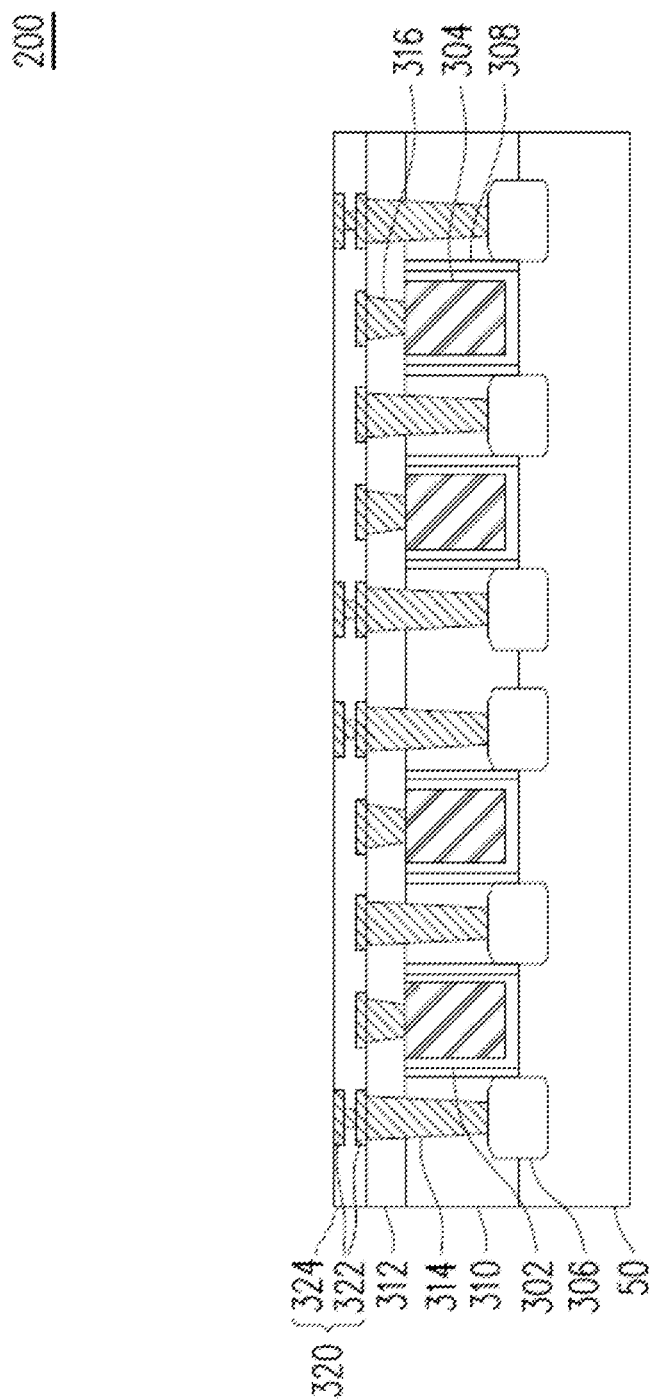

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3:
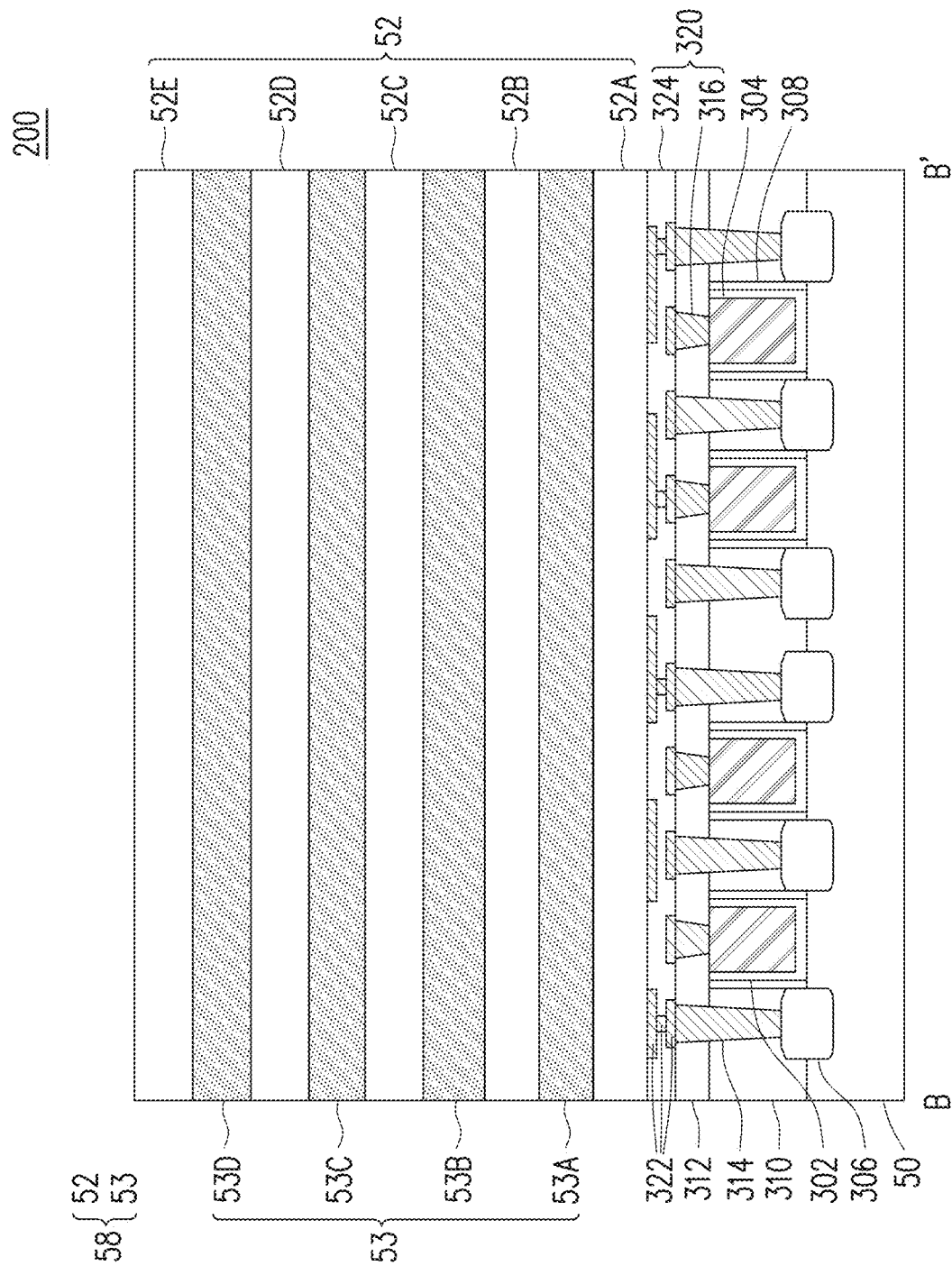

In FIG. 3, a multi-layer stack 58 is formed over the structure of FIG. 2. The substrate 50, the transistors, the ILDs 310 and 312, and the interconnect structure 320 may be omitted from subsequent drawings for the purposes of simplicity and clarity. Although the multi-layer stack 58 is illustrated as contacting the dielectric layers 324 of the interconnect structure 320, any number of intermediate layers may be disposed between the substrate 50 and the multi-layer stack 58. For example, one or more interconnect layers including conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B). In some embodiments, one or more interconnect layers including conductive features in insulting layers (e.g., low-k dielectric layers) may be disposed over the multi-layer stack 58.

In FIG. 3, the multi-layer stack 58 includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIG. 3 illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIGS. 4 through 12 are views of intermediate stages in the manufacturing a staircase structure of the memory array 200, in accordance with some embodiments. FIGS. 4 through 12 are illustrated along reference cross-section B-B' illustrated in FIG. 1A.

Figure 4:
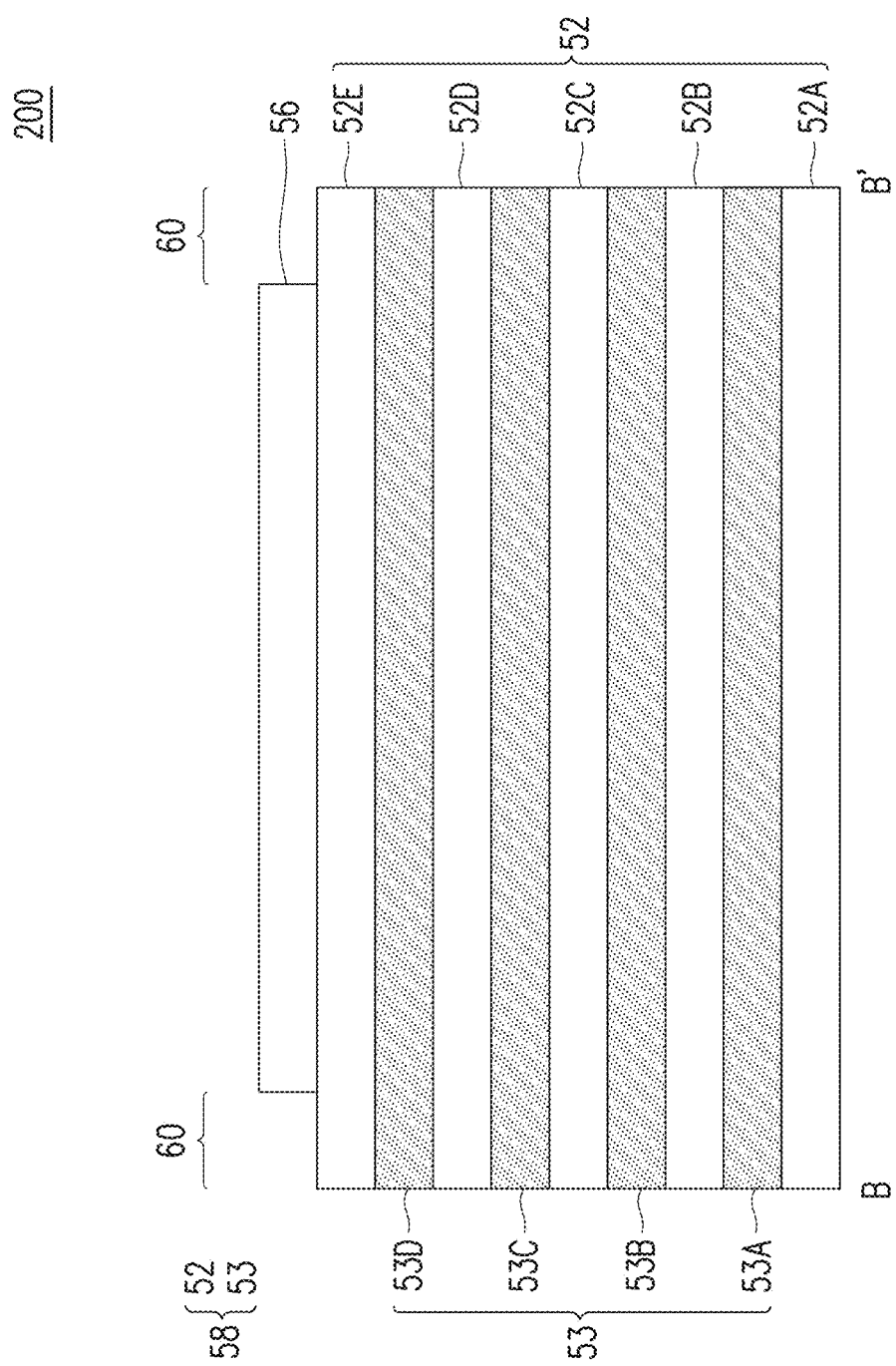

In FIG. 4, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 5:
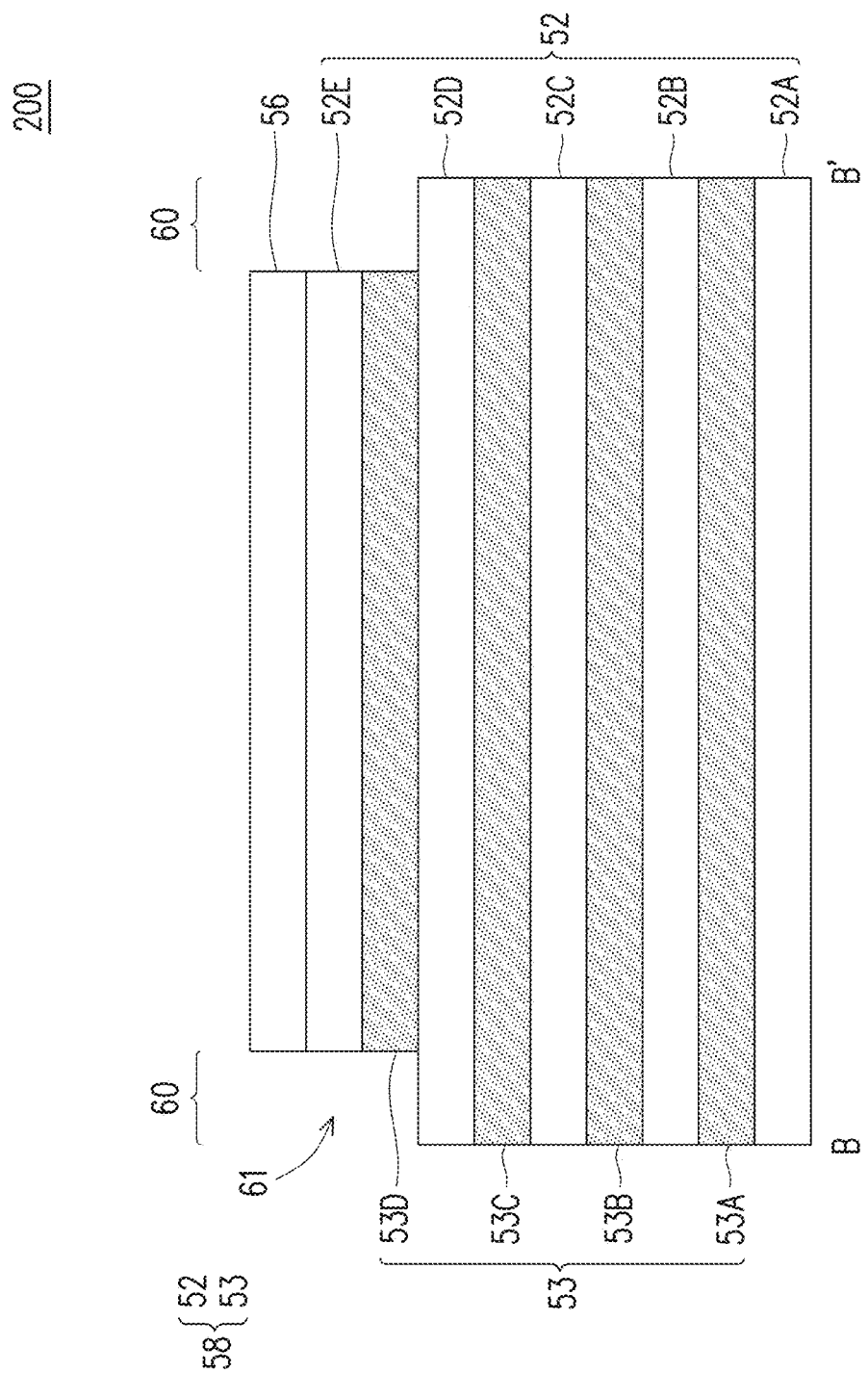

In FIG. 5, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 6:
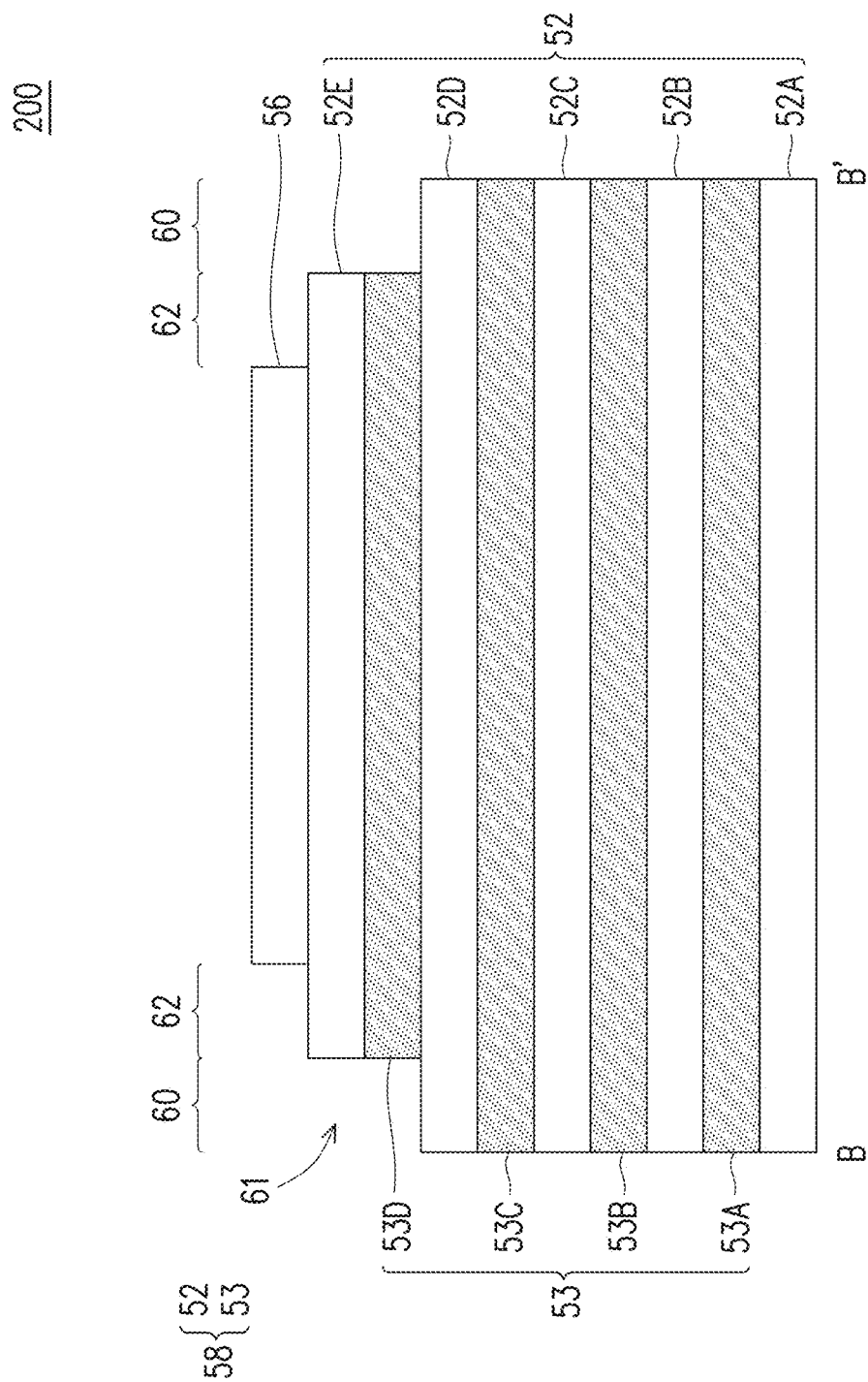

In FIG. 6, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 7:
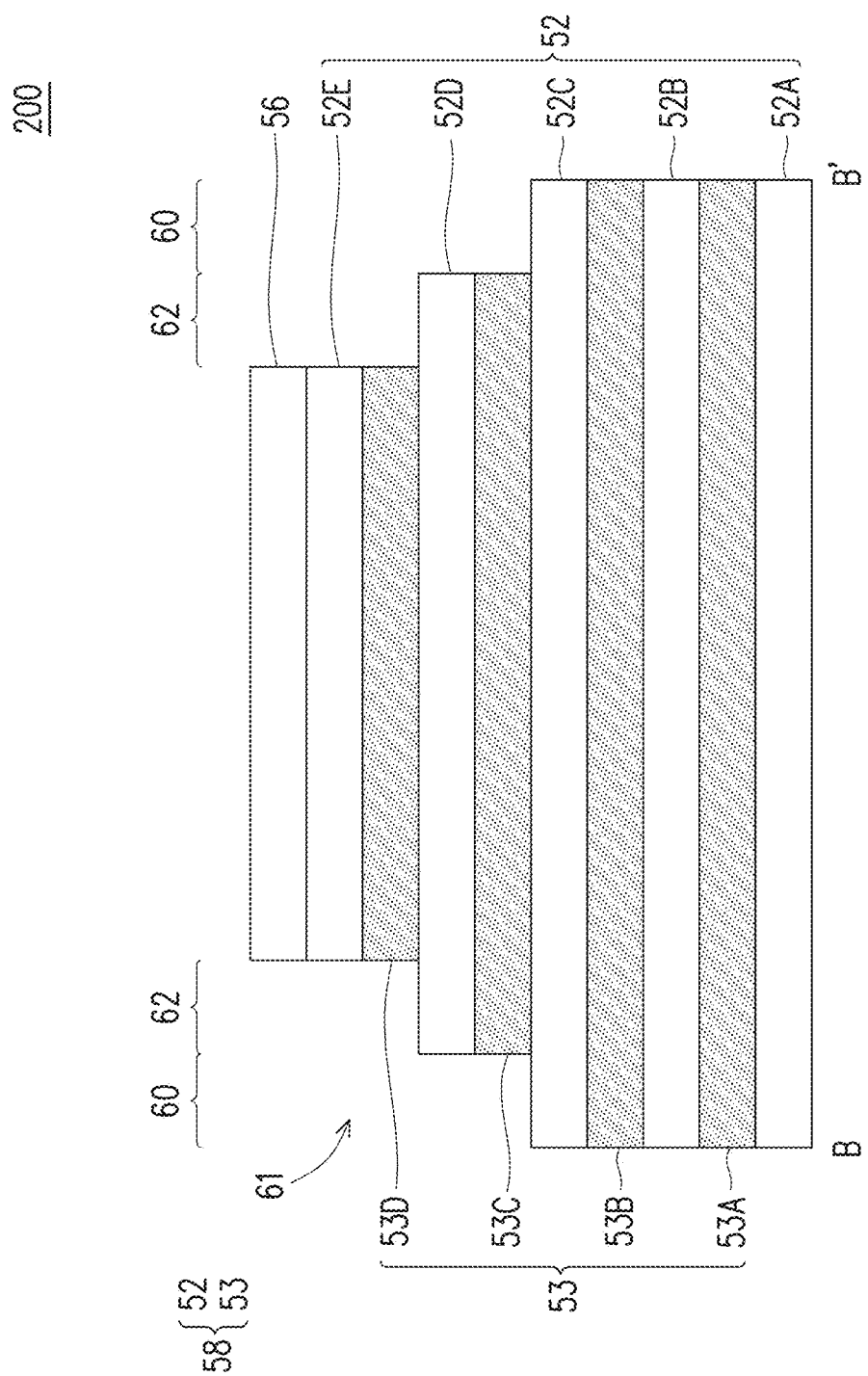

In FIG. 7, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 8:
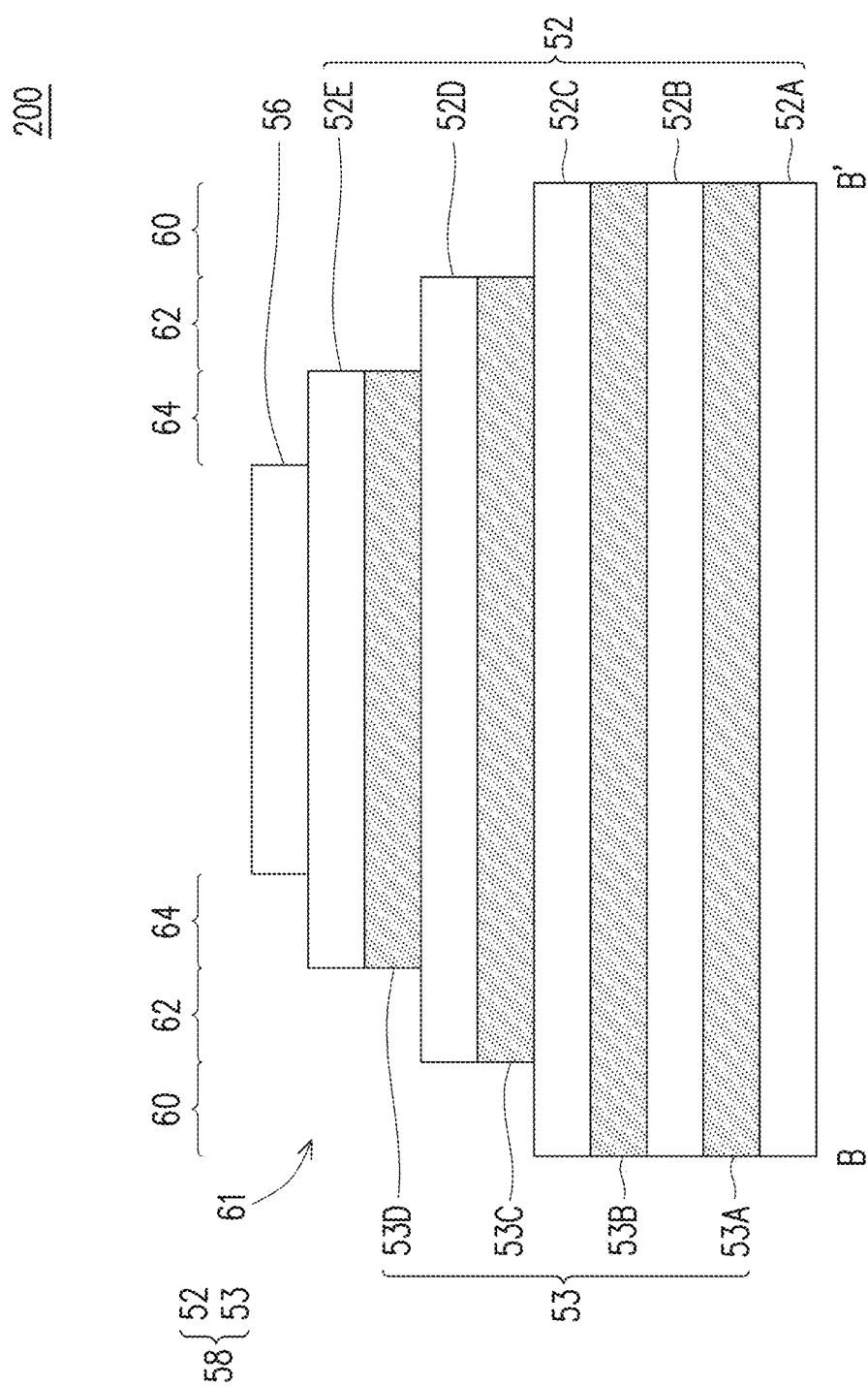

In FIG. 8, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 9:
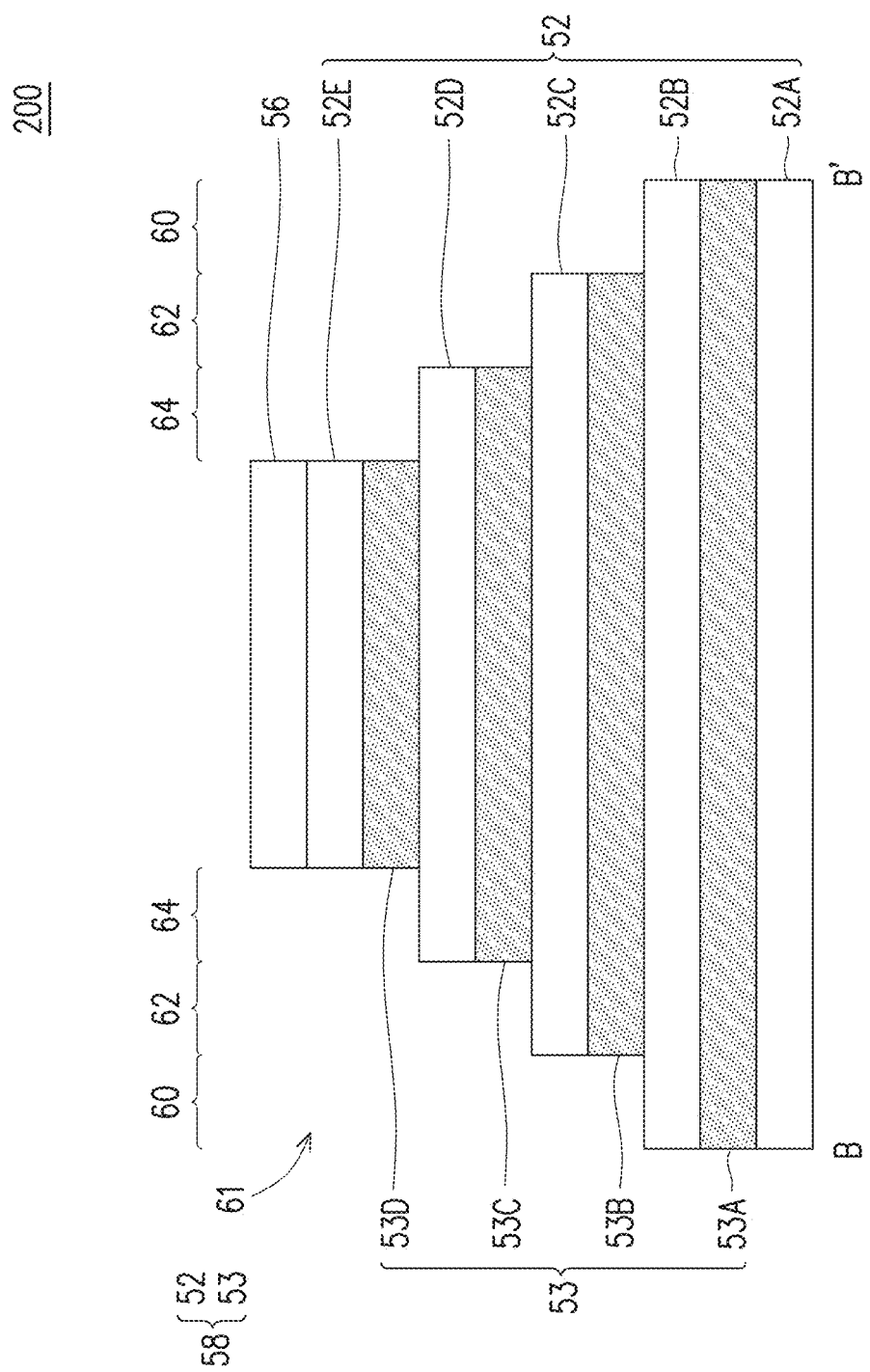

In FIG. 9, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 10:
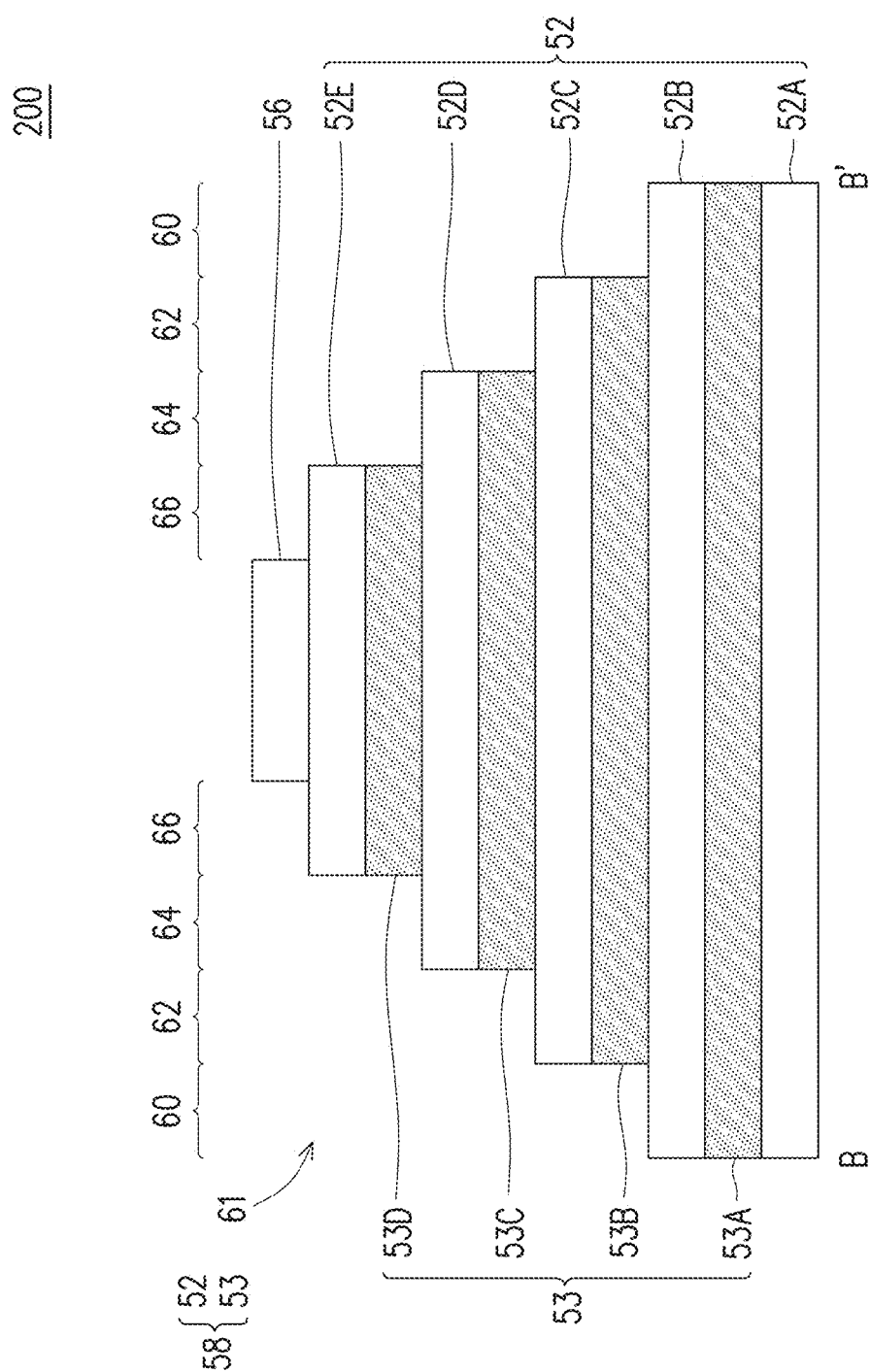

In FIG. 10, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 11:
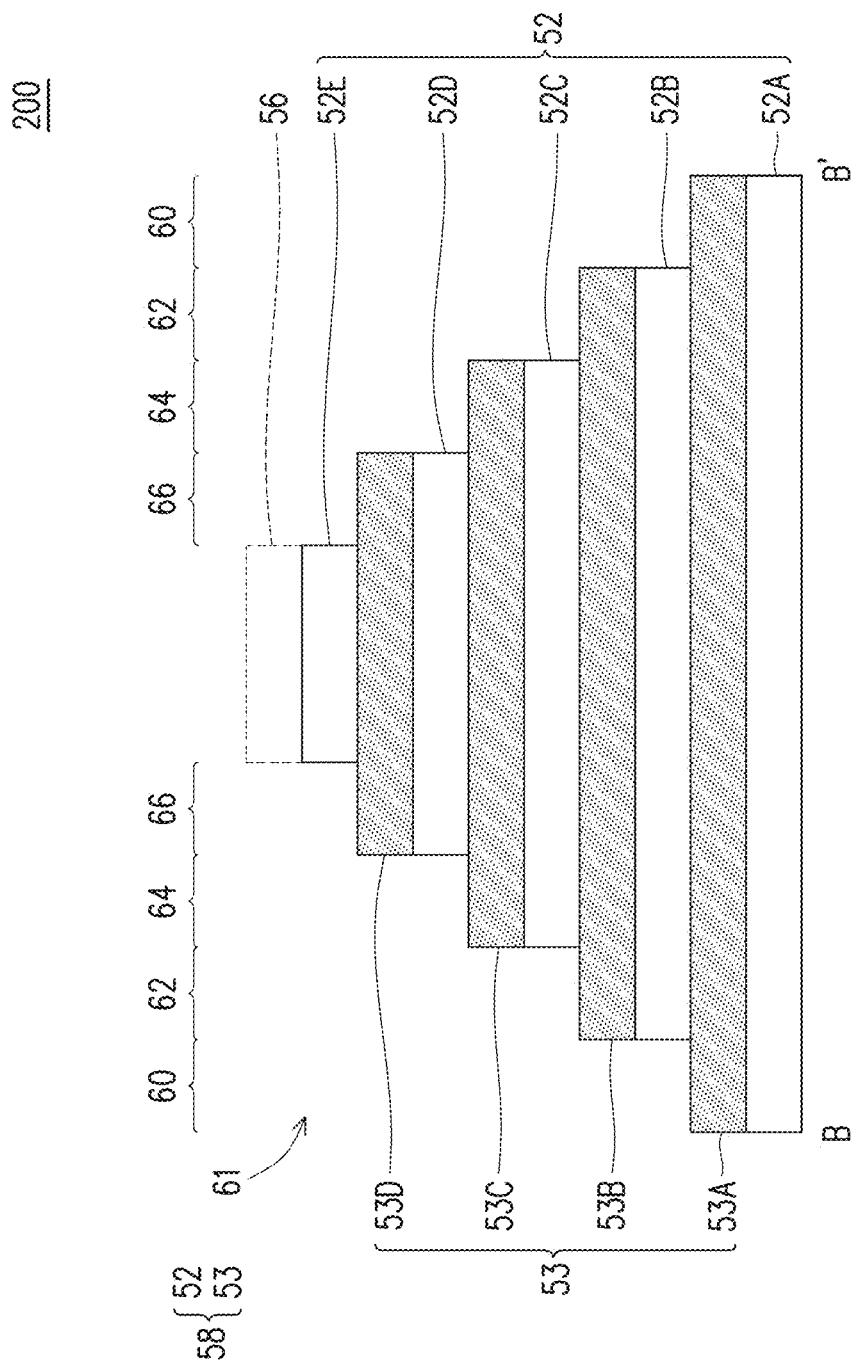

In FIG. 11, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 12:
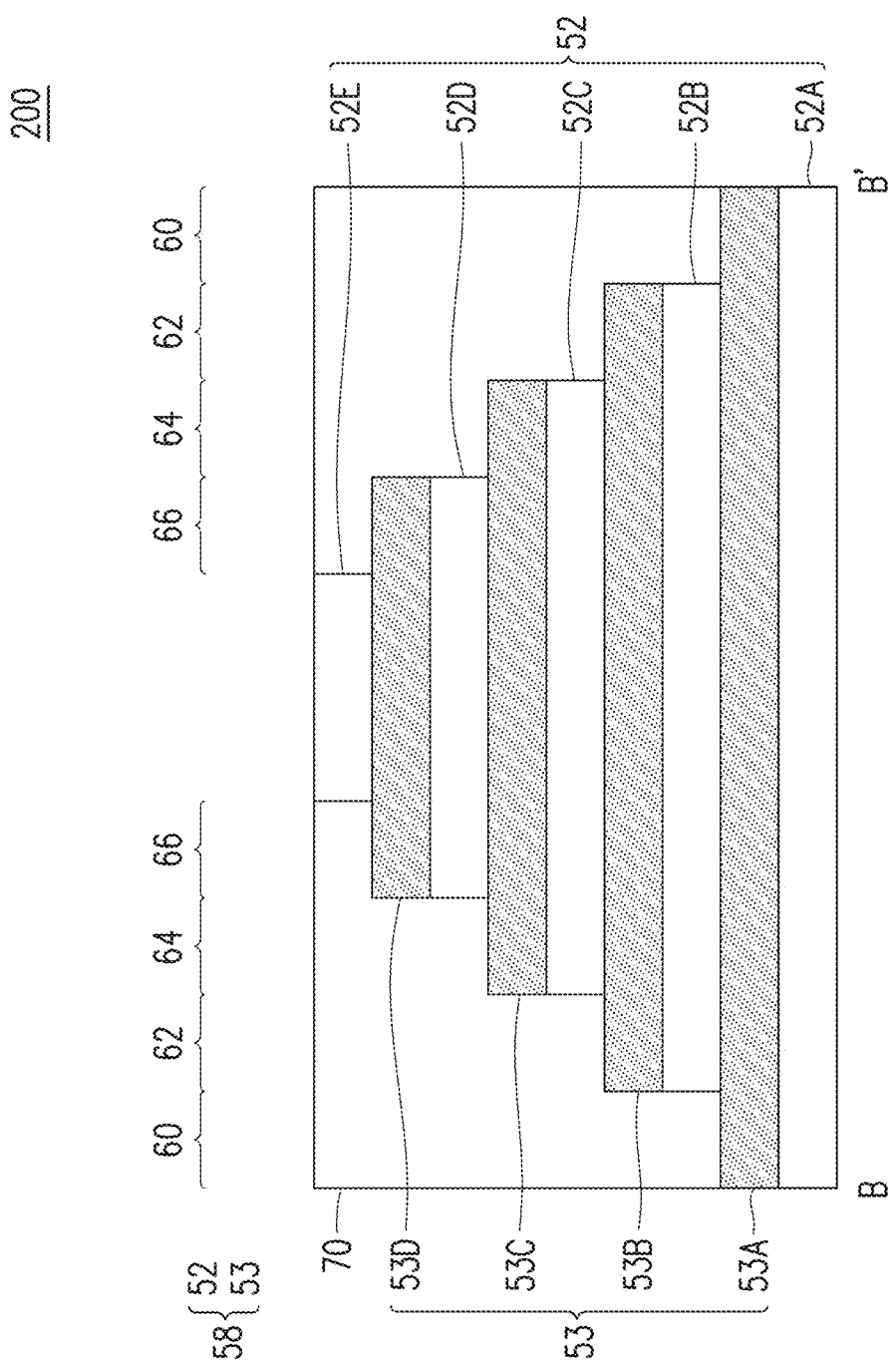

In FIG. 12, an inter-metal dielectric (IMD) 70 is formed over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. Thereafter, a removal process is performed to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are level after the planarization process is completed. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

As shown in FIG. 12, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 16A and 16B. Lower conductive lines 72 are longer and extend laterally past upper conductive lines 72, and a width of each of the conductive lines 72 increases in a direction towards the substrate 50 (see FIGS. 1A and 30E).

FIGS. 13 through 16B are views of intermediate stages in the manufacturing of a memory region of the memory array 200, in accordance with some embodiments. In FIGS. 13 through 16B, the bulk multi-layer stack 58 is patterned to form trenches 86 therethrough, and the sacrificial layers 53 are replaced with conductive materials to define the conductive lines 72. The conductive lines 72 may correspond to word lines in the memory array 200, and the conductive lines 72 may further provide gate electrodes for the resulting memory cells of the memory array 200. FIGS. 13, 14, 15B and 16B are illustrated along reference cross-section C-C' illustrated in FIG. 1A. FIGS. 15A and 16A are illustrated in a partial three-dimensional view, which are perspective views of the part enclosed by the dashed line 30 in FIGS. 15B and 16B respectively.

Figure 13:
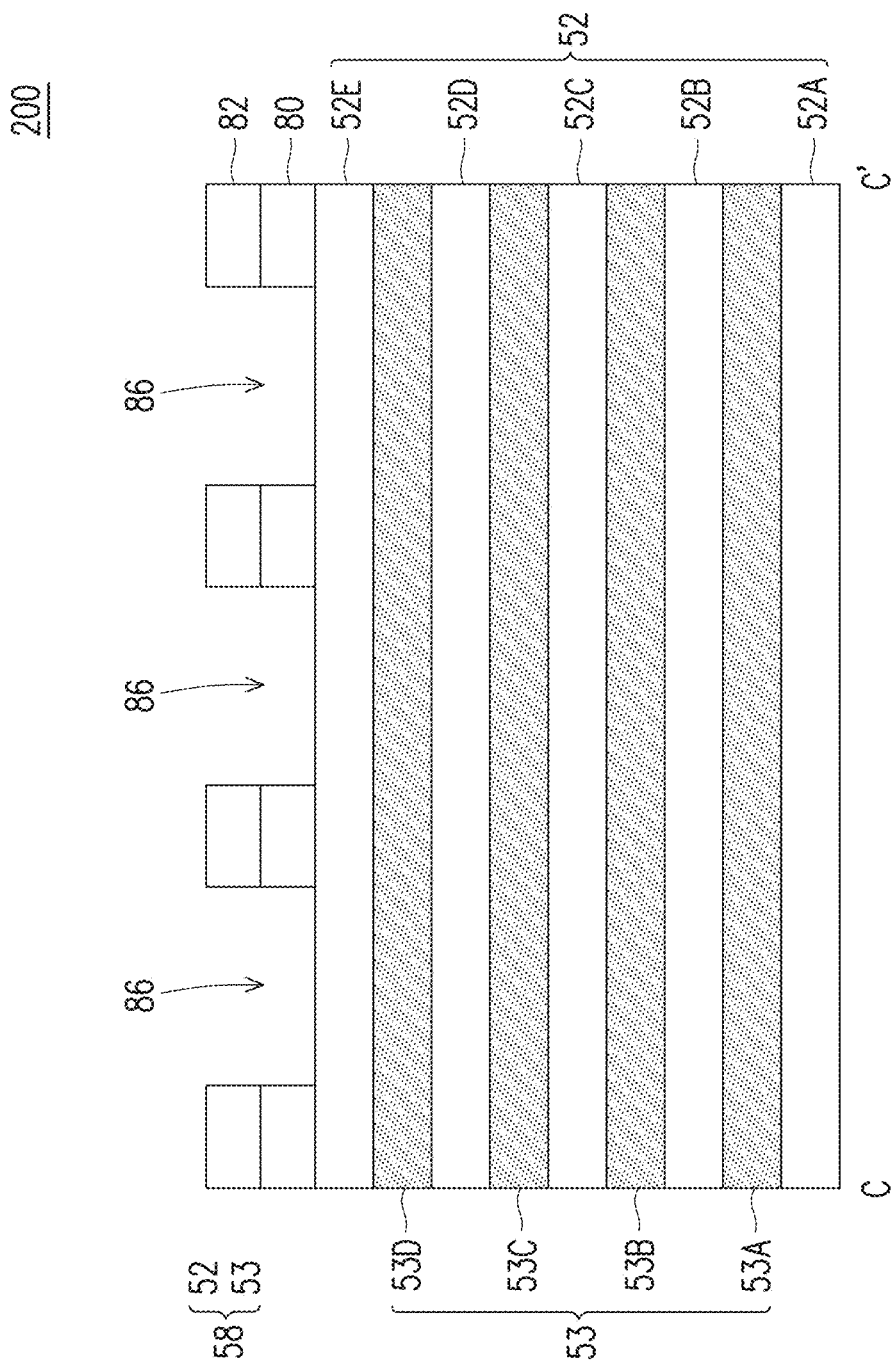

In FIG. 13, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist patterns 82 may be optionally removed by an ashing process, for example.

Figure 15A:
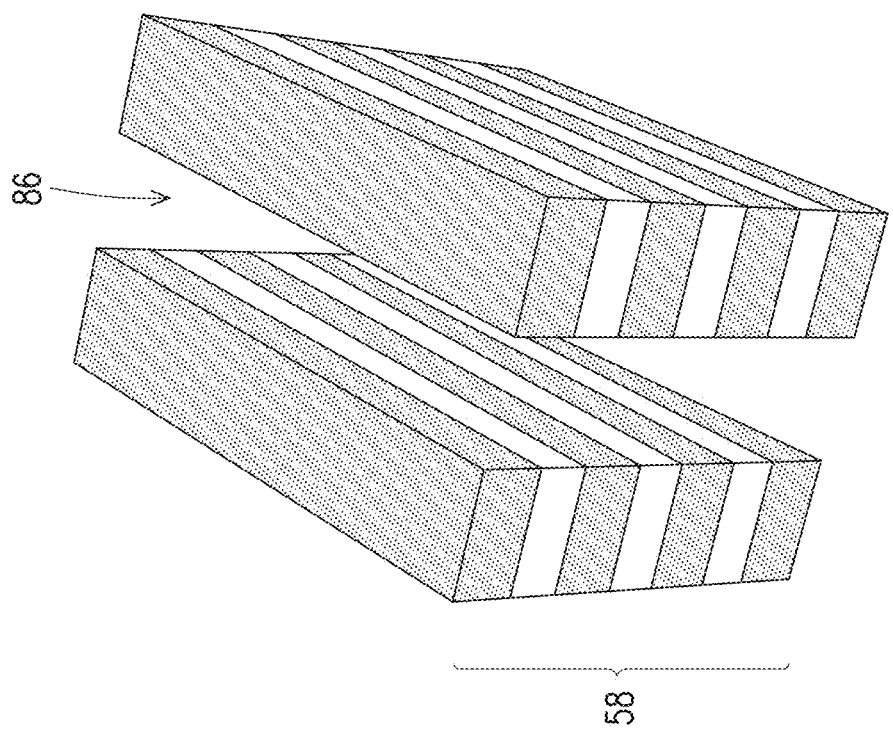
Figure 15B:
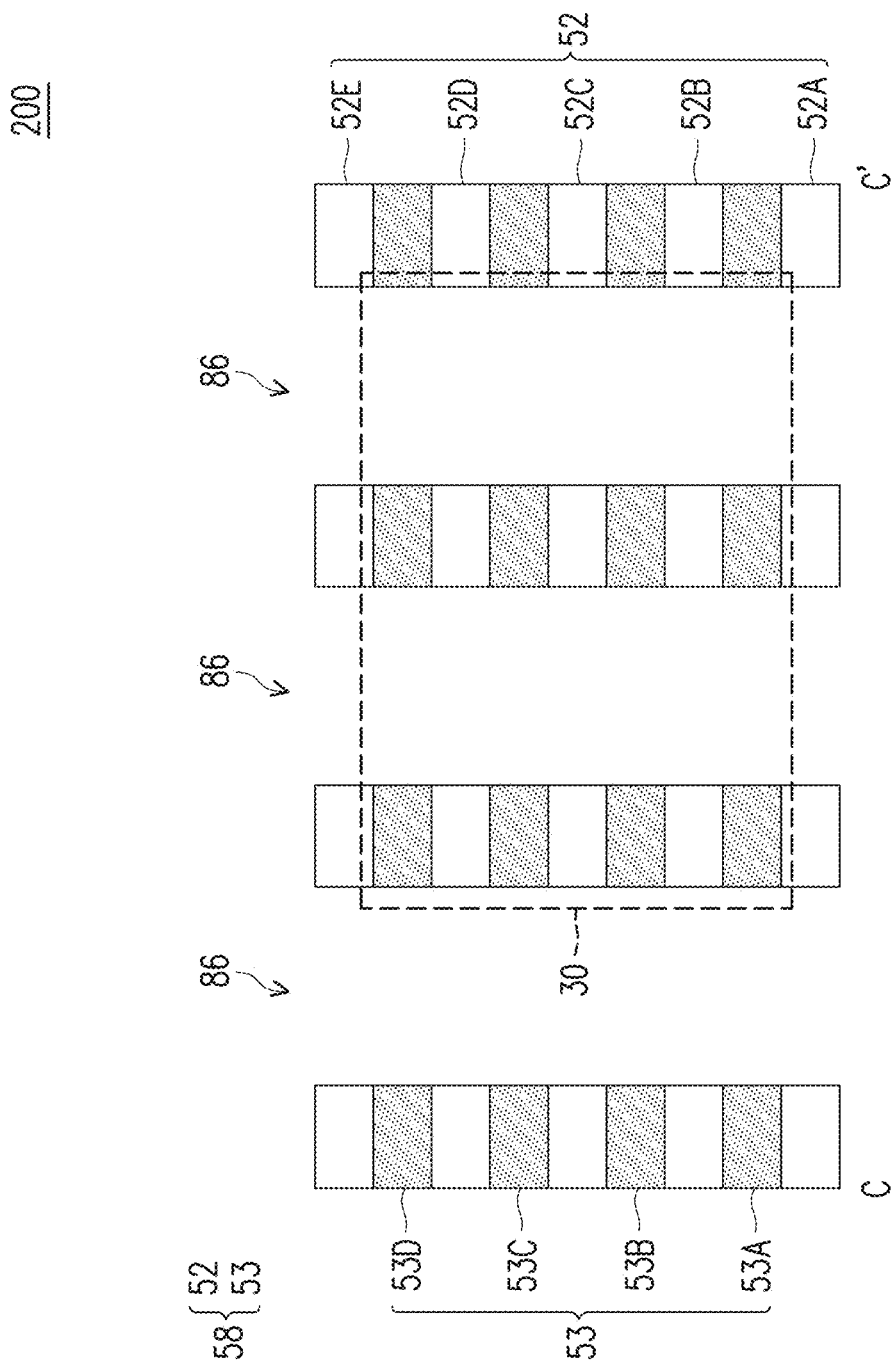

In FIGS. 14, 15A and 15B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

In FIGS. 15A, 15B, 16A and 16B, portions of the sacrificial layers 53A-53D (collectively referred to as sacrificial layers 53) are replaced with conductive lines 72A-72D (collectively referred to as conductive lines 72). In some embodiments, portions of the sacrificial layers 53 are removed by an acceptable process, such as a wet etching process, a dry etching process or both. In some embodiments, a periphery region surrounding an array region with a memory array has some portions of the sacrificial layers 53 that are not removed by the said replacement process. Therefore, some portions of the sacrificial layers 53 in the periphery region also provides further support to prevent the dielectric layers 52 in the array region from collapse.

Thereafter, conductive lines 72 are filled into the space between two adjacent dielectric layers 52. As shown in the local enlarged view, each conductive line 72 includes two barrier layers 71 and 75 and a metal layer 73 between the barrier layers 71 and 75. Specifically, the barrier layer 71 or 75 is disposed between the metal layer 73 and the adjacent dielectric layer 52. The barrier layers 71 and 75 may prevent the metal layer from diffusion to the adjacent dielectric layers 52. The barrier layers 71 and 75 may also provide the function of increasing the adhesion between the metal layer 73 and the adjacent dielectric layers 52, and may be referred to as glue layers in some examples. In some embodiments, both barrier layers and glue layers with different materials are provided. The barrier layers 71 and 75 are formed of a first conductive material, such as a metal nitride, such as titanium nitride, tantalum nitride, molybdenum nitride, zirconium nitride, hafnium nitride, or the like. The metal layer 73 may be formed of a second conductive material, such as a metal, such as tungsten, ruthenium, molybdenum, cobalt, aluminum, nickel, copper, silver, gold, alloys thereof, or the like. The barrier layers 71, 75, and metal layer 73 may each be formed by an acceptable deposition process such as CVD, PVD, ALD, PECVD, or the like. The first conductive material of the barrier layers 71, and 75, and the second conductive material of the metal layer 73 are further deposited on the sidewalls of the multi-layer stack 58 and fill in the trenches 86. Thereafter, the first conductive material of the barrier layers 71, and 75, and the second conductive material of the metal layer 73 in the trenches 86 are removed by an etching back process. An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A).

In alternative embodiments, portions of the sacrificial layers 53 are replaced with the conductive lines 72 after conductive pillars 106 and 108 (shown in FIGS. 29A and 29B) are formed. In addition to the conductive pillars 106 and 108, the dielectric materials 98, the channel layer 92, and the isolation pillars 102, some portions of the sacrificial layers 53 in the periphery region also provides further support to prevent the dielectric layers 52 in the array region from collapse.

FIGS. 17A through 21 illustrate forming a ferroelectric layer 90' and a channel layer 92 in the trenches 86. FIGS. 17A, 18A, 19A and 20A are illustrated in a partial three-dimensional view, which are perspective views of the part enclosed by the dashed line 30 in FIGS. 17B, 18B, 19B and 20B respectively. In FIGS. 17B, 18B, 19B and 20B, cross-sectional views are provided along line C-C' of FIG. 1A.

Figure 18A:
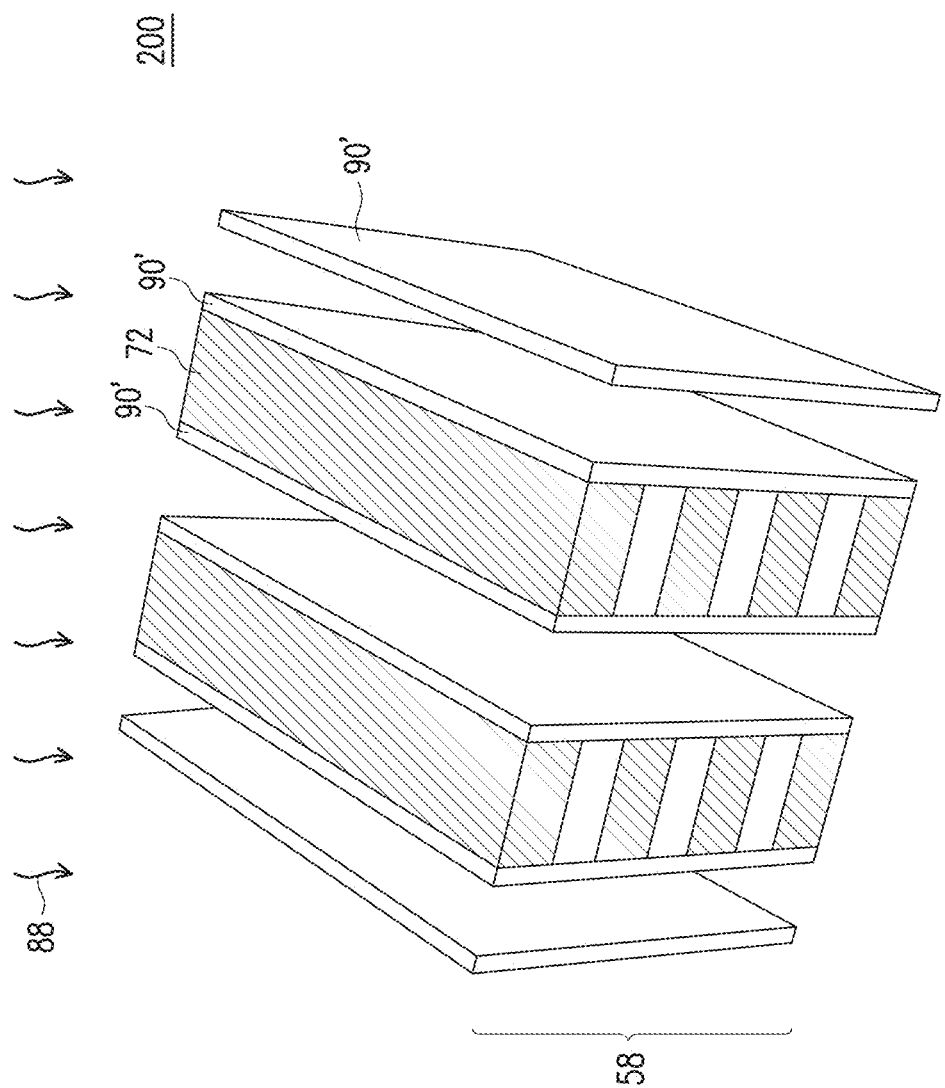
Figure 18B:
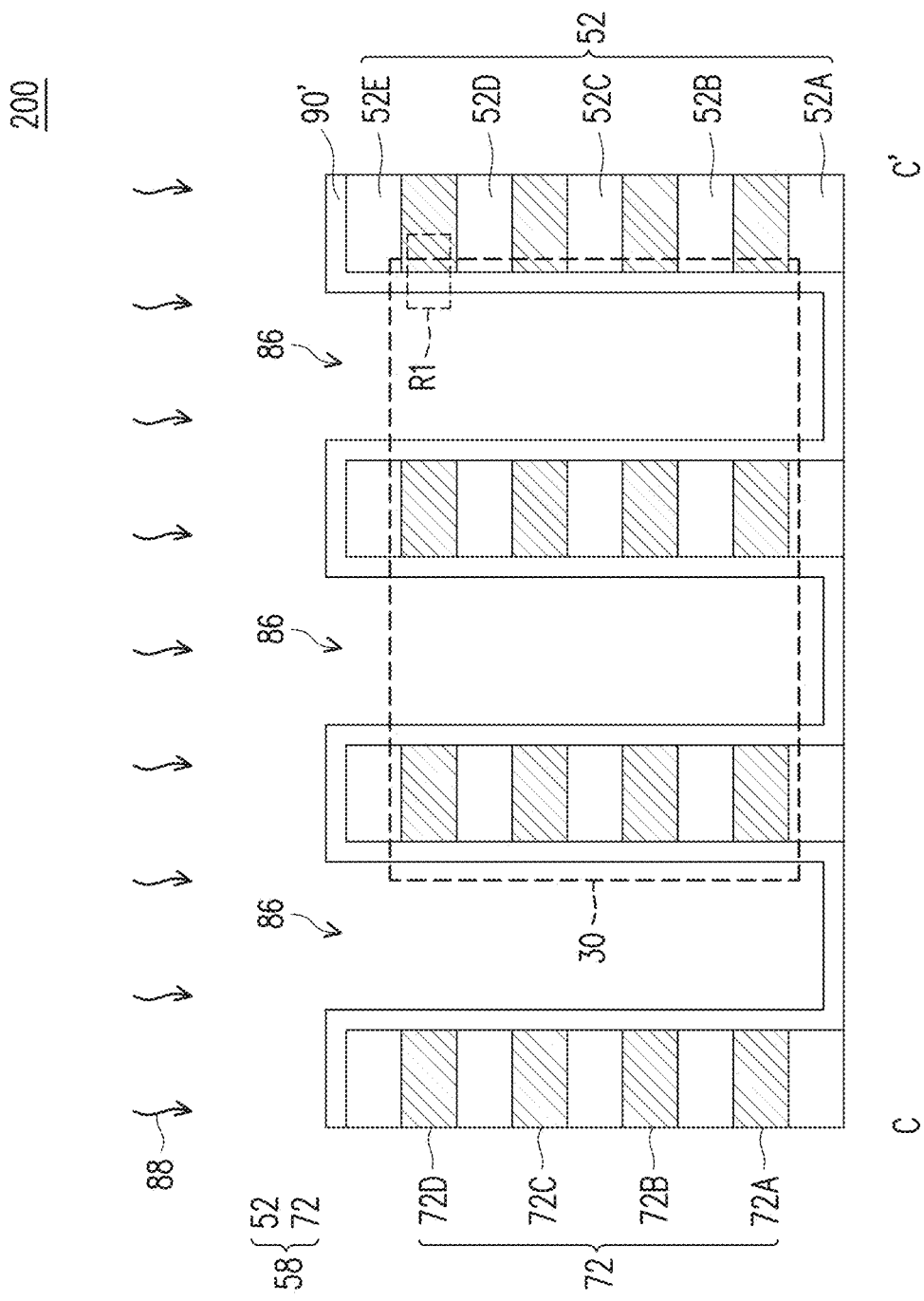
Figure 18D:
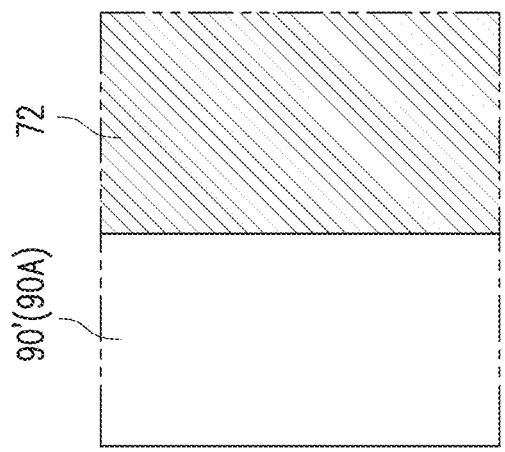
Figure 18C:
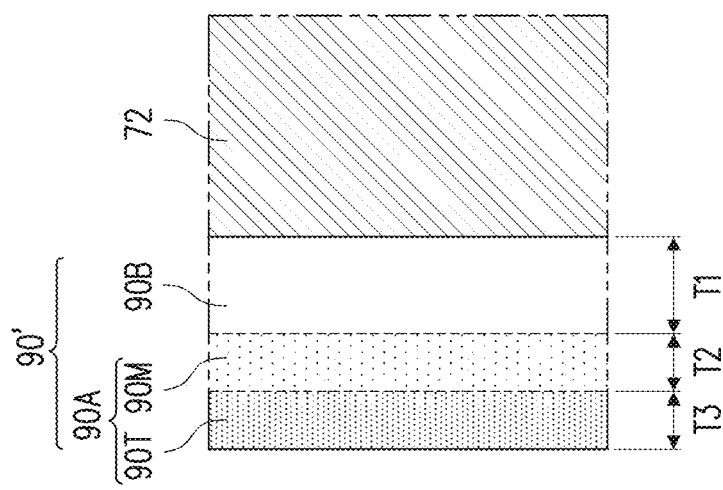
Figure 19A:
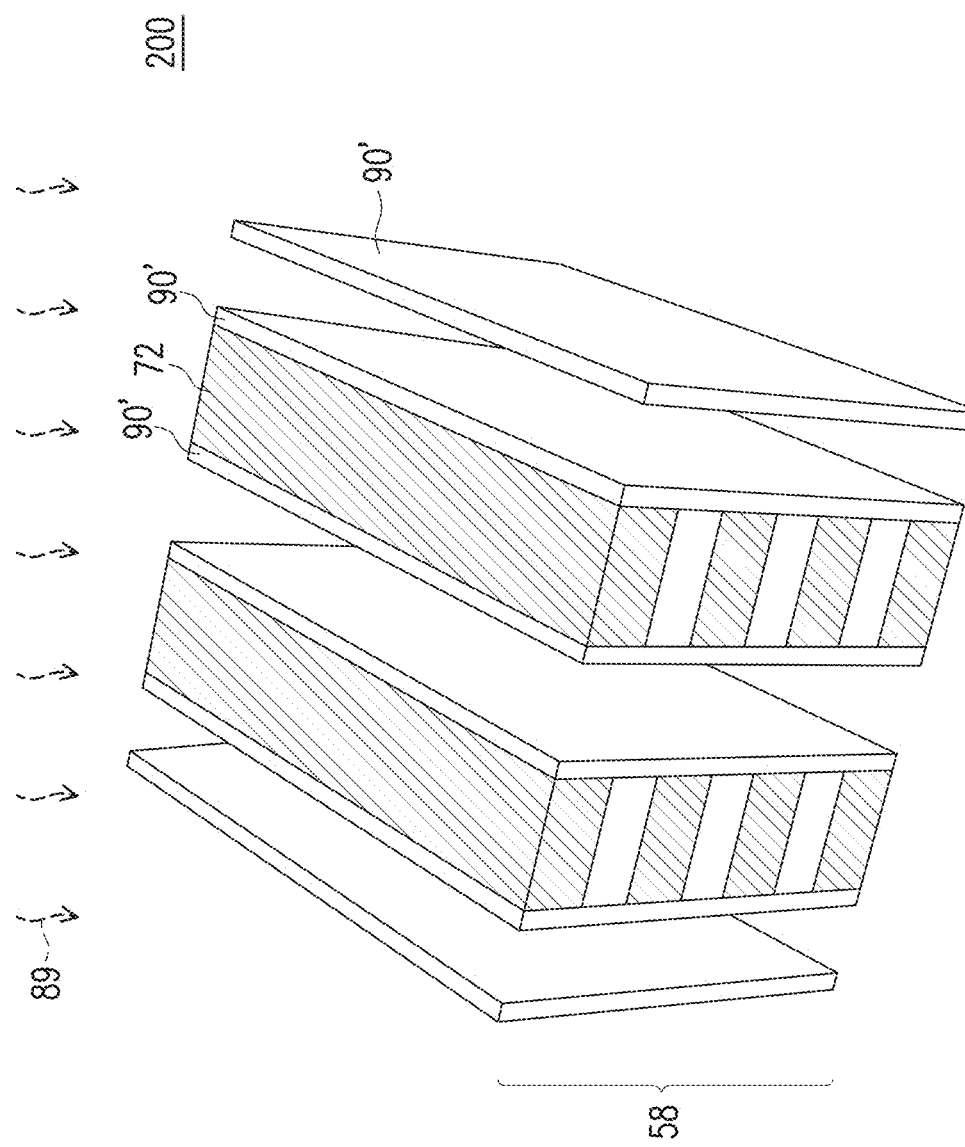
Figure 19B:
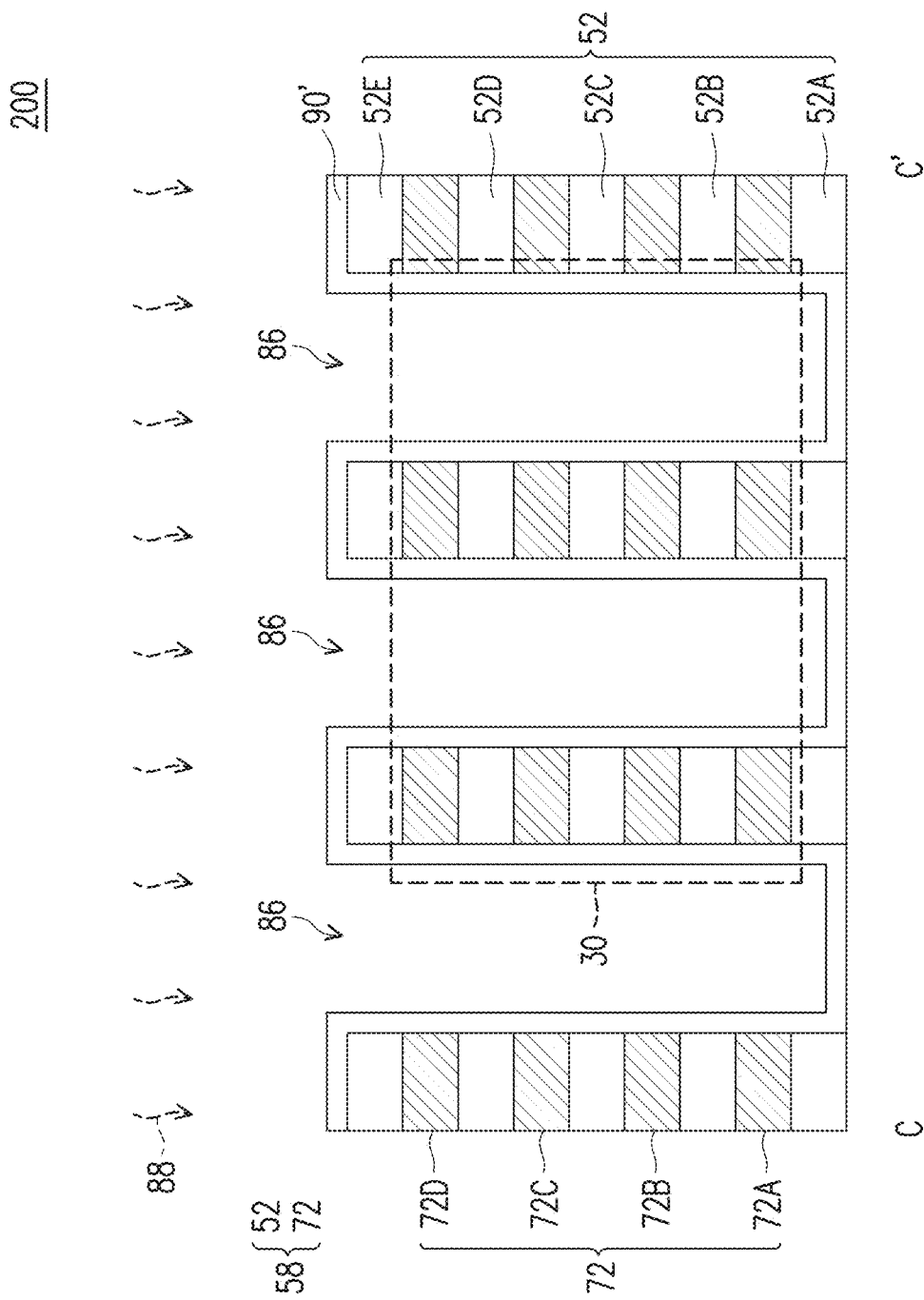

FIGS. 18C and 18D illustrate local enlarged views in a region R1 of FIG. 18B. FIG. 20C illustrates local enlarged views in a region R1 of FIG. 20B. FIG. 20D illustrates a graph of the species (e.g., the additional species) and oxygen concentrations versus depths of the channel layer 92, the ferroelectric layer 90' and the conductive line 72. FIG. 21 illustrates a method of forming the ferroelectric layer 90' and the channel layer 92 of the memory array 200 in accordance with some embodiments.

Figure 17A:
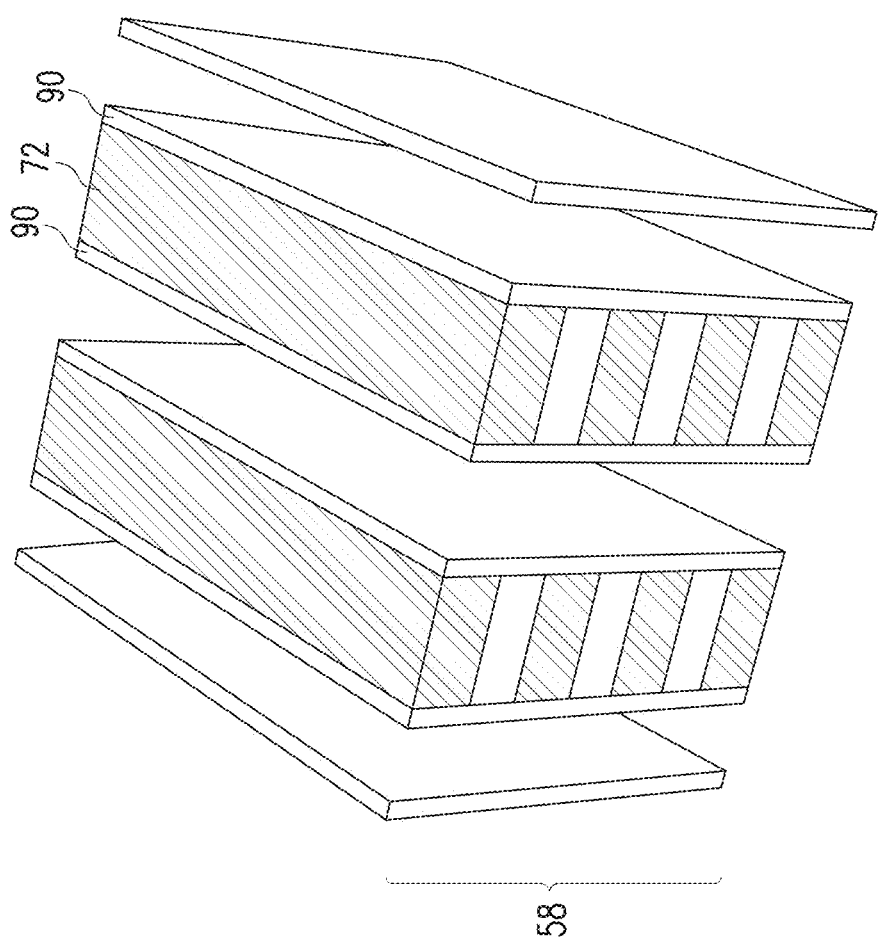
Figure 17B:
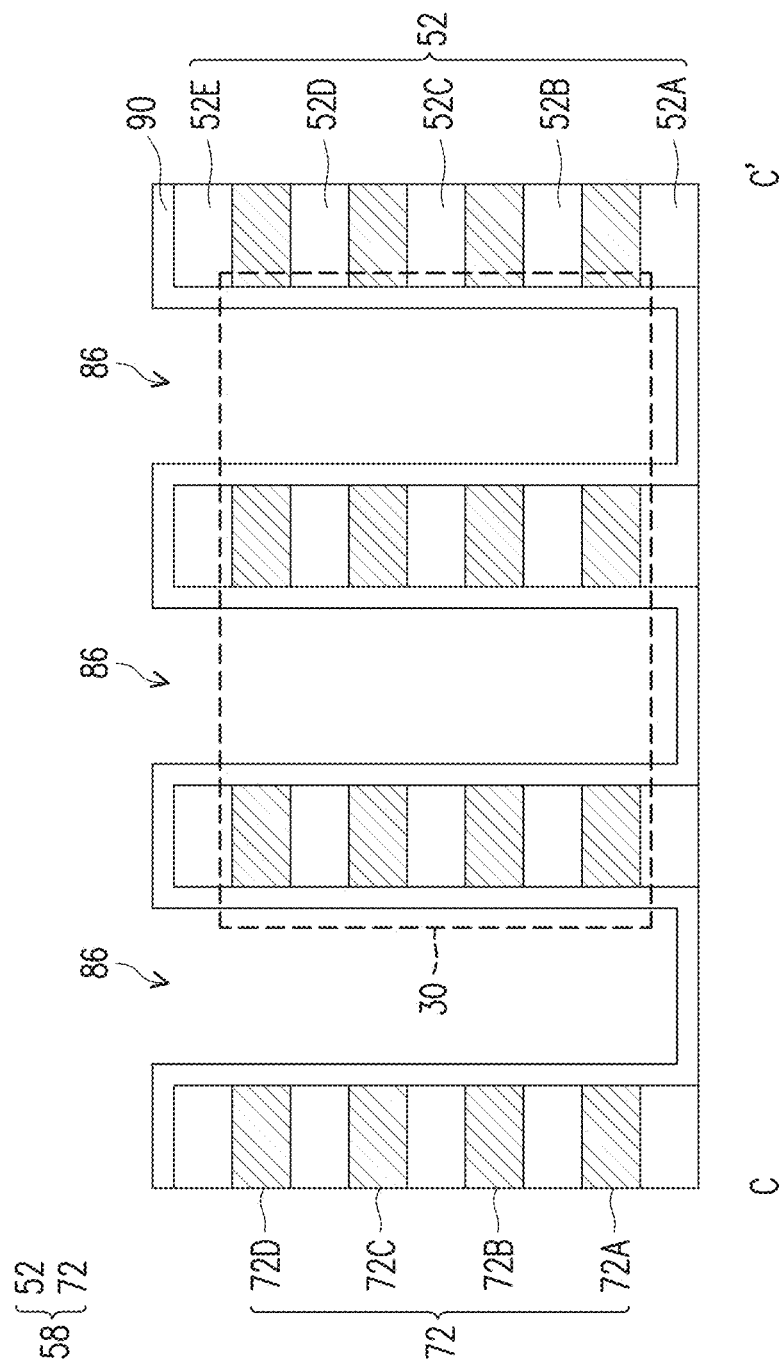

In FIGS. 17A, 17B, and at act S100 of FIG. 21, a ferroelectric layer 90 may be deposited conformally in the trenches 86 along sidewalls of the conductive lines 72 and top surfaces of the dielectric layer 52E, and along the bottom surfaces of the trenches 86. In some embodiments, a ferroelectric layer 90 may be further deposited on the IMD 70 and along the sidewall of each step of the staircase structure in the staircase region. The ferroelectric layer 90 may include a material that is capable of switching between two different polarization directions by applying an appropriate voltage differential across the ferroelectric layer 90. For example, the ferroelectric layer 90 includes a high-k dielectric material, such as a hafnium (Hf) based dielectric materials or the like. In some embodiments, the ferroelectric layer 90 includes hafnium oxide, hafnium zirconium oxide, silicon-doped hafnium oxide, or the like.

In some embodiments, the ferroelectric layer 90 may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hfi_{1-x}Er_xO$), hafnium lanthanum oxide ($Hfi_{1-x}La_xO$), hafnium yttrium oxide ($Hfi_{1-x}Y_xO$), hafnium gadolinium oxide ($Hfi_{1-x}Gd_xO$), hafnium aluminum oxide ($Hfi_{1-x}Al_xO$), hafnium zirconium oxide ($Hfi_{1-x}Zr_xO$, HZO), hafnium titanium oxide ($Hfi_{1-x}Ti_xO$), hafnium tantalum oxide ($Hfi_{1-x}Ta_xO$), or a combination thereof, or the like. In some embodiments, the ferroelectric layer 90 may include different ferroelectric materials or different types of memory materials. In some embodiments, the method of forming the ferroelectric layer 90 includes performing a suitable deposition technique, such as CVD, PECVD, metal oxide chemical vapor deposition (MOCVD), ALD, RPALD, PEALD, MBD or the like.

In some embodiments, the ferroelectric layer 90 has a thickness of about 1-20 nm, such as 5-10 nm. Other thickness ranges (e.g., more than 20 nm or 5-15 nm) may be applicable. In some embodiments, the ferroelectric layer 90 is formed in a fully amorphous state. In alternative embodiments, the ferroelectric layer 90 is formed in a partially crystalline state; that is, the ferroelectric layer 90 is formed in a mixed crystalline-amorphous state and having some degree of structural order. In yet alternative embodiments, the ferroelectric layer 90 is formed in a fully crystalline state. In some embodiments, the ferroelectric layer 90 is a single layer. In alternative embodiments, the ferroelectric layer 90 is a multi-layer structure.

At act S102 of FIG. 21, a first annealing process is performed to the ferroelectric layer 90. The temperature range of the annealing process ranges from about 250° C. to about 550° C. in $N_2$, $O_2$, or $N_2/O_2$ ambient, so as to achieve a desired crystalline lattice structure for the ferroelectric layer 90. In some embodiments, upon the annealing process, the ferroelectric layer 90 is transformed from an amorphous state to a partially or fully crystalline state. In alternative embodiments, upon the annealing the ferroelectric layer 90 is transformed from a partially crystalline state to a fully crystalline state.

In FIGS. 20A to 20D, and at act S104 of FIG. 21, a treatment 88 is performed on the ferroelectric layer 90 to form a ferroelectric layer 90'. In some embodiments, the treatment 88 is performed on the ferroelectric layer 90 to transform at least a portion of the ferroelectric layer 90 to a treated ferroelectric portion 90A. The treated ferroelectric portion 90A is used to enhance the endurance performance of the device. In some embodiment, the treated ferroelectric portion 90A is a part of the ferroelectric layer 90' as shown in FIG. 18C. In another embodiment, the treated ferroelectric portion 90A is the entire ferroelectric layer 90' as shown in FIG. 18D.

In some embodiments, the treatment 88 introduces a species (e.g., an additional species) in the ferroelectric layer 90 by an energy source. The energy source of the treatment 88 may be provided by an ion implantation process, a plasma process, or other suitable processes including thermal diffusion, e-beam, ultraviolet (UV), or combinations thereof. The treatment 88 may be a nitridation treatment process, or a halogen treatment process. In some embodiments, the treatment 88 introduces a species (e.g., an additional species) with valence of 5, e.g., nitrogen (N), valence of 7 e.g., fluorine (F), or a combination thereof so as to eliminate or block traps or defects in an interface IF2 between the ferroelectric layer 90' and a channel layer 92 to be formed later, and/or to occupy oxygen vacancies in the ferroelectric layer 90' and/or the channel layer 92 to be formed later and serve as a passivation to suppress interdiffusion of oxygen, hydrogen and vacancies, so that the intrinsic fatigue performance and endurance of the ferroelectric layer 90' may be improved. The ferroelectric layer 90' may be referred to as a ferroelectric layer containing the species (such as nitrogen or halogen) in some embodiments. The ferroelectric layer 90' may also be referred to as a passivation species (such as nitrogen or halogen)-doped ferroelectric layer in alternative embodiments.

Hence, the treated ferroelectric portion 90A is a part of the ferroelectric layer 90' with the species with valence of 5, 7 or a combination thereof. In some embodiments, the ion implantation process or the plasma process is performed at a relatively low energy to prevent damage of the ferroelectric layer 90 and enhance neutralization efficiency. For example, the ion implantation process is performed at energy about 10 to 50 KeV with a dose about 1 atoms/$cm^2$ to about 1000 atoms/$cm^2$. For example, the plasma process is performed in a plasma chamber with a gas (e.g., $N_2$, $NH_3$, $CF_4$, or $CFH_3$) flow rate of about 1000 sccm to about 10000 sccm, a power of about 15 Watts to about 500 Watts, and a pressure of about 1 Torr to about 760 Torr for a period of seconds to about 1 to about 360 seconds and at a temperature of less than about 400° C.

As illustrated in FIG. 18C, a species concentration of the ferroelectric layer 90' may be in a range of about 1E17/$cm^3$ to about 1E20/$cm^3$. In some embodiments, the ferroelectric layer 90' has a varying concentration of the species (e.g., fluorine, nitrogen, or the like), and a concentration of the species may decrease in a direction toward the conductive line 72. For example, the ferroelectric layer 90' may have a tri-portion structure comprising a bottom ferroelectric portion 90B, a middle ferroelectric portion 90M and a top ferroelectric portion 90T. The bottom ferroelectric portion 90B is in contact with the conductive line 72, and the middle ferroelectric portion 90M is located between the bottom ferroelectric portion 90B and the top ferroelectric portion 90T. The middle ferroelectric portion 90M and the top ferroelectric portion 90T is collectively referred to as the treated ferroelectric portion 90A.

In some embodiments, the top ferroelectric portion 90T has the maximum species concentration of the ferroelectric layer 90'. The maximum species concentration of the ferroelectric layer 90' is positioned at a center of the top ferroelectric portion 90T. In one embodiment, the species concentration of the top ferroelectric portion 90T may be in a range of about 50% to about 100% of the maximum species concentration of the ferroelectric layer 90'; the species concentration of the middle ferroelectric portion 90M may be in a range of about 1% to about 40% of the maximum species concentration of the ferroelectric layer 90'; and the species concentration of the bottom ferroelectric portion 90B may be less than 1% of the maximum species concentration of the ferroelectric layer 90'. In some embodiments, the maximum species concentration of the ferroelectric layer 90' may be in a range of about $1E17/cm^3$ to about $1E20/cm^3$.

In some embodiments, the top ferroelectric portion 90T has a thickness T3; the middle ferroelectric portion 90M has a thickness T2; and the bottom ferroelectric portion 90B has a thickness T1. In some embodiments, the thicknesses T1, T2, and T3 may be in a range of between approximately 5 Angstroms and approximately 10 nm, between approximately 1 nm and approximately 50 nm, or other similar values. Further, a thickness ratio of the thickness T1 to a combined thickness (e.g., the thickness T3 plus the thickness T2) to ranges from about 1:2 to 1:10.

As illustrated in FIG. 18D, in alternative embodiments, the treated ferroelectric portion 90A occupies the entire ferroelectric layer 90'. The entire of the ferroelectric layer 90' comprises the species (e.g., fluorine, nitrogen, or the like). In some embodiments, the ferroelectric layer 90' has an evenly distributed concentration of the species. A species concentration of the ferroelectric layer 90' may be in a range of about $1E17/cm^3$ to about $1E20/cm^3$.

As illustrated in FIGS. 19C and 19D, and at act S106 of FIG. 21, a second annealing process 89 is performed on the ferroelectric layer 90'. In some embodiments, the second annealing process 89 includes a spike annealing process. The spike annealing process may be performed using the following process parameters or conditions: a peak annealing temperature that is maintained to be in a range between about 380° C. and about 420° C., an annealing time (or duration) (during which the peak temperature is maintained) that is in a range between about 1 second and about 60 seconds, and an annealing pressure that is in a range between about 50 torr and about 760 torr. These process parameters above of the annealing process are not arbitrarily chosen but rather are carefully tuned to active the species in the ferroelectric layer 90'.

Figure 20A:
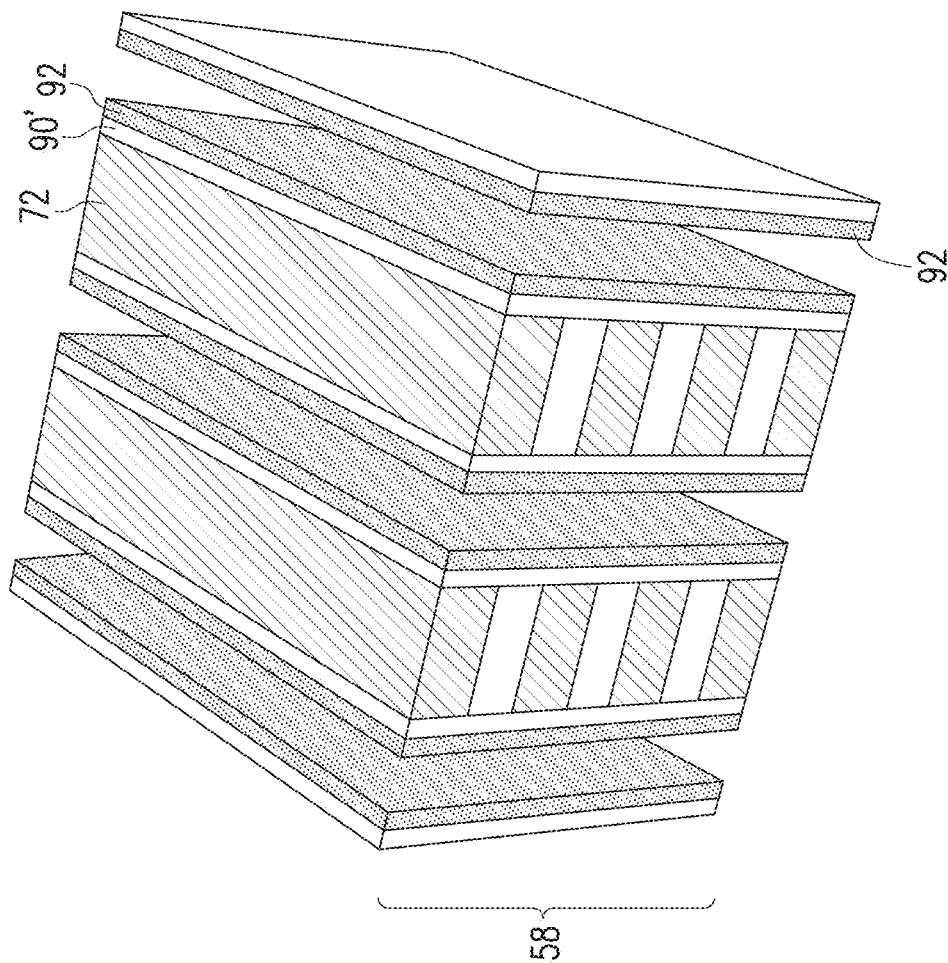
Figure 20B:
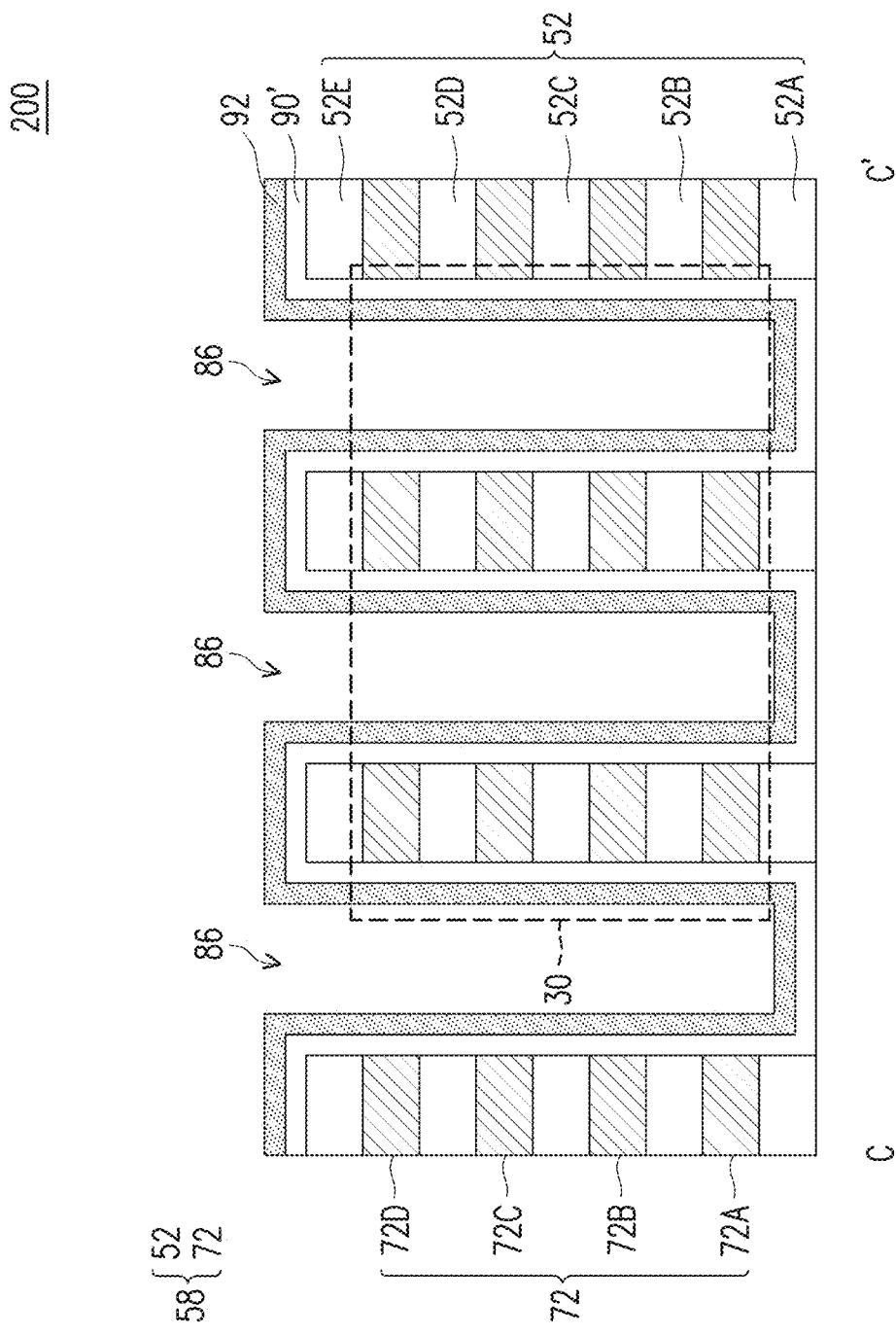
Figure 20D:
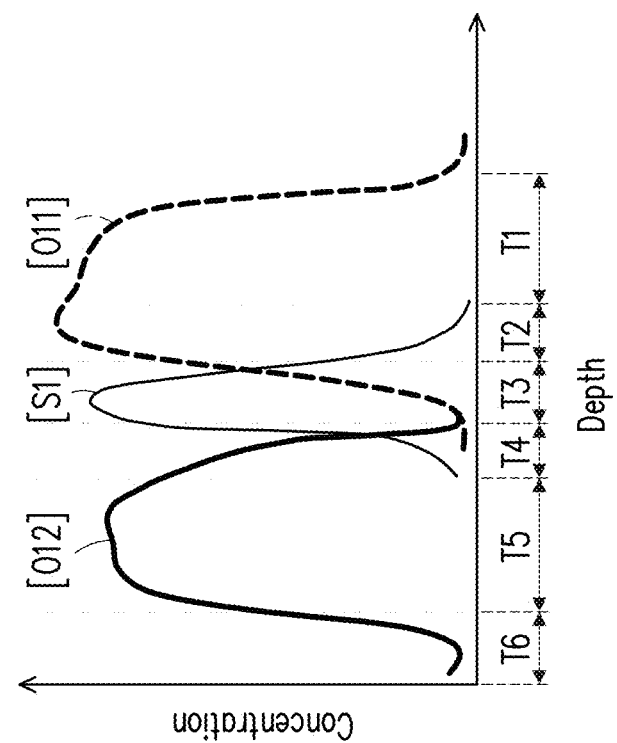
FIG. 20D illustrates a graph of the species and oxygen concentrations versus depths of the channel layer, the ferroelectric layer and the conductive line in accordance with some embodiments.
Figure 20C:
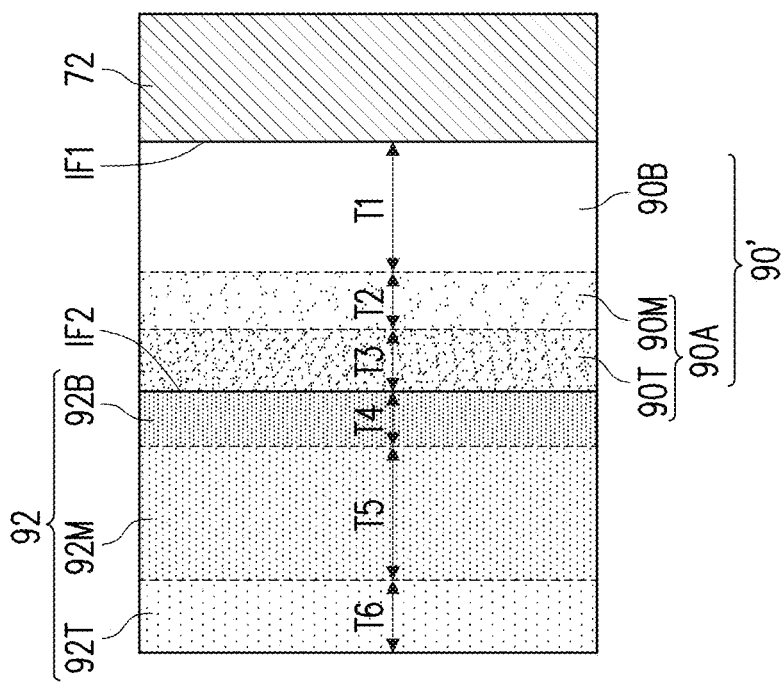
Figure 21:
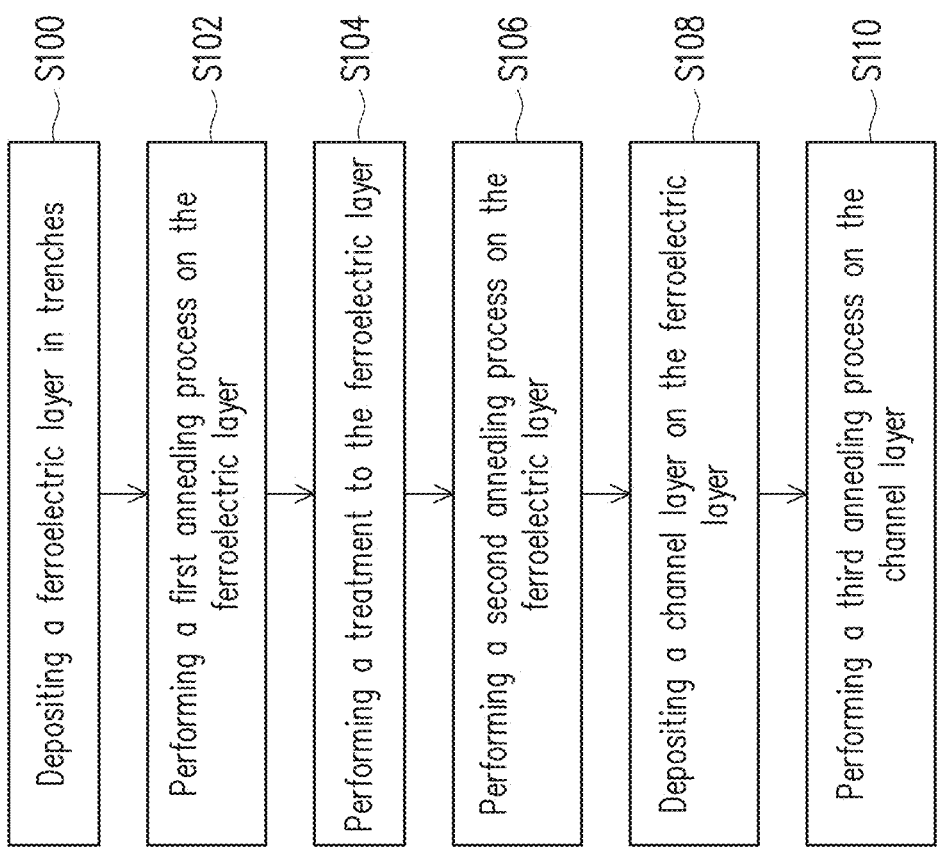
FIG. 21 illustrates a method of forming the ferroelectric layer and the channel layer of a ferroelectric memory device in accordance with some embodiments.

In FIGS. 20A, 20B, and at act S108 of FIG. 21, a channel layer 92 is conformally deposited in the trenches 86 over the ferroelectric layer 90'. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, channel layer 92 includes polycrystalline silicon (poly-Si), amorphous silicon (a-Si), or the like. The channel layer 92 may be deposited by CVD, PVD, ALD, PECVD, or the like. The channel layer 92 may extend along sidewalls and bottom surfaces of the trenches 86 over the ferroelectric layer 90. In some embodiments, the channel layer 92 may be further deposited on the IMD 70 and along the sidewall of each step of the staircase structure in the staircase region. At act S110 of FIG. 21, after the channel layer 92 is deposited, a third annealing step (e.g., at a temperature range of about 300° C. to about 450° C.) in oxygen-related ambient may be performed to activate the charge carriers of the channel layer 92.

In FIG. 20C, after the third annealing process is performed, some of the species diffuse to the channel layer 92. In some embodiments, some of the species diffuse to a bottom channel portion 92B of the channel layer 92 which is in contact with the top ferroelectric portion 90T, and a middle channel portion 92M and a top channel portion of the channel layer 92 has few or free of the species. The top channel portion 92T has a thickness T6; the middle channel portion 92M has a thickness T5; and the bottom channel portion 92B has a thickness T4. Other thickness ranges may be applicable. In some embodiments, a thickness ratio of a combined thickness T3 to a combined thickness (e.g., the thickness T3 plus the thickness T2 and the thickness T1) ranges from about 5% to about 50%, about 10% to about 60%, or other similar values. In some embodiments, a thickness ratio of a combined thickness T4 to a combined thickness (e.g., the thickness T6 plus the thickness T5 and the thickness T4) ranges from about 5% to 50%, about 10% to about 60%, or other similar values.

In FIG. 20D, a graph of the species and oxygen concentrations versus depths of the channel layer 92, the ferroelectric layer 90' and the conductive line 72 is shown. The y-axis indicates the species concentration and the oxygen concentration. The x-axis indicates the depth for the channel layer 92, the ferroelectric layer 90' and the conductive line 72. The curve [O12] indicates a distribution the oxygen concentration of the channel layer 92; the curve [O11] indicates the oxygen concentration of the ferroelectric layer 90'; and the curve [S1] indicates the species concentration.

In some embodiments, the curve [O12] shows the middle channel portion 92M of the channel layer 92 has the maximum oxygen concentration. An oxygen concentration increases from a part of the top channel portion 92T near to a dielectric materials 98A to be formed later to the center of the middle channel portion 92M. The oxygen concentration decreases from the center of the middle channel portion 92M to the interface IF2 between the bottom channel portion 92B and the top ferroelectric portion 90T. The top channel portion 92T and the bottom channel portion 92B of the channel layer 92 has an oxygen concentration lower than the oxygen concentration of the middle channel portion 92M of the channel layer 92.

The curve [O11] shows a part of the middle ferroelectric portion 90M near the bottom ferroelectric portion 90B has the maximum oxygen concentration. The maximum oxygen concentration of the ferroelectric layer 90' is higher than the maximum oxygen concentration of the channel layer 92. An oxygen concentration increases from an interface IF2 between the top ferroelectric portion 90T and the bottom channel portion 92B to the part of the middle ferroelectric portion 90M near the bottom ferroelectric portion 90B. The oxygen concentration decreases from to the part of the middle ferroelectric portion 90M near the bottom ferroelectric portion 90B to an interface IF1 between the bottom ferroelectric portion 90B and the conductive lines 72. The top ferroelectric portion 90T has an oxygen concentration lower than the oxygen concentrations of the middle ferroelectric portion 90M and the bottom ferroelectric portion 90B.

The curves [S1] shows the ferroelectric layer 90' has the maximum species concentration. The maximum species concentration of the ferroelectric layer 90' is between the maximum oxygen concentration of the channel layer 92 and the maximum oxygen concentration of the ferroelectric layer 90'. The top ferroelectric portion 90T has the maximum species concentration. The middle ferroelectric portion 90M also has a species concentration lower than the species concentration of the top ferroelectric portion 90T and greater than a species concentration of the bottom ferroelectric portion 90B.

The bottom channel portion 92B has a species concentration lower than the species concentration of the top ferroelectric portion 90T and greater than the middle channel portion 92M and the top channel portion 92T. In one embodiment, the species concentration of the bottom channel portion 92B may be in a range of about 1% to about 60% of the maximum species concentration of the ferroelectric layer 90'. The middle channel portion 92M and the top channel portion 92T may be have few or free of the species, and thus a species concentration of the middle channel portion 92M or the top channel portion 92T may be less than 1% or zero of the maximum species concentration of the ferroelectric layer 90'. A ratio of a distribution range of the species to a distribution range of oxygen in the ferroelectric layer 90' is greater than a ratio of a distribution range of the species to a distribution range of oxygen in the channel layer 92 (e.g., the oxide semiconductor layer).

The top ferroelectric portion 90T has the species concentration higher than the oxygen concentration thereof. The interface IF2 between the bottom channel portion 92B and the top ferroelectric portion 190T also has the species concentration higher than the oxygen concentration thereof. The interface IF2 between the bottom channel portion 92B and the top ferroelectric portion 190T has the species concentration higher than a species concentration of the interface IF1 between the bottom ferroelectric portion 90B and the conductive lines 72.

FIGS. 22 through 25B illustrate forming dielectric material 98 and patterning channel layer 92 for the memory cells 202 (see FIG. 1A) in the trenches 86. FIG. 25A is illustrated in a partial three-dimensional view, which is a perspective view of the part enclosed by the dashed line 30 in FIG. 25B. In FIGS. 22, 23, 24 and 25B cross-sectional views are provided along line C-C' of FIG. 1A.

Figure 22:
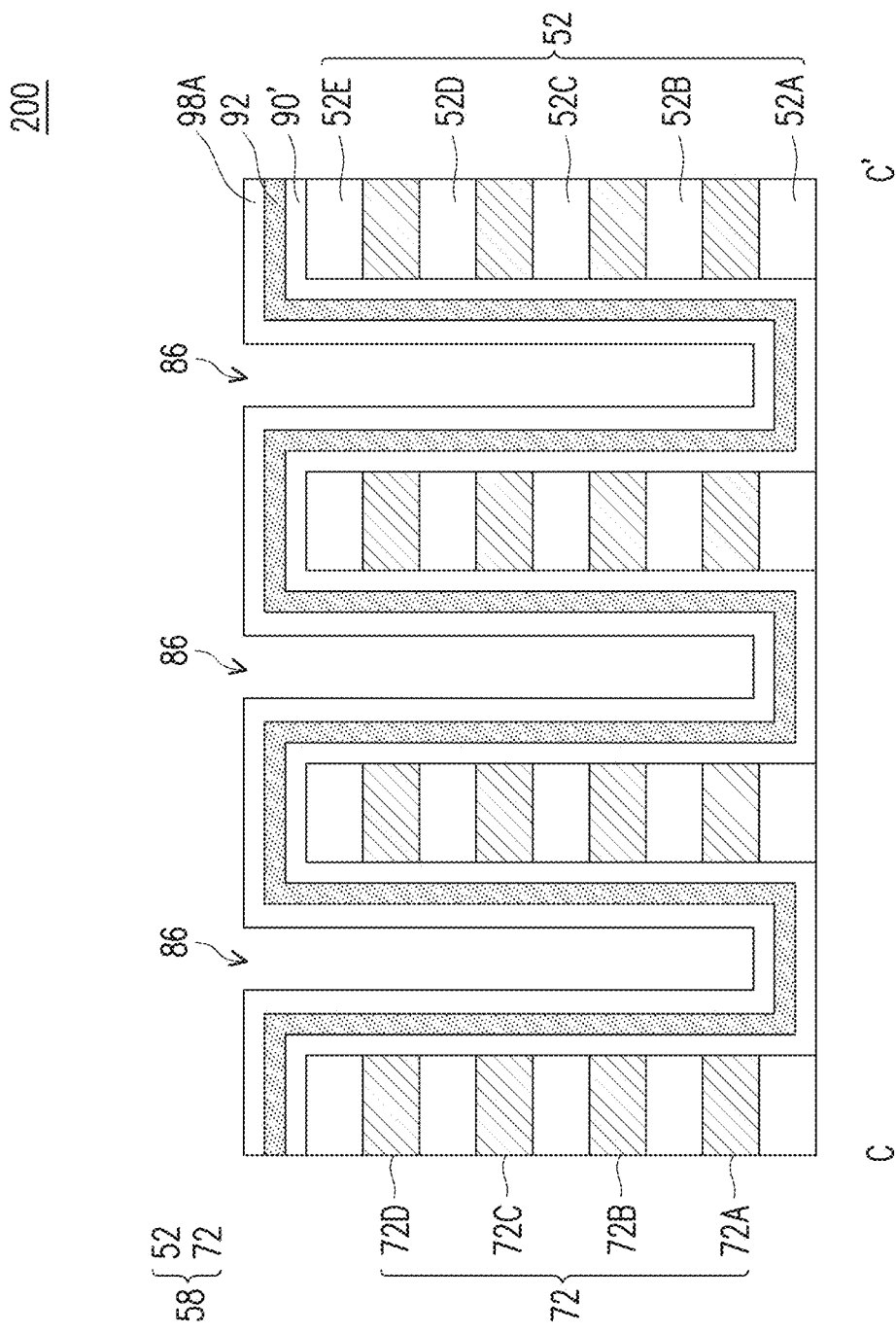

In FIG. 22, a dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted.

Figure 23:
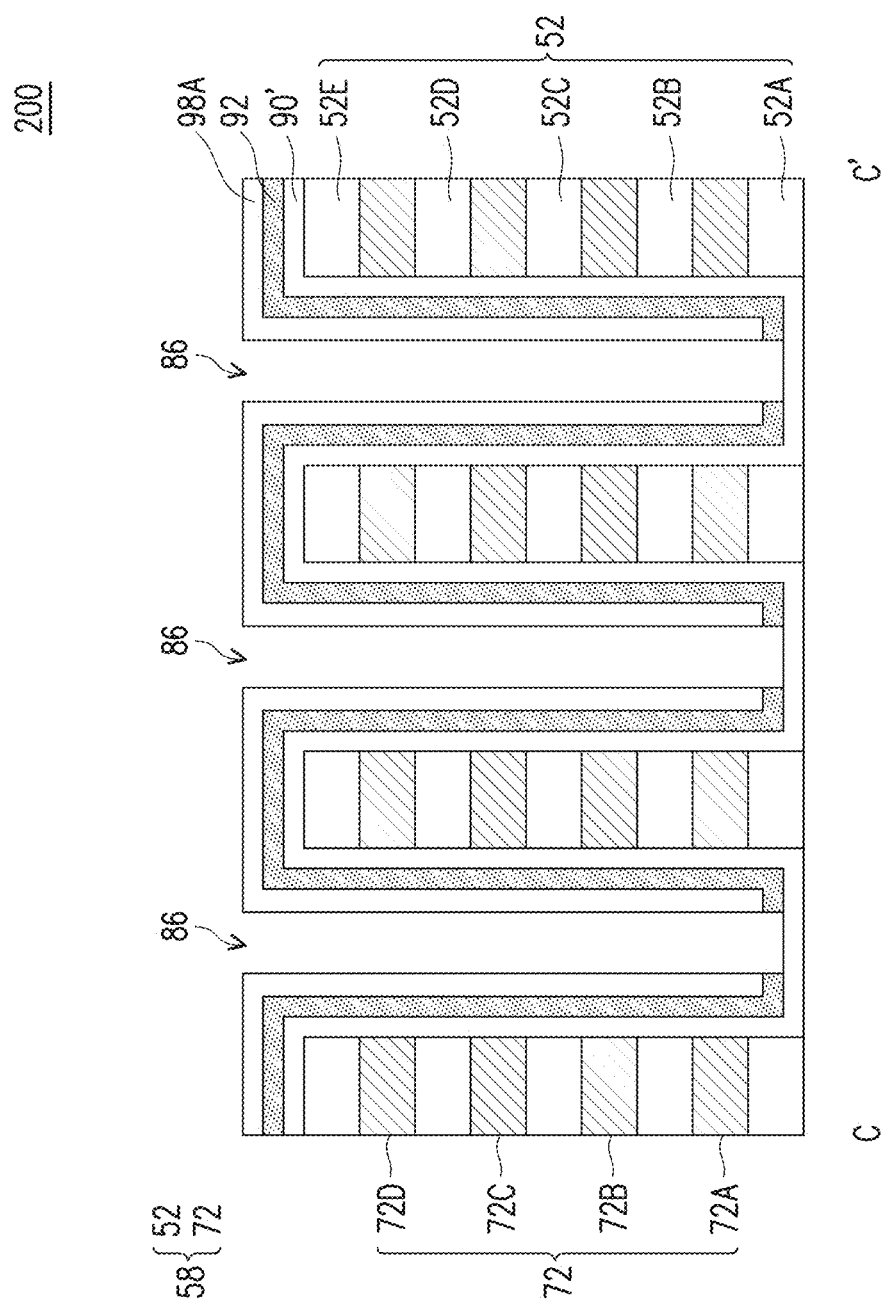

In FIG. 23, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. In some embodiments, the top portions of the dielectric material 98A and the channel layer 92 are removed from the multi-layer stack 58. In some embodiments, removal process includes a combination of photolithography and etching.

Accordingly, the remaining dielectric material 98A and the channel layer 92 may expose portions of the ferroelectric layer 90' on bottom surfaces of the trenches 86. Thus, portions of the channel layer 92 on opposing sidewalls of the trenches 86 may be separated from each other, which improves isolation between the memory cells 202 of the memory array 200 (see FIG. 1A).

Figure 24:
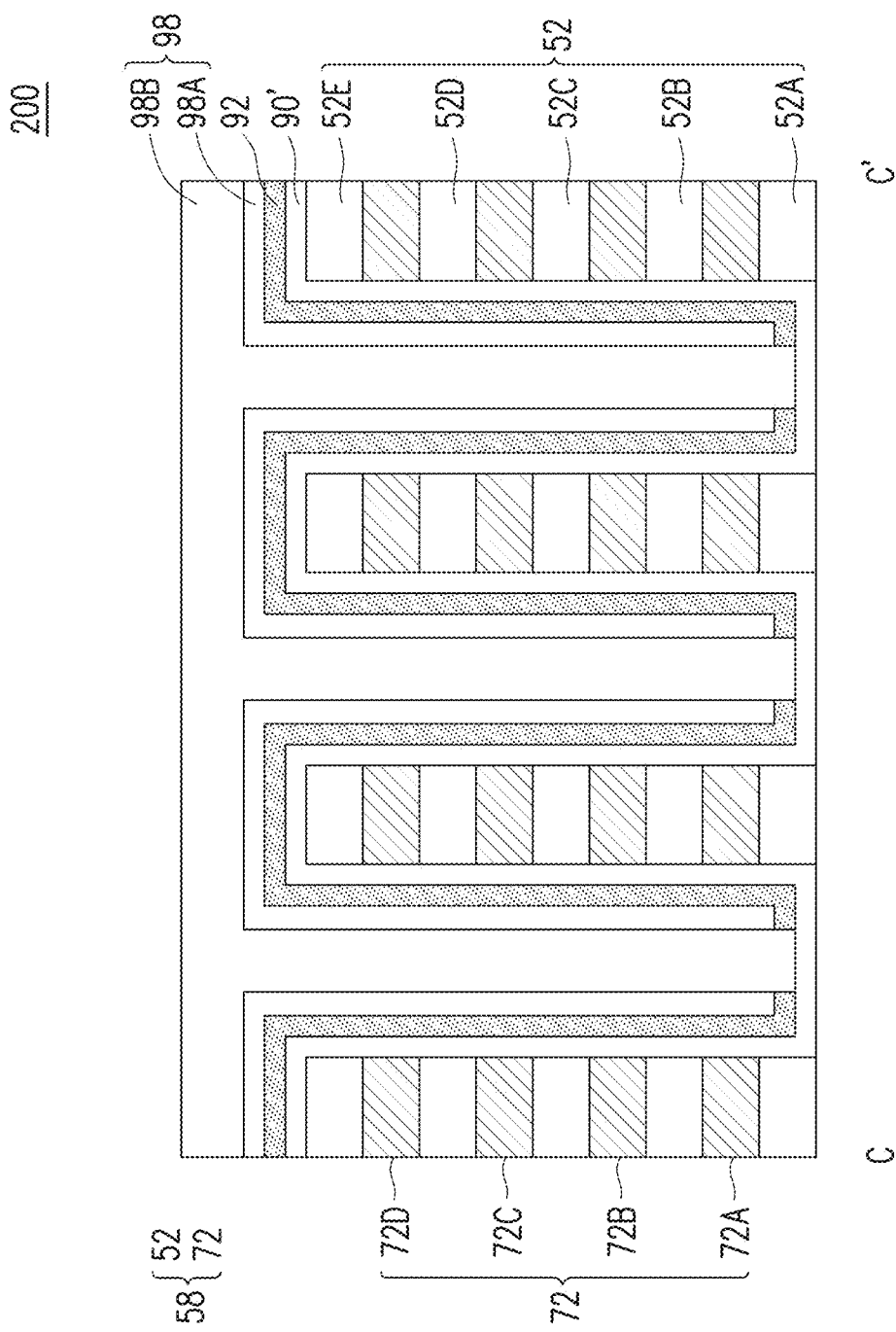

In FIG. 24, a dielectric material 98B is deposited to completely fill the trenches 86. The dielectric material 98B may be formed of one or more materials and by processes the same as or similar to those of the dielectric material 98A. In some embodiments, the dielectric material 98B and the dielectric material 98A include different materials.

Figure 25A:
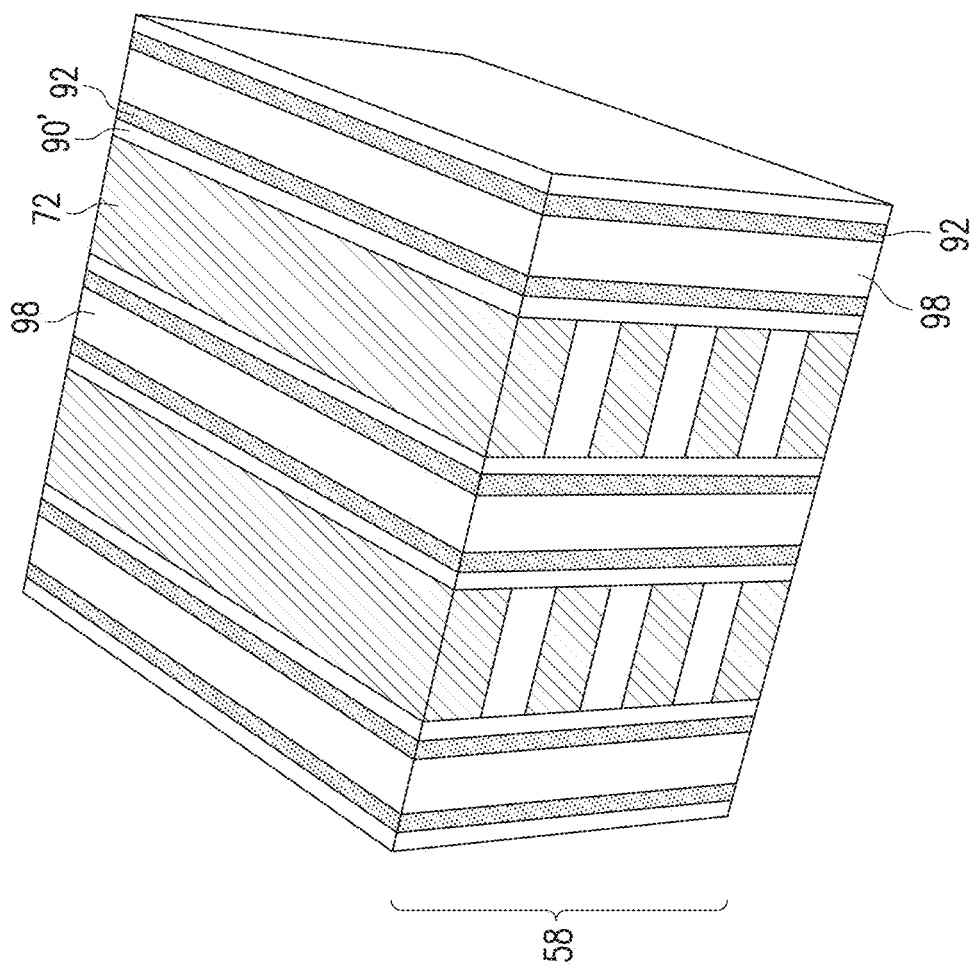
Figure 25B:
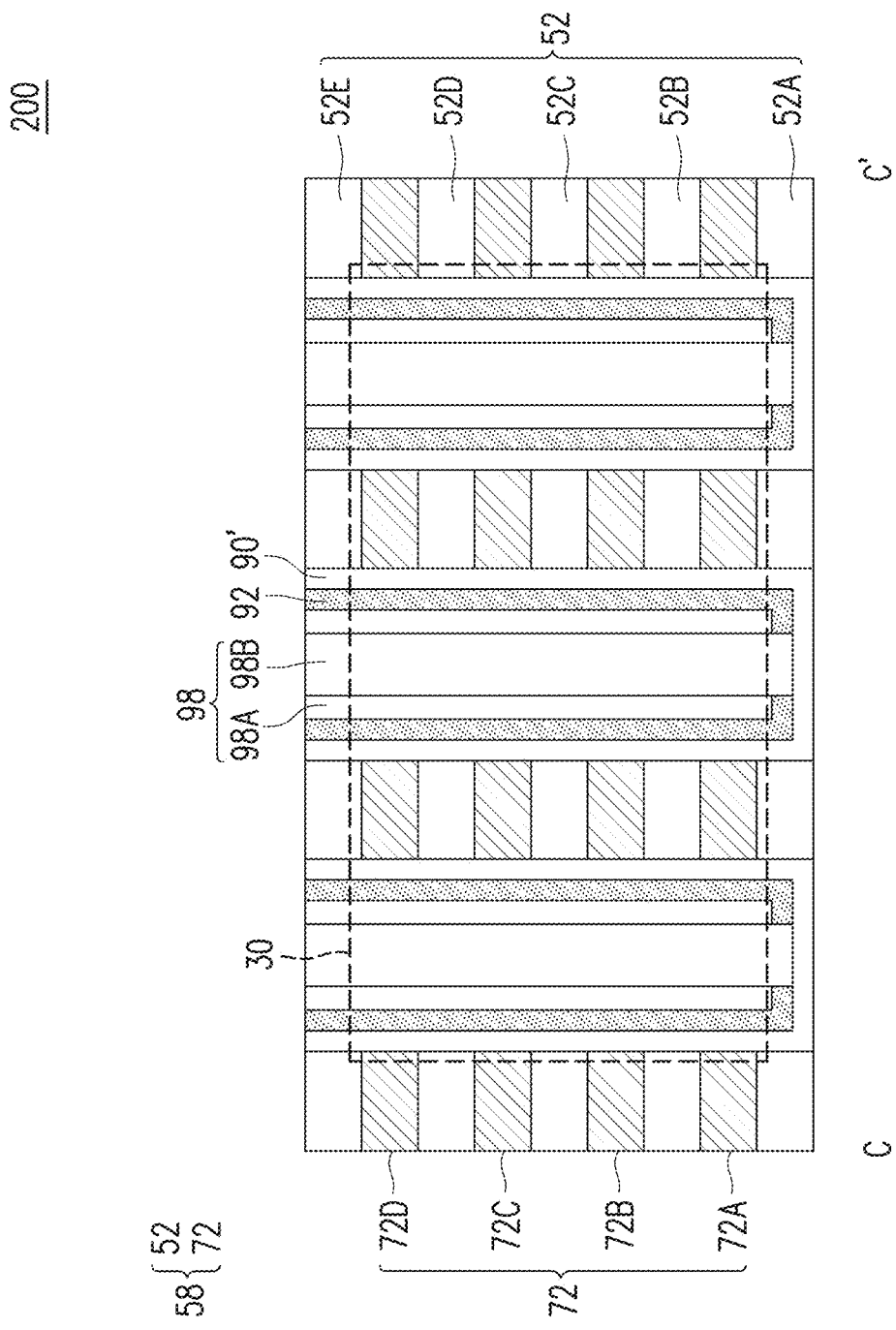

In FIGS. 25A and 25B, a removal process is applied to the dielectric materials 98A/98B, the channel layer 92, and the ferroelectric layer 90' to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52E), the ferroelectric layer 90', the channel layer 92, the dielectric materials 98A/98B (collectively referred to as a dielectric material 98), and the IMD 70 are level after the planarization process is complete.

Figure 27A:
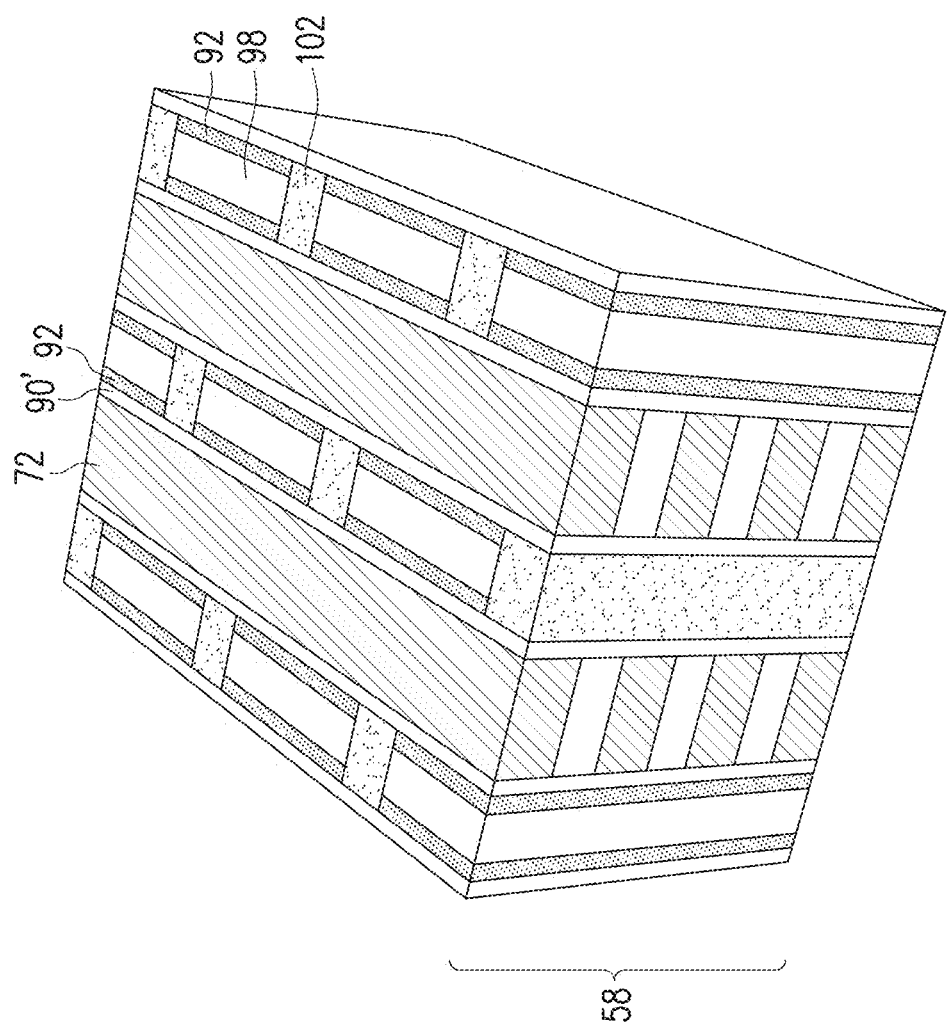
Figure 27B:
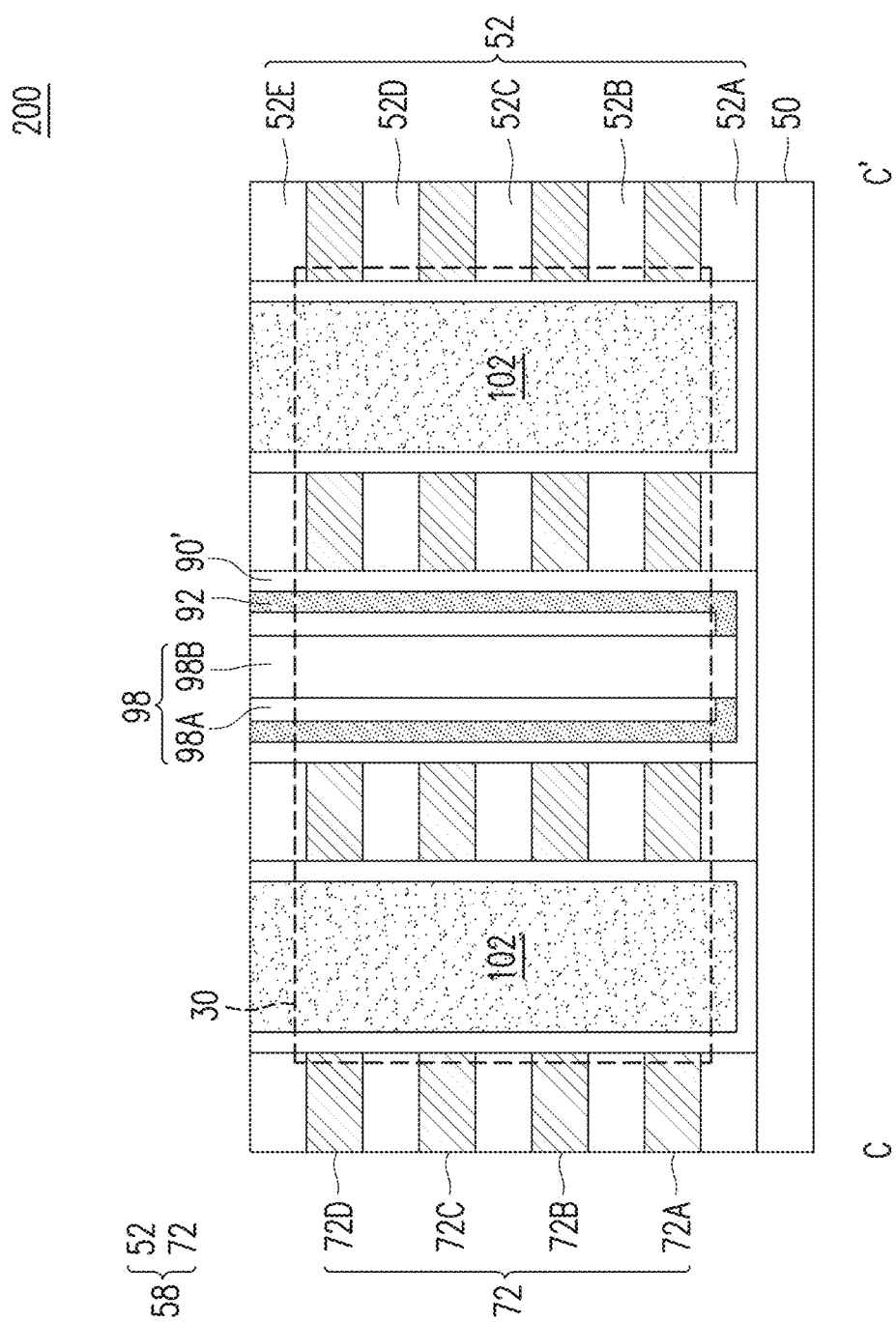
Figure 28A:
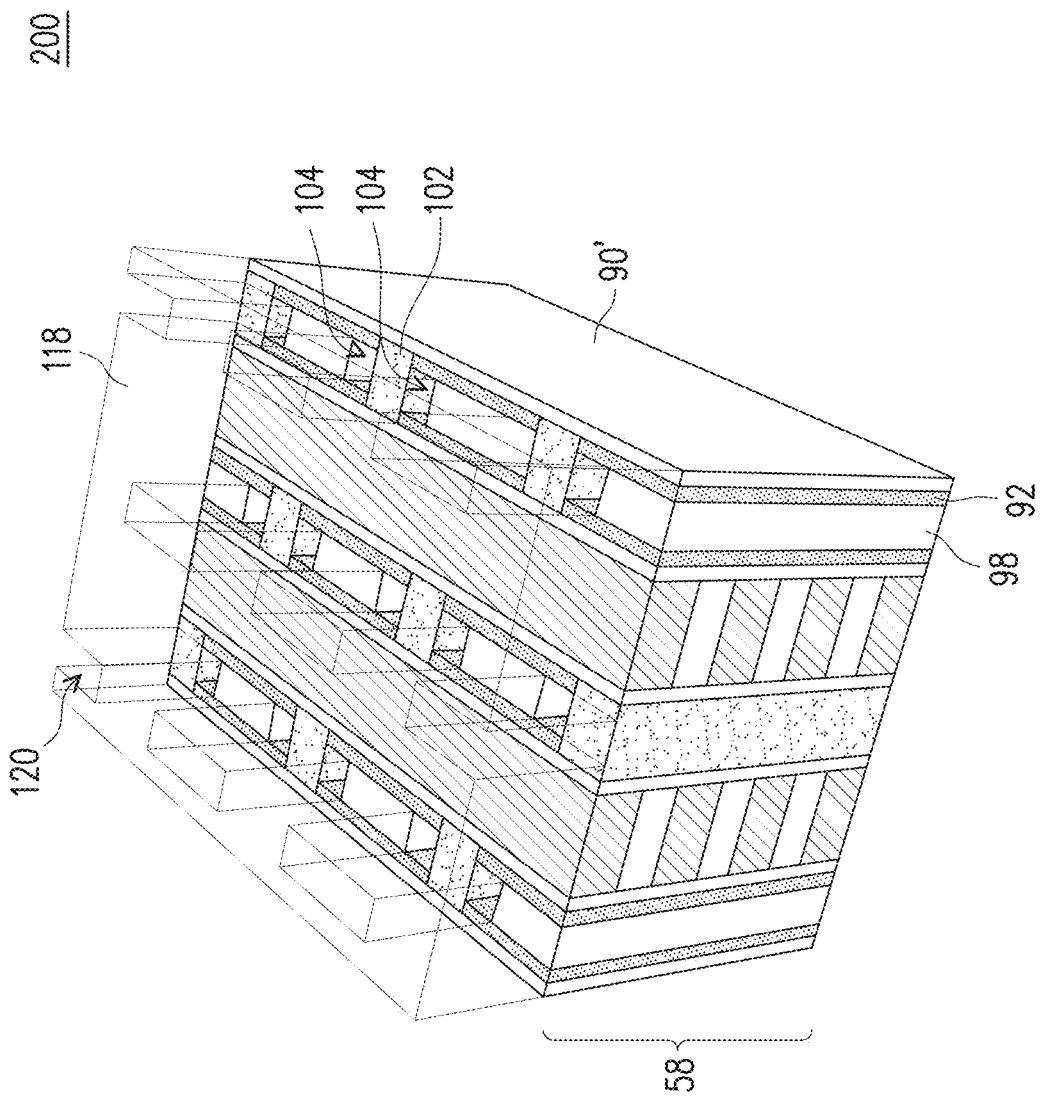
Figure 28B:
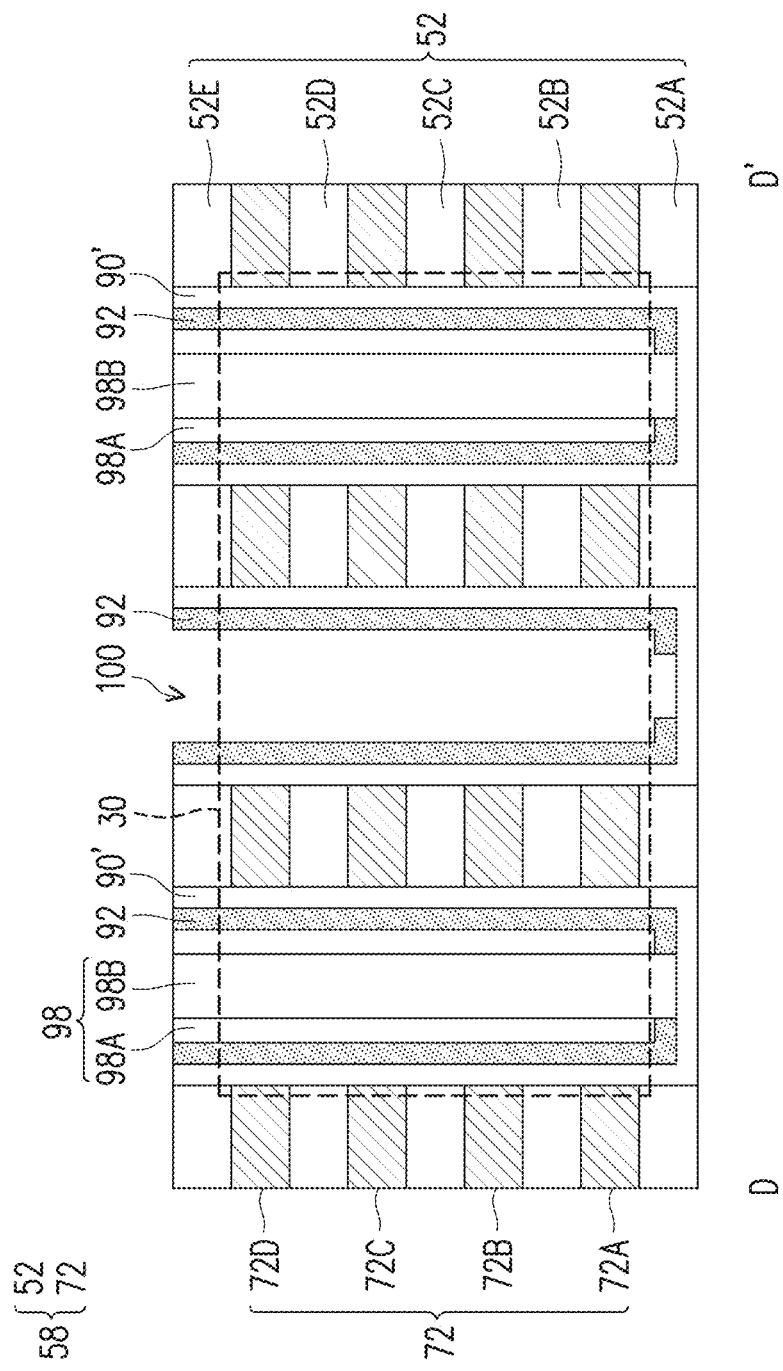
Figure 29A:
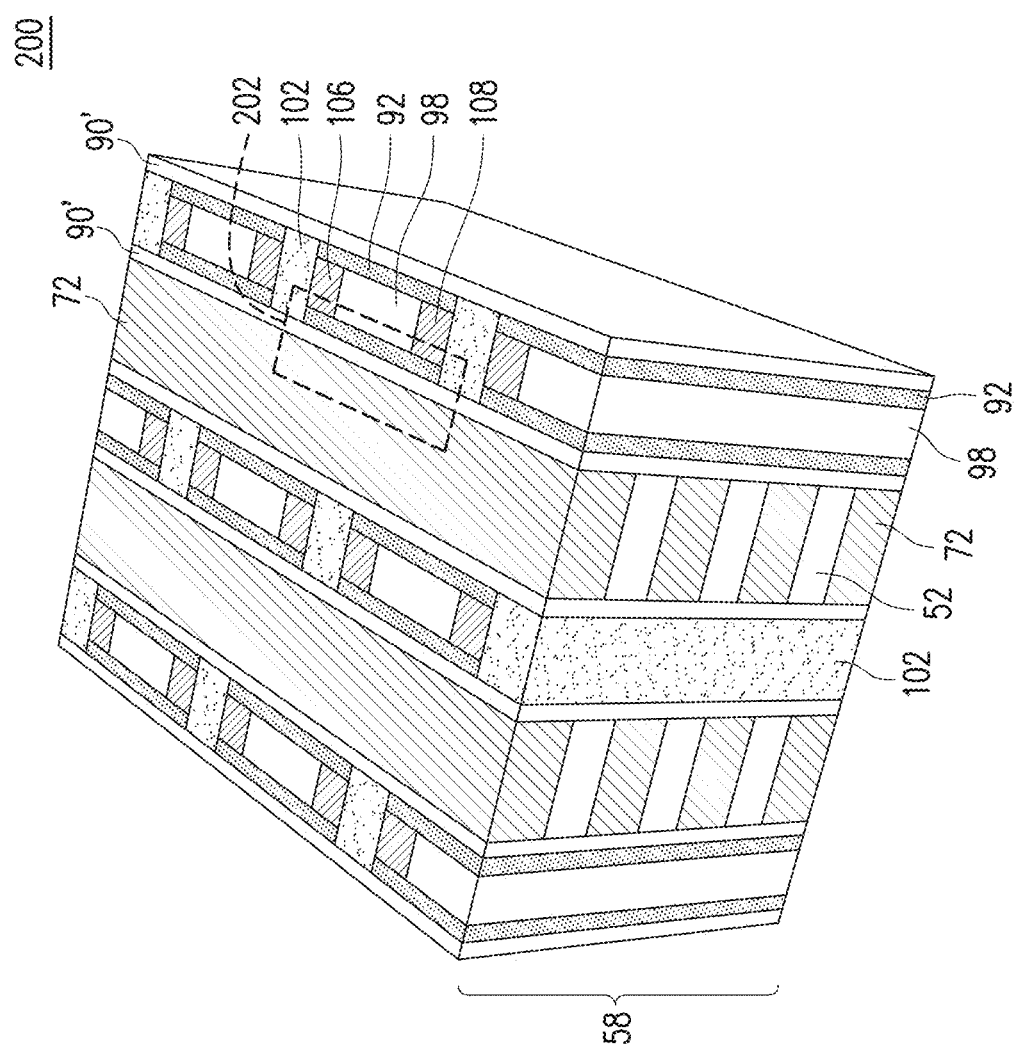
Figure 29B:
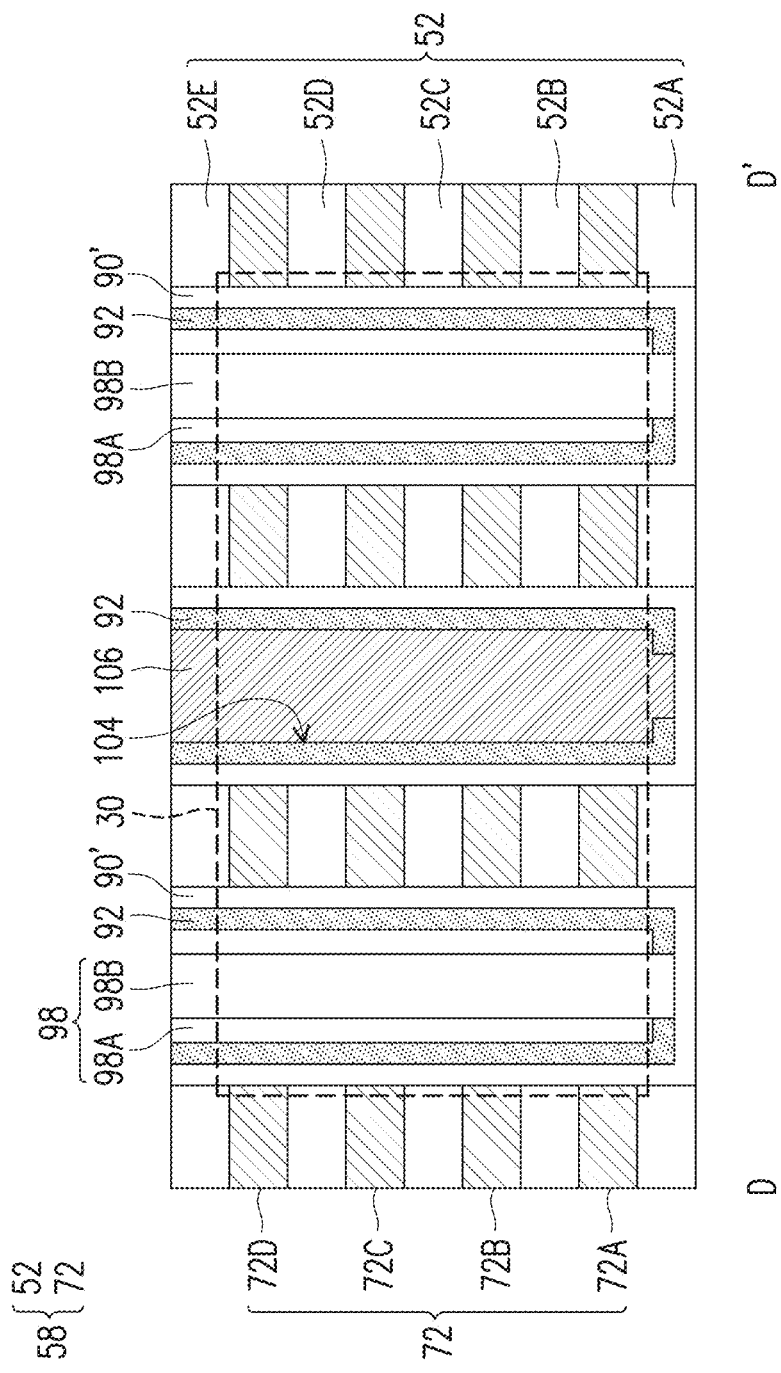

FIGS. 26A through 29B illustrate intermediate steps of manufacturing conductive pillars 106 and 108 (e.g., source/drain pillars) in the memory array 200. The conductive pillars 106 and 108 may extend along a direction perpendicular to the conductive lines 72 such that individual cells of the memory array 200 may be selected for read and write operations. FIGS. 26A, 27A, 28A and 29A are illustrated in a partial three-dimensional view, which are perspective views of the part enclosed by the dashed line 30 in FIGS. 26B, 27B, 28B and 29B respectively. In FIGS. 26B and 27B, cross-sectional views are provided along line C-C' of FIG. 1A. In FIGS. 28B and 29B, cross-sectional views are provided along line D-D' of FIG. 1A.

Figure 26B:
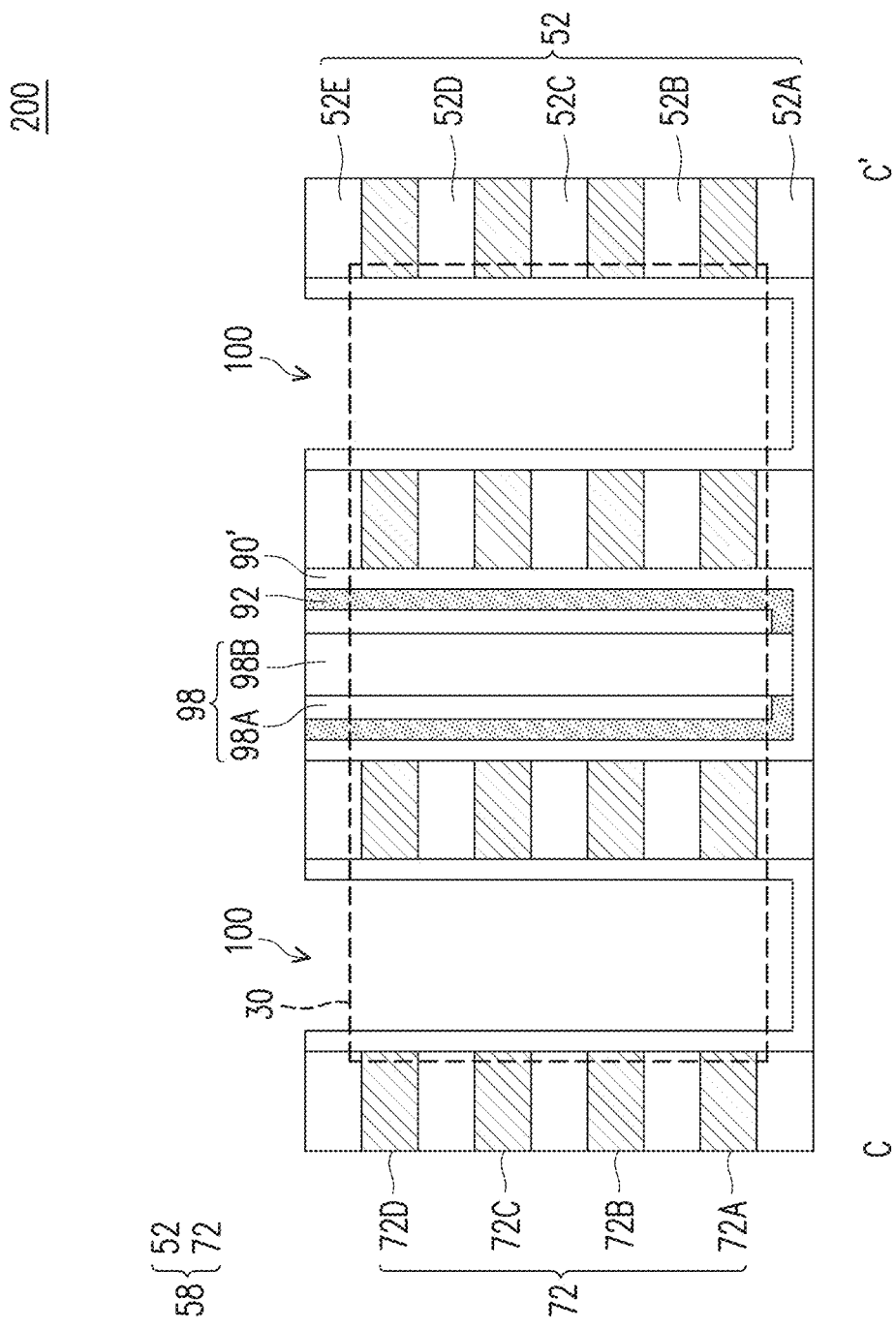

In FIGS. 26A and 26B, in some embodiments, trenches 100 are patterned through the channel layer 92 and the dielectric material 98. In alternative embodiments, the trenches 100 are patterned through the channel layer 92, the dielectric material 98, and the ferroelectric layer 90' (not shown). Patterning the trenches 100 may be performed through a combination of photolithography and etching, for example. The trenches 100 may be disposed between opposing sidewalls of the ferroelectric layer 90', and the trenches 100 may physically separate adjacent stacks of memory cells in the memory array 200 (see FIG. 1A).

In FIGS. 27A and 27B, isolation pillars 102 are formed in the trenches 100. In some embodiments, an isolation layer is deposited over the multi-layer stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer. In the resulting structure, top surfaces of the multi-layer stack 58 (e.g., dielectric layer 52E), the ferroelectric layer 90', the channel layer 92, and the isolation pillars 102 may be substantially level (e.g., within process variations). In some embodiments, materials of the dielectric material 98 and isolation pillars 102 may be selected so that they may be etched selectively relative each other. For example, in some embodiments, the dielectric material 98 include oxide and the isolation pillars 102 include nitride. In some embodiments, the dielectric material 98 include nitride and the isolation pillars 102 include oxide. Other materials are also possible.

In FIGS. 28A and 28B, trenches 104 are defined for the subsequently formed conductive pillars 106 and 108. The trenches 104 are formed by patterning the dielectric material 98 with a combination of photolithography and etching, for example. In some embodiments, as shown in FIG. 28A, a photoresist 118 is formed over the multi-layer stack 58, the dielectric material 98, the isolation pillars 102, the channel layer 92, and the ferroelectric layer 90'. In some embodiments, the photoresist 118 is patterned by an acceptable photolithography technique to define openings 120. Each of the openings 120 may expose the corresponding isolation pillar 102 and two separate regions of the dielectric material 98 beside the isolation pillar 102. In this way, each of the openings 120 may define a pattern of a conductive pillar 106 and an adjacent conductive pillar 108 that are separated by the isolation pillars 102.

Subsequently, portions of the dielectric material 98 exposed by the openings 120 may be removed by an acceptable etching process, such as by a dry etch (e.g., RIE, NBE, the like), a wet etch, the like, or a combination thereof. The etching may be anisotropic. The etching process may use an etchant that etches the dielectric material 98 without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIGS. 29A and 29B). After the trenches 104 are patterned, the photoresist 118 may be removed by ashing, for example.

In FIGS. 29A and 29B, the trenches 104 are filled with a conductive material to form the conductive pillars 106 and 108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the ferroelectric layer 90", the channel layer 92, the conductive pillars 106, and the conductive pillars 108 may be substantially level (e.g., within process variations). In some embodiments, the conductive pillars 106 correspond to and are electrically connected to the bit lines in the memory array, and the conductive pillars 108 correspond to and are electrically connected to the source lines in the memory array 200.

Thus, stacked memory cells 202 may be formed in the memory array 200, as shown in FIG. 29A. Each memory cell 202 includes a gate electrode (e.g., a portion of a corresponding conductive line 72), a gate dielectric (e.g., a portion of a corresponding ferroelectric layer 90'), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

Figure 30A:
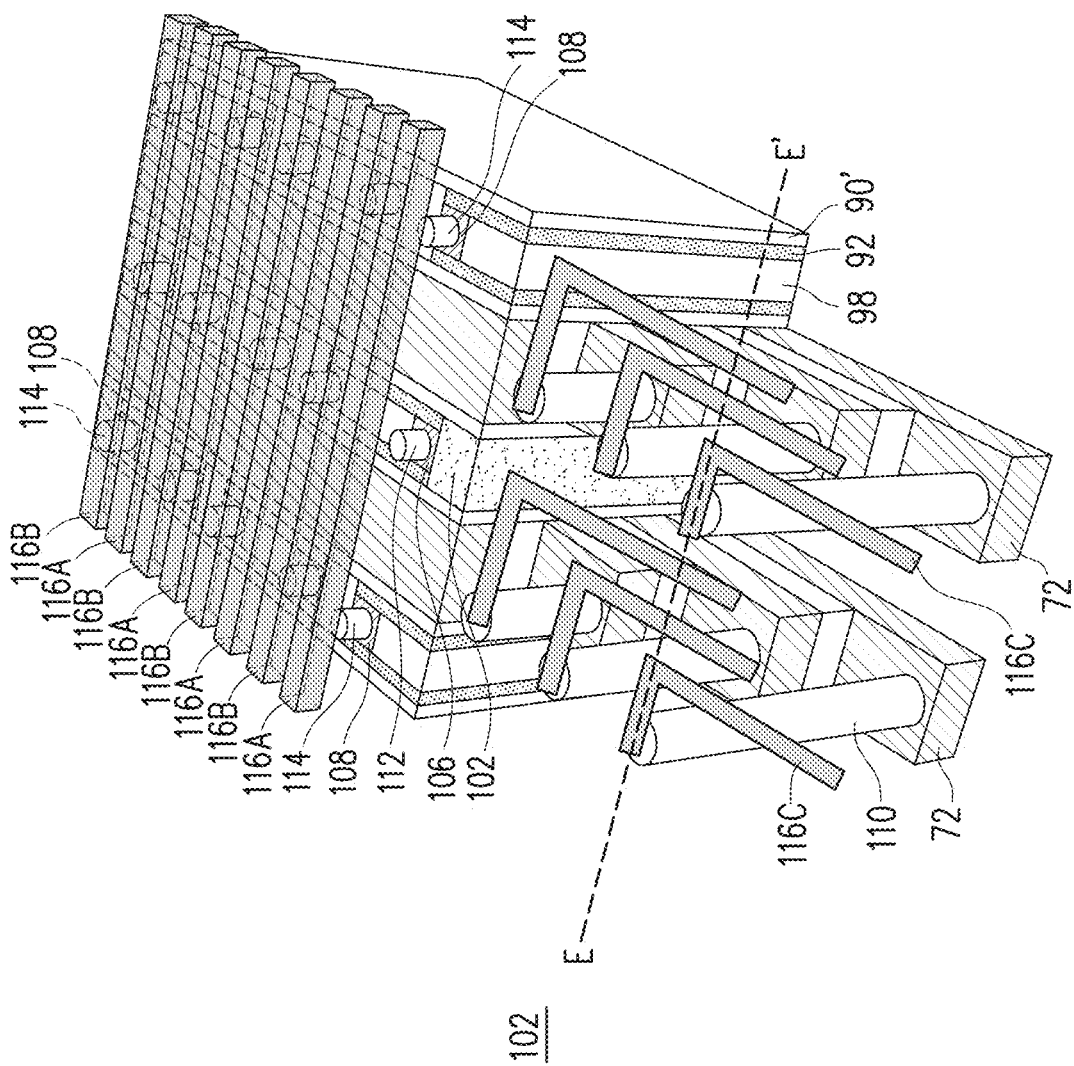
Figure 30B:
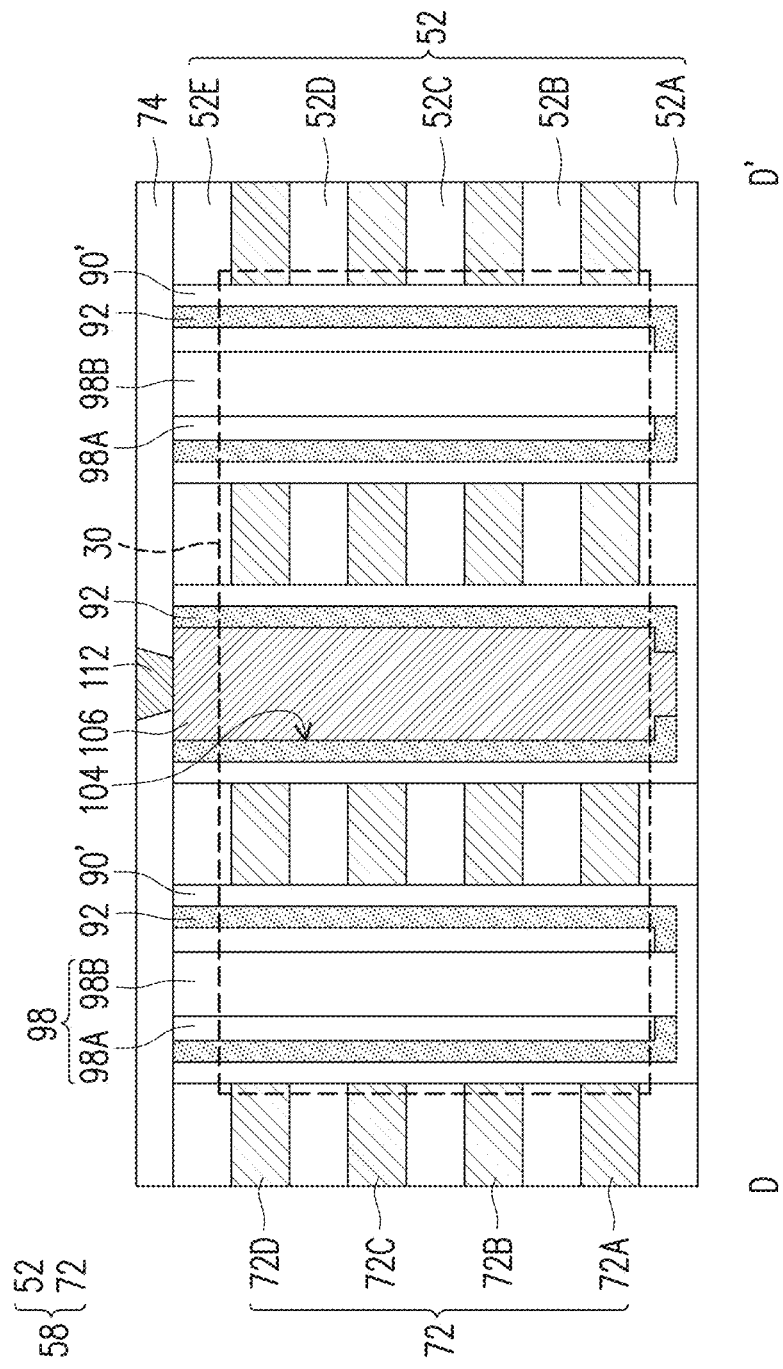
Figure 30C:
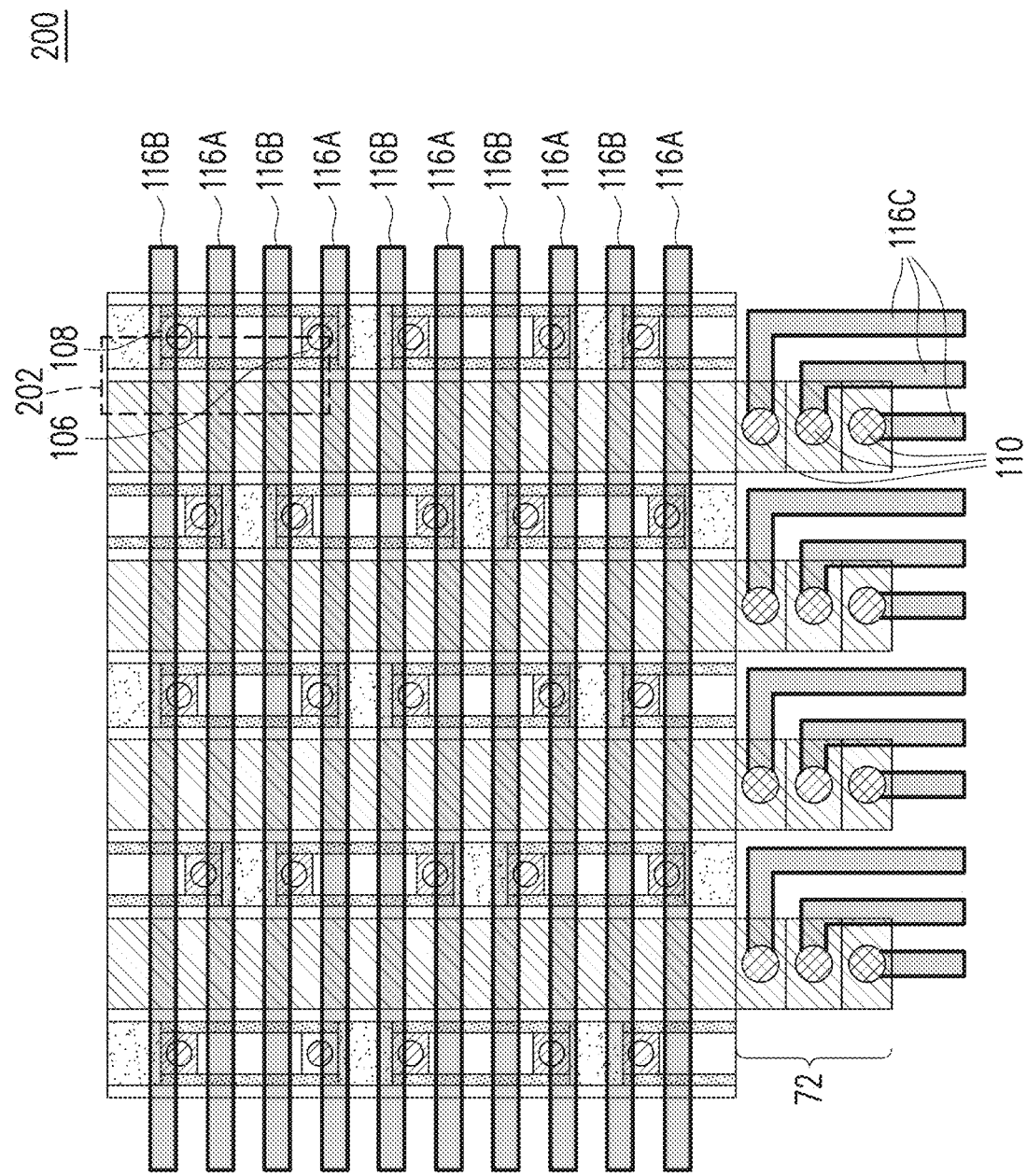
Figure 30D:
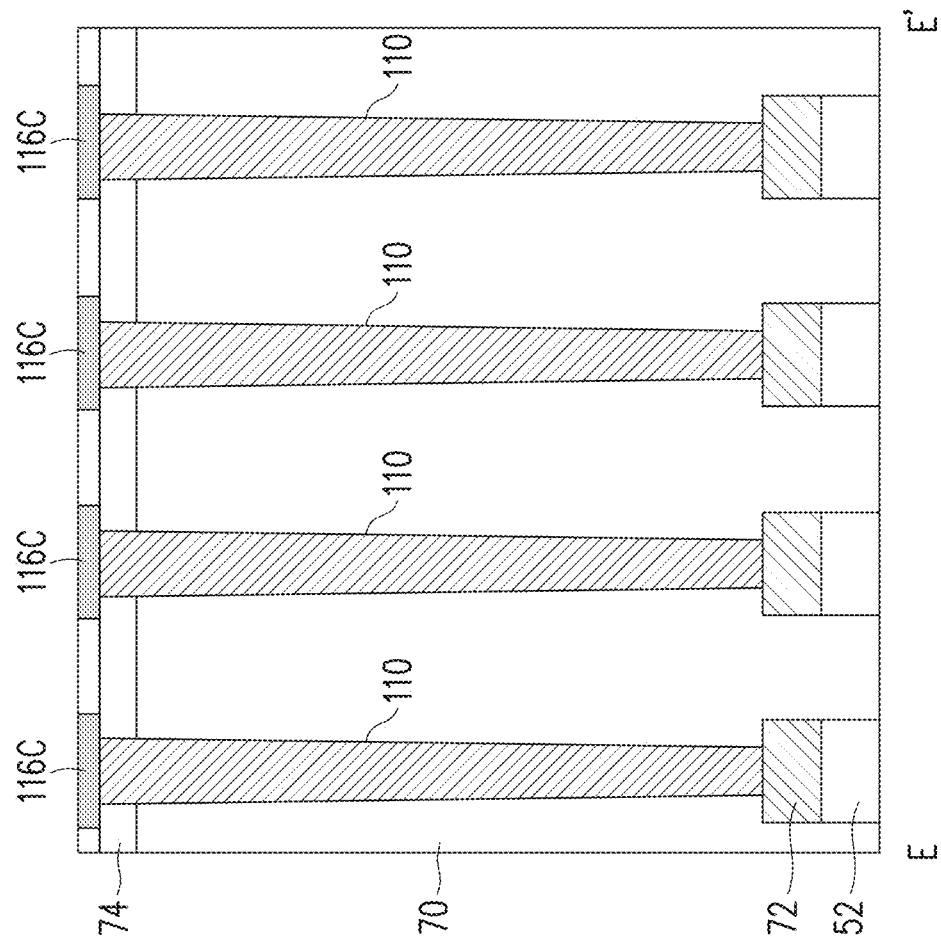
Figure 30E:
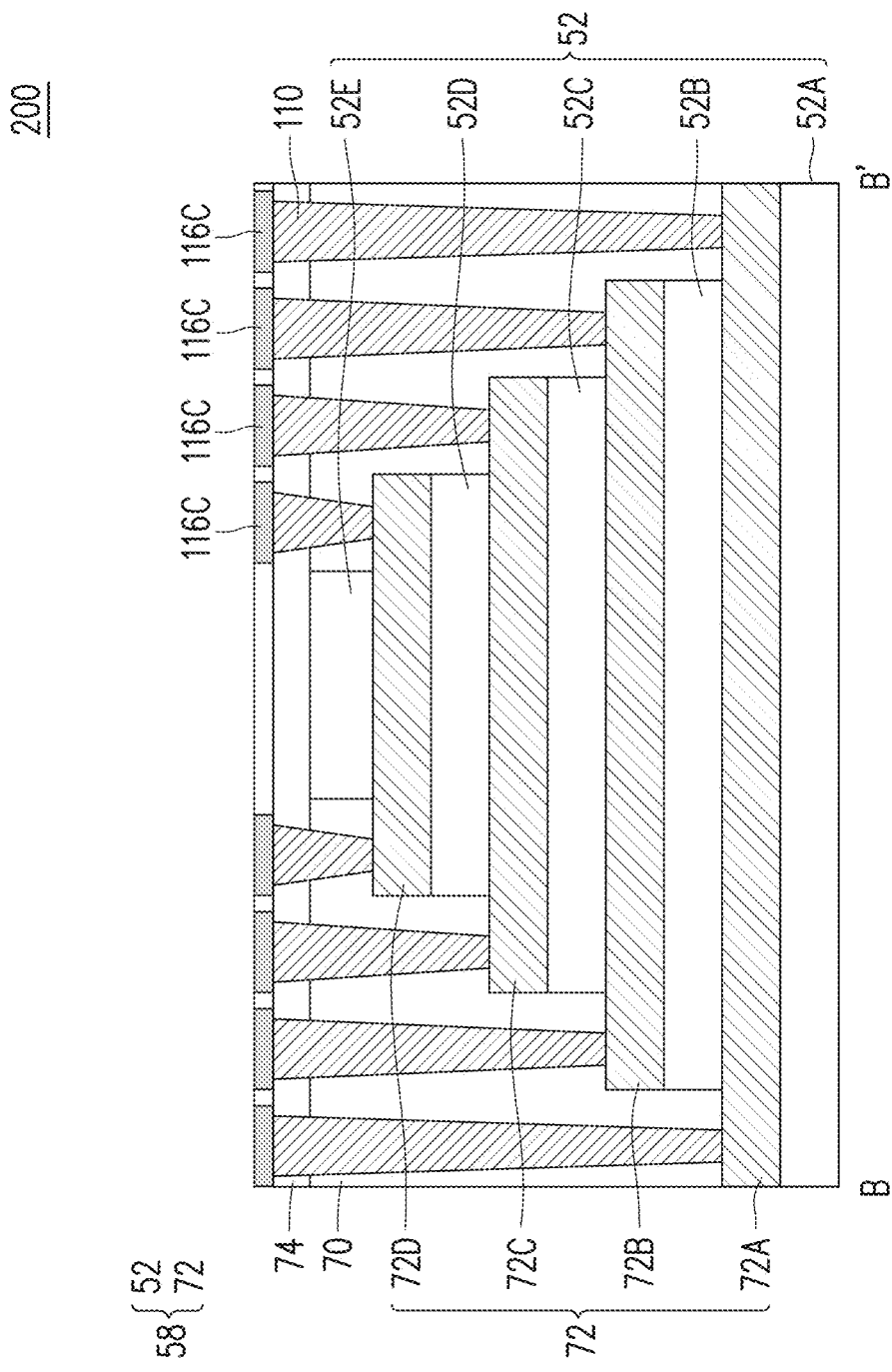
Figure 31:
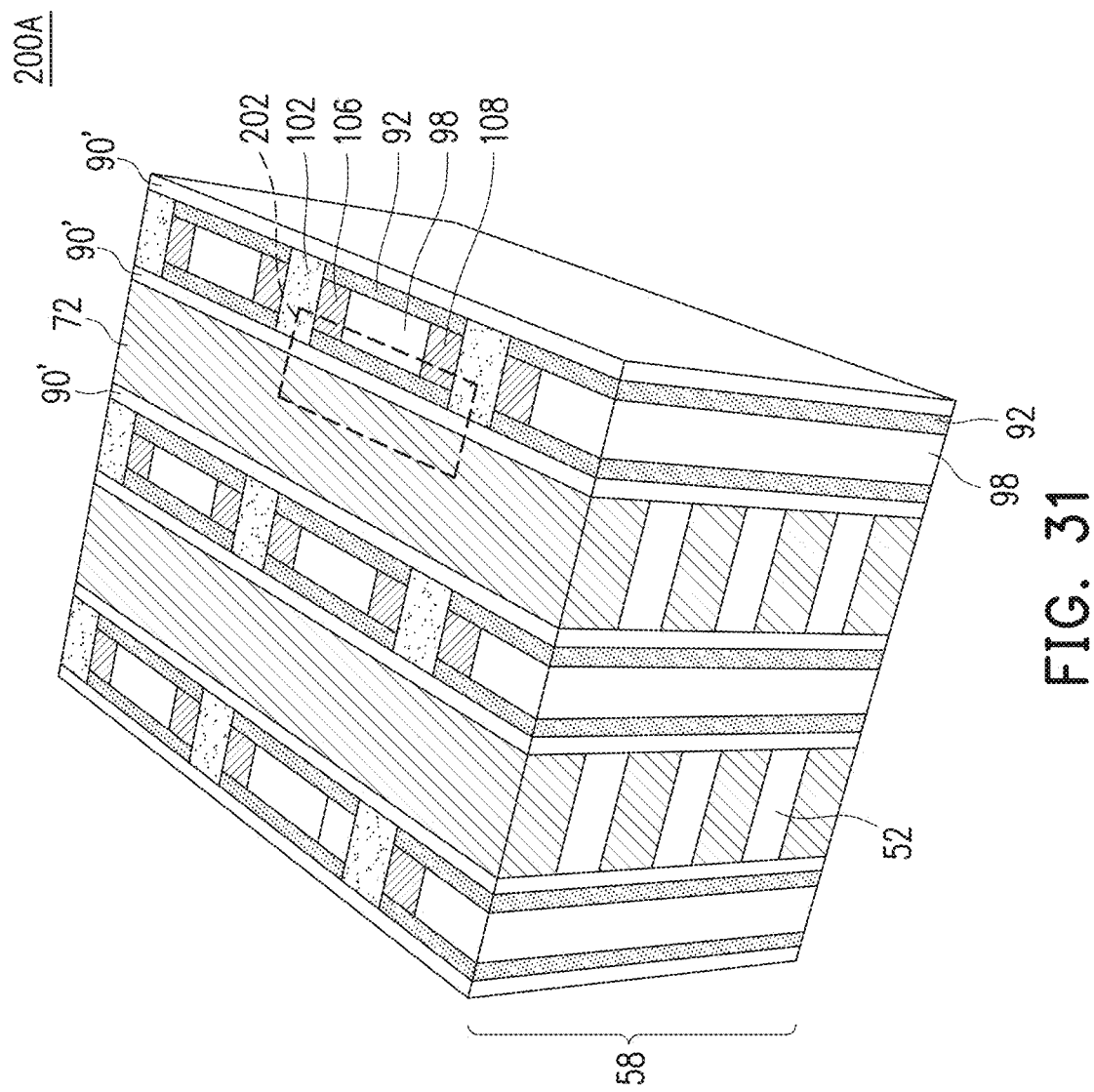
FIG. 31 illustrates a simplified perspective view of a ferroelectric memory device in accordance with alternative embodiments.

In FIGS. 30A, 30B, 30C, 30D and 30E, an IMD 74 is formed on top surfaces of the multi-layer stack 58 (e.g., the dielectric layer 52E), the ferroelectric layer 90', the channel layer 92, the conductive pillars 106, and the conductive pillars 108 and the IMD 70. Conductive contacts 110, 112, and 114 are made on the conductive lines 72, the conductive pillars 106, and the conductive pillars 108, respectively. FIG. 30A illustrates a perspective view of the memory array 200, which is also a perspective view of the part enclosed by the dashed line 30 in FIG. 30B; FIG. 30B illustrates a cross-sectional view of the device along line D-D' of FIG. 1A; FIG. 30C illustrates a top-down view of the memory array 200; and FIG. 30D illustrates a cross-sectional view along the line E-E' of FIG. 30A; and FIG. 30E illustrates a cross-sectional view of the device along line B-B' of FIG. 1A.

The IMD 74 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), a low-k dielectric material or the like. In some embodiments, the IMD 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD 74 to remove excess dielectric material over the multi-layer stack 58 and the IMD 70. In some embodiments, the removal process may be a planarization process, such as a chemical mechanical polish (CMP), an etch-back process, combinations thereof, or the like.

In some embodiments, the staircase shape of the conductive lines 72 may provide a surface on each of the conductive lines 72 for the conductive contacts 110 to land on. In some embodiments, forming the conductive contacts 110 may include patterning openings in the IMD 74 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the IMD 74. The remaining liner and conductive material form the conductive contacts 110 in the openings.

As also illustrated by the perspective view of FIG. 30A, conductive contacts 112 and 114 may also be made on the conductive pillars 106 and the conductive pillars 108, respectively. The conductive contacts 112, 114 and 110 may be electrically connected to conductive lines 116A, 116B, and 116C, respectively, which connect the memory array to an underlying/overlying circuitry (e.g., control circuitry) and/or signal, power, and ground lines in the semiconductor die. For example, as shown in FIG. 30D, the conductive contacts 110 may extend through the IMD 74 and IMD 70 to electrically connect conductive lines 116C to the conductive lines 72. Other conductive contacts or vias may be formed through the IMD 74 to electrically connect the conductive lines 116A and 1168 to the underlying active devices on the substrate. In alternate embodiments, routing and/or power lines to and from the memory array may be provided by an interconnect structure formed over the memory array 200 in addition to or in lieu of the interconnect structure 320. Accordingly, the memory array 200 may be completed.

Although the embodiments of FIGS. 1A through 30B illustrate a particular pattern for the conductive pillars 106 and 108, other configurations are also possible. For example, in these embodiments, the conductive pillars 106 and 108 have a staggered pattern. However, in other embodiments, the conductive pillars 106 and 108 in a same row of the array are aligned with each other, as shown in the ferroelectric memory 200A of FIG. 32.

The embodiments of FIGS. 1A through 30B illustrate the treatment 88 is shown to be executed at a specific timing, other suitable timing is also possible. For example, in these embodiments, the treatment 88 is performed before the channel layer 92 is formed. However, in other embodiments, the treatment 88 is replaced by a treatment 188 which is performed after a channel layer 192 is formed, as shown in the memory array 200' of FIGS. 32A, 32B, 33A, 33B, 34A, 34B, 34C, 34D, 35 and 36.

Figure 32A:
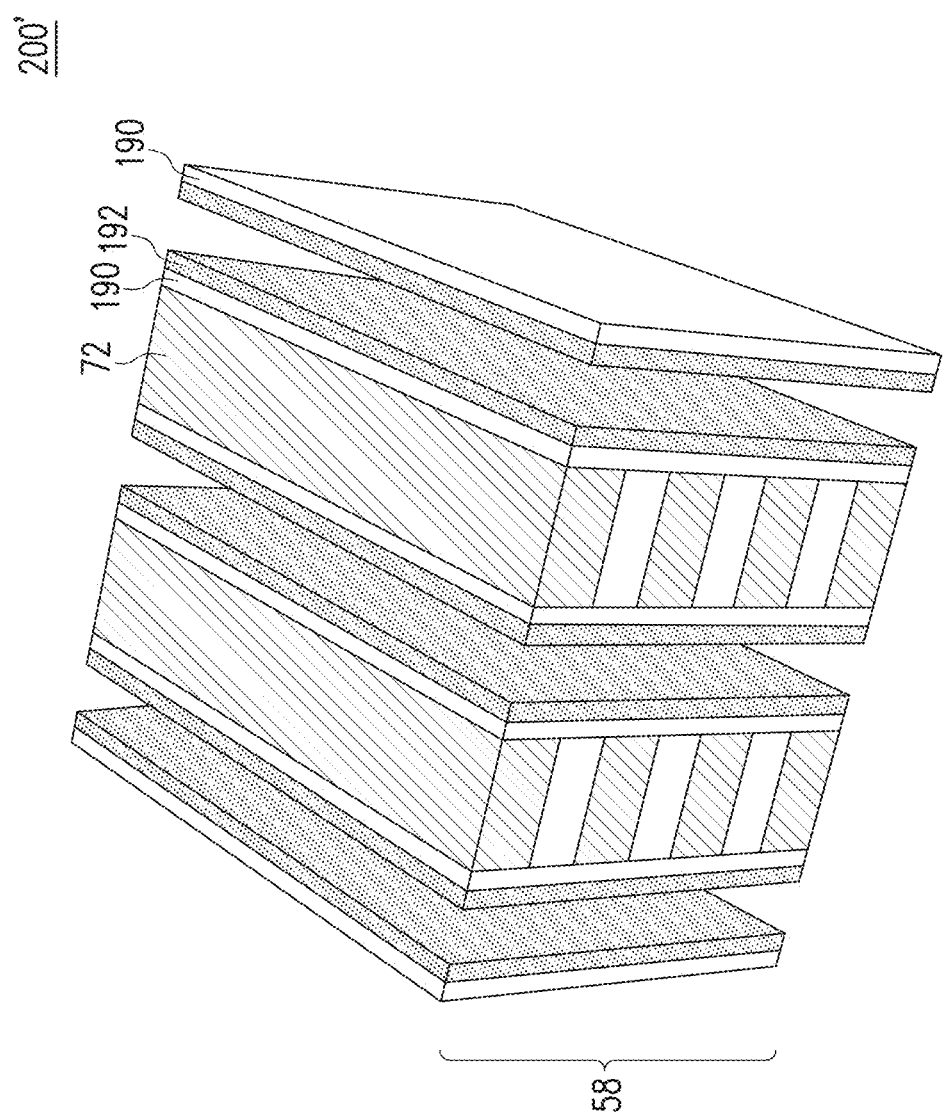
FIGS. 32A, 32B, 33A, 33B, 34A, 34B, 34C, and 36 illustrate varying views of intermediate stages in manufacturing a ferroelectric memory device in accordance with yet alternative embodiments.
Figure 33A:
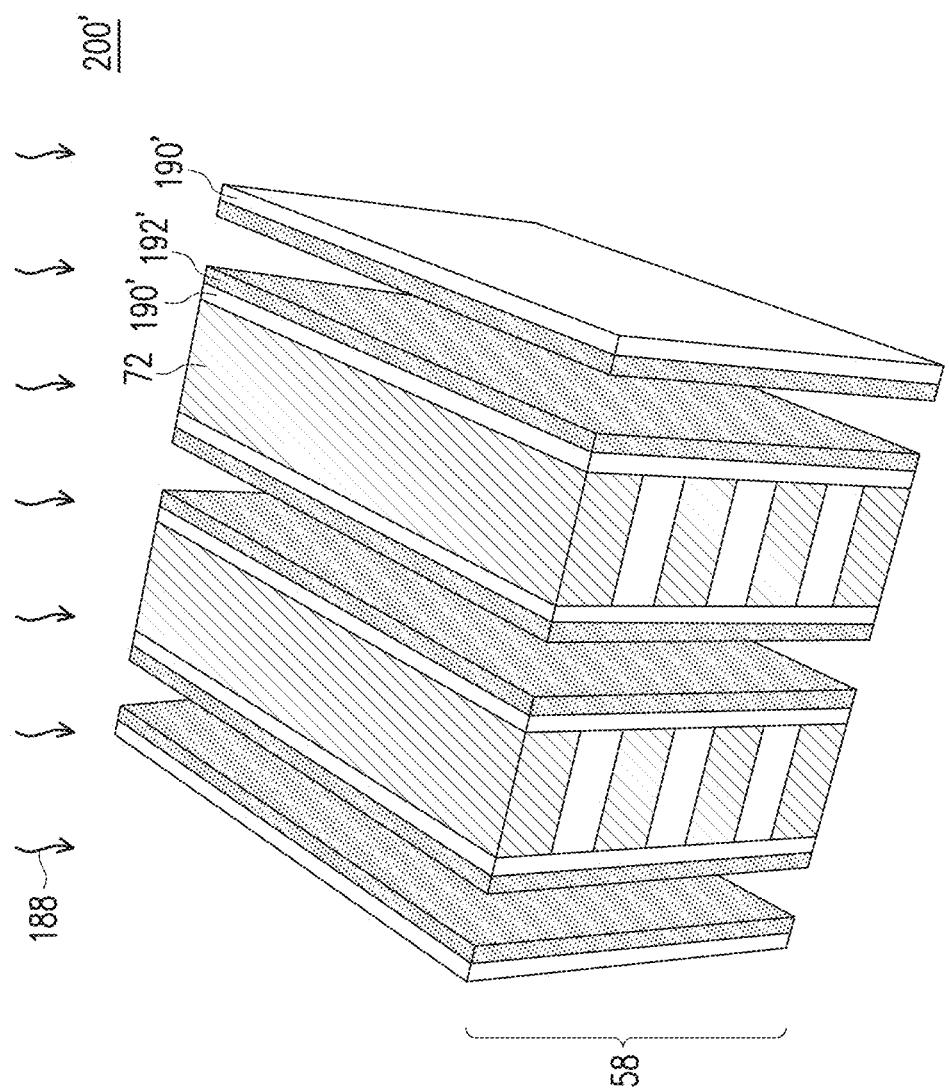
Figure 33B:
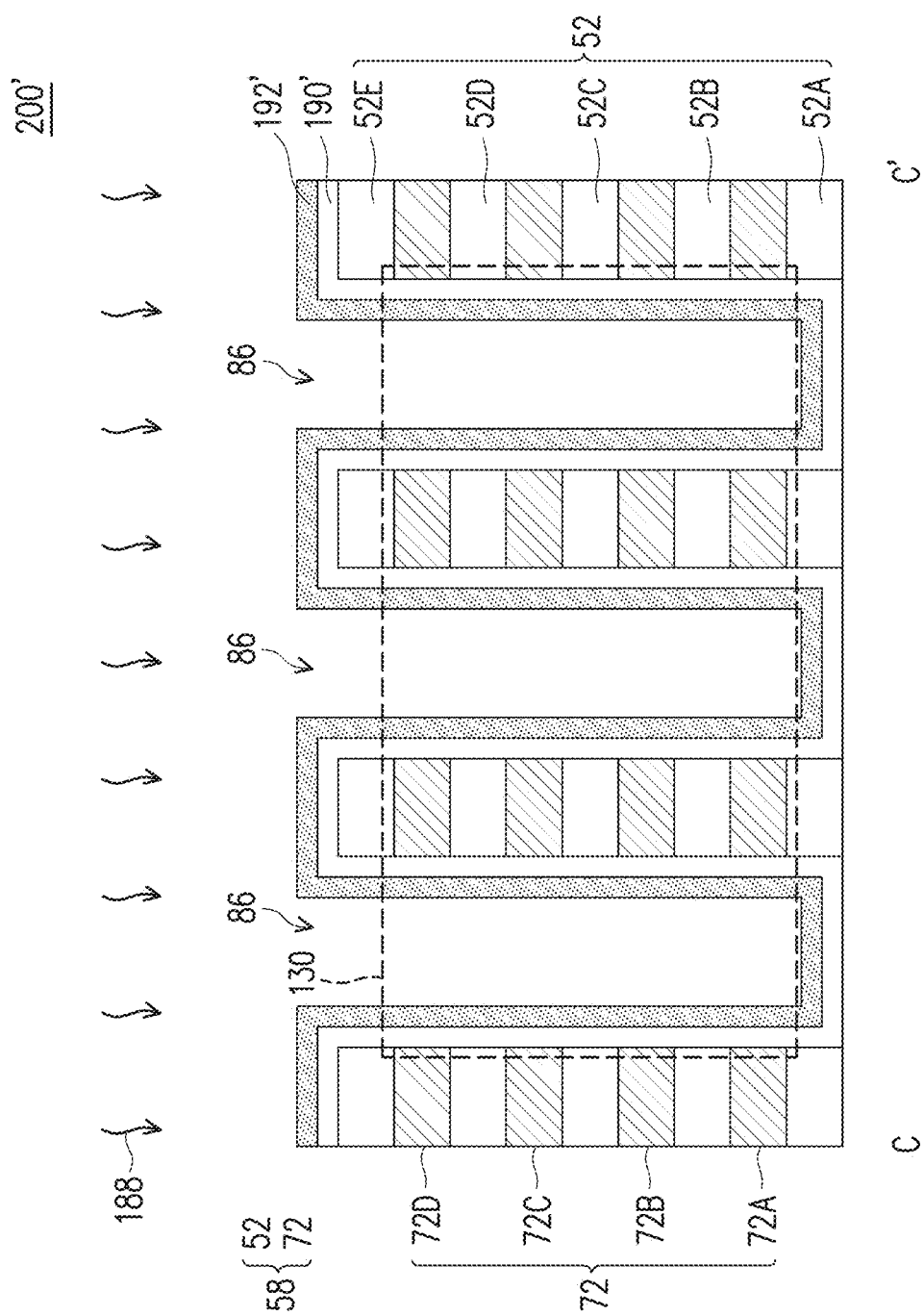
Figure 34A:
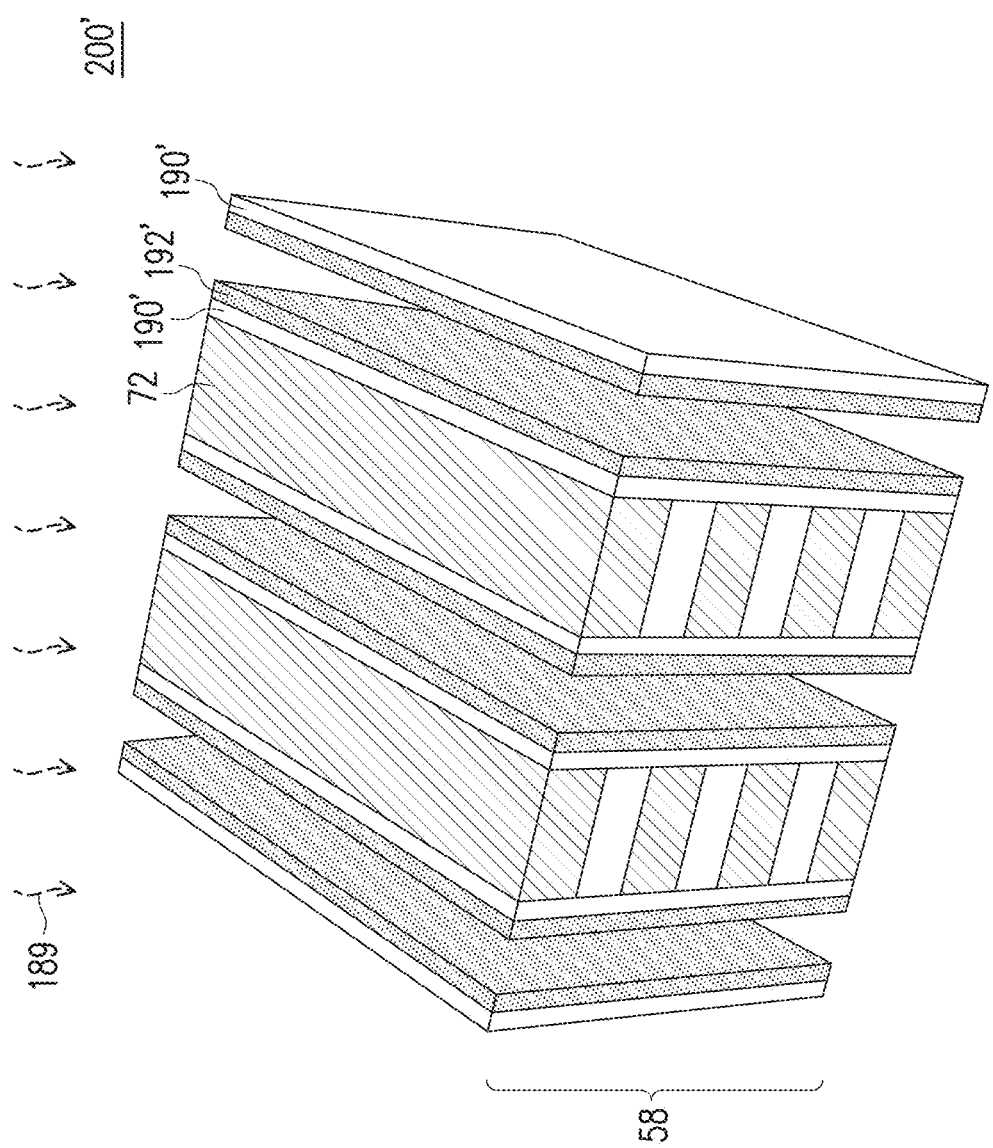
Figure 34B:
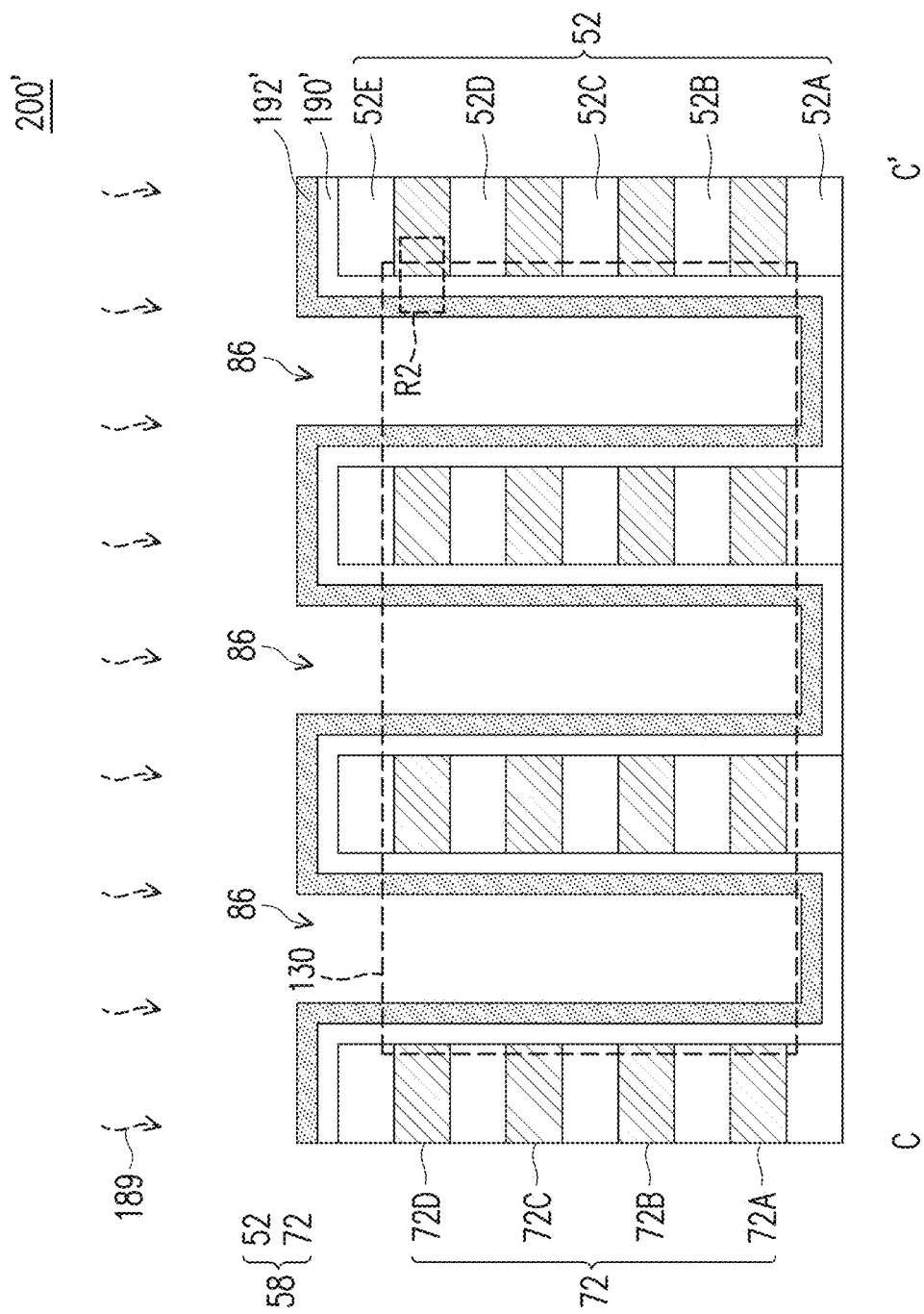
Figure 34D:
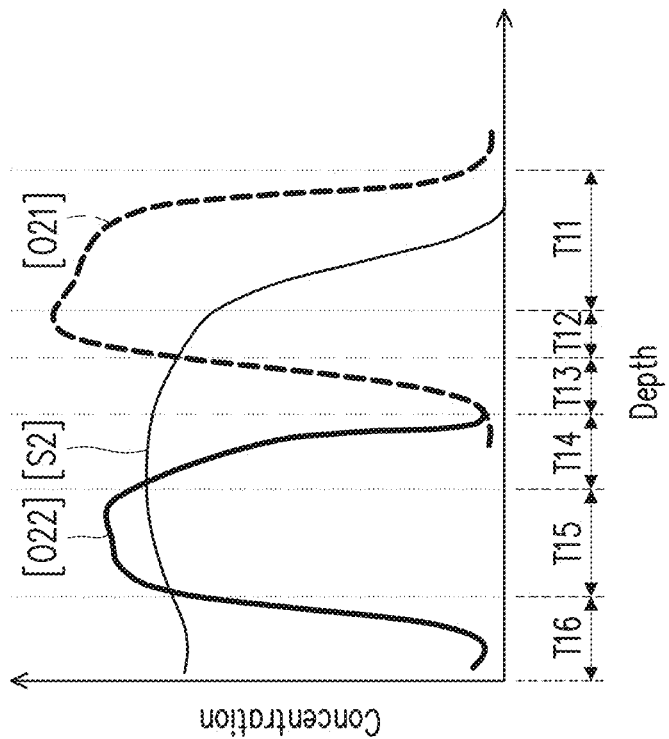
FIG. 34D illustrates a graph of the species and oxygen concentrations versus depths of the channel layer, the ferroelectric layer and the conductive line in accordance with some embodiments.
Figure 34C:
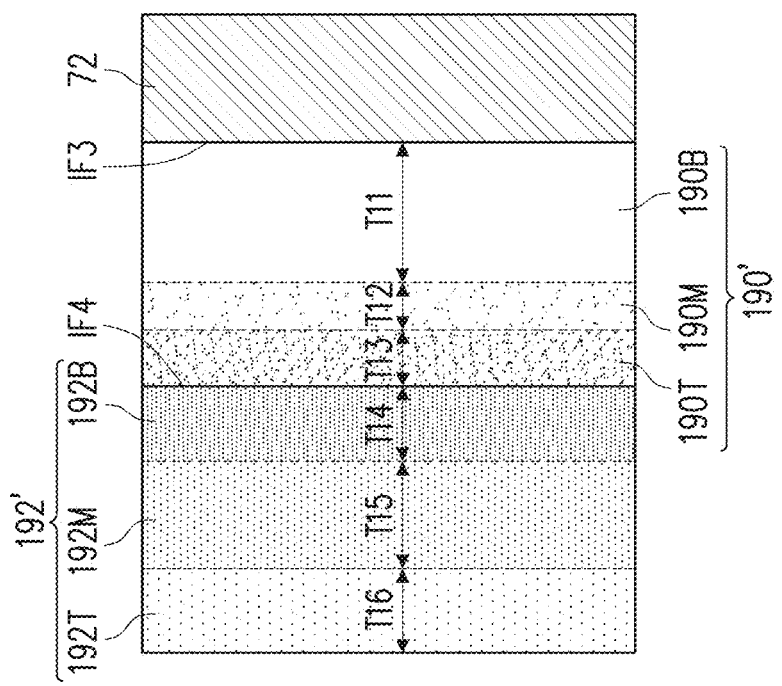
Figure 35:
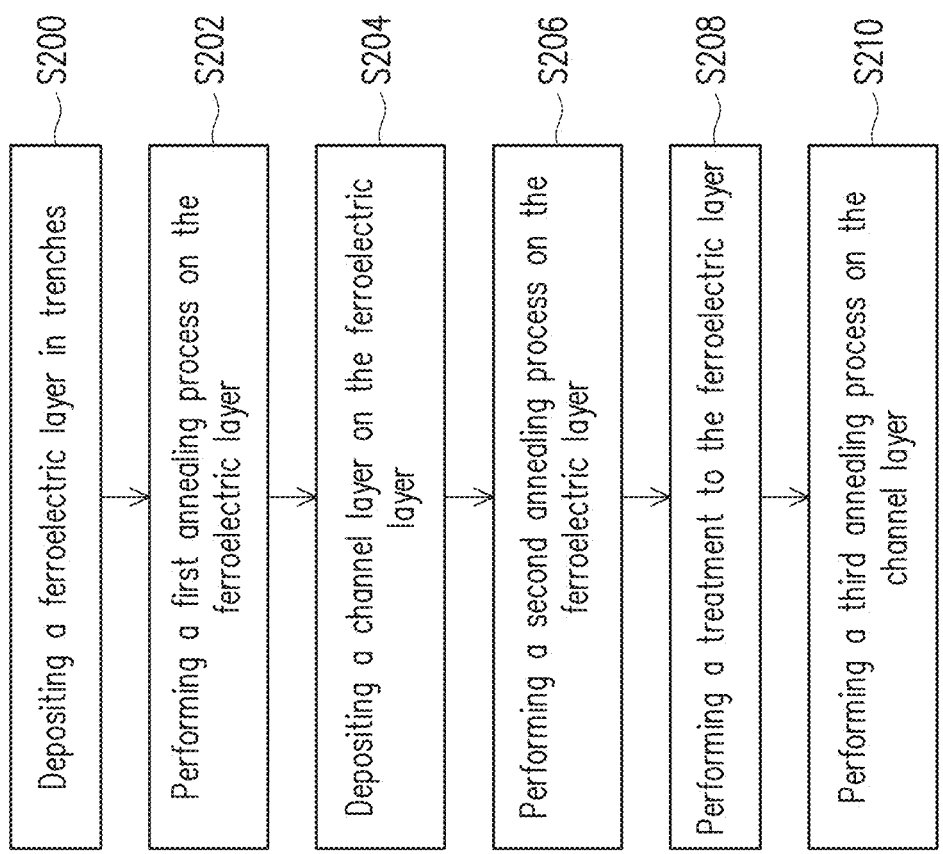
FIG. 35 illustrates a method of a method of forming the ferroelectric layer and the channel layer of a ferroelectric memory device in accordance with some embodiments.

FIGS. 32A through 36 illustrate forming a ferroelectric layer 190' and a channel layer 192' in the trenches 86. FIGS. 32A, 33A, 34A and 36 are illustrated in a partial three-dimensional view. FIGS. 32A, 33A, and 34A are also perspective views of the part enclosed by the dashed line 30 in FIGS. 32B, 33B, and 34B respectively. In FIGS. 32B, 33B, and 34B, cross-sectional views are provided along line C-C' of FIG. 36. FIG. 34C illustrates local enlarged views in a region R2 of FIG. 34B. FIG. 34D illustrates a graph of the species and oxygen concentrations versus depths of a channel layer 192', a ferroelectric layer 190' and a conductive line 72. FIG. 35 illustrates a method of forming the ferroelectric layer 190' and the channel layer 192' in accordance with some embodiments.

Figure 32B:
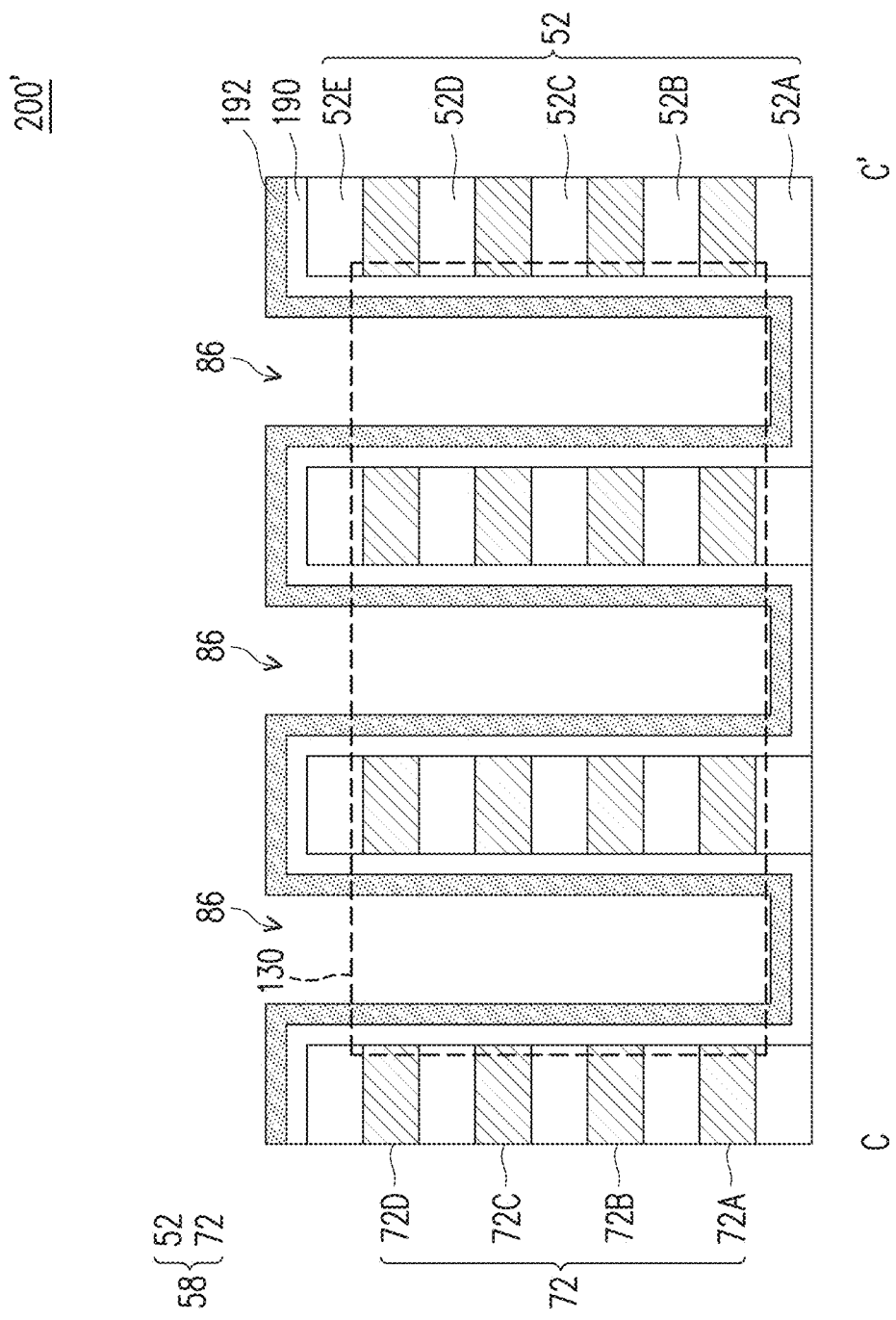

In FIGS. 32A, 32B, and at act S200 of FIG. 35, after a bulk multi-layer stack 58 is patterned to form trenches 86 therethrough, and sacrificial layers 53 are replaced with conductive materials to define the conductive lines 72, a ferroelectric layer 190 may be deposited conformally in the trenches 86 along sidewalls of the conductive lines 72 and top surfaces of the dielectric layer 52E, and along the bottom surfaces of the trenches 86. In some embodiments, the ferroelectric layer 190 may be further deposited on the IMD 70 and along the sidewall of each step of the staircase structure in the staircase region. The ferroelectric layer 190 may include a material that is capable of switching between two different polarization directions by applying an appropriate voltage differential across the ferroelectric layer 190. The ferroelectric layer 190 may be the same as or similar to the ferroelectric layer 90 of FIG. 17A. At act S202 of FIG. 35, a first annealing process is performed to the ferroelectric layer 190, so as to achieve a desired crystalline lattice structure for the ferroelectric layer 190. In these embodiments, the first annealing process may be the same as or similar to the third annealing process at act S102 of FIG. 21.

In FIGS. 32A, 32B, and at act S204 of FIG. 35, a channel layer 192 is conformally deposited in the trenches 86 over the ferroelectric layer 190. The channel layer 192 includes materials suitable for providing channel regions for the memory cells 202' (see FIG. 36). The channel layer 192 may be the same as or similar to the channel layer 92 of FIG. 20A. At act S206 of FIG. 35, a second annealing process is performed to the channel layer 192 to activate the charge carriers of the channel layer 192. In these embodiments, the second annealing process may be the same as or similar to the third annealing process at act S110 of FIG. 21.

In FIGS. 33A, 33B, and at act S208 of FIG. 35, after the ferroelectric layer 190 and the channel layer 192 are formed, a treatment 188 is performed on the channel layer 192 and the ferroelectric layer 190 to form a channel layer 192' and a ferroelectric layer 190' to enhance the endurance performance of the device. In some embodiments, the treatment 188 introduces species in the channel layer 192 and the ferroelectric layer 190 by an energy source. The energy source of the treatment 188 may be provided by an ion implantation process, a plasma process, or other suitable processes including thermal diffusion, e-beam, ultraviolet (UV), or combinations thereof.

The treatment 188 may be a nitridation treatment process, or a halogen treatment process. In some embodiments, the treatment 188 introduces a species with valence of 5, e.g., nitrogen (N), or valence of 7 e.g., fluorine (F) so as to eliminate or block traps or defects in an interface IF4 between the ferroelectric layer 190 and the channel layer 192, and/or to occupy oxygen vacancies in the interface IF4, the channel layer 192 and/or the ferroelectric layer 190 and serve as a passivation to suppress interdiffusion of oxygen, hydrogen and vacancies, so that the intrinsic fatigue performance and endurance of the ferroelectric layer 190' may be improved. The channel layer 192' may also be referred to as a channel layer containing the species (such as nitrogen or halogen), and the ferroelectric layer 190' may also be referred to as a ferroelectric layer containing the species (such as nitrogen or halogen) in some embodiments. The channel layer 192' may also be referred to as a passivation species (such as nitrogen or halogen)-doped channel layer, and the ferroelectric layer 190' may also be referred to as a passivation species (such as nitrogen or halogen)-doped ferroelectric layer in alternative embodiments.

Hence, the channel layer 192' and the ferroelectric layer 190' have the species with valence of 5, 7 or a combination thereof. In some embodiments, the ion implantation process or the plasma process is performed at a relatively low energy to prevent damage of the channel layer 192 and the ferroelectric layer 190 and enhance neutralization efficiency. For example, the ion implantation process is performed at energy about 10 KeV to 50 KeV with a dose about 1 atoms/cm$^2$ to 1000 atoms/cm$^2$. For example, the plasma process is performed in a plasma chamber with a gas (e.g., $N_2$, $NH_3$, $CF_4$, or $CFH_3$) flow rate of about 10 sccm to about 1000 sccm, a power of 15 Watts to 500 Watts, and a pressure of about 1 Torr to about 760 Torr for a period of about 1 second to about 30 seconds and at a temperature of less than 250° C. to 400° C. In other embodiments, the plasma process is performed in a plasma chamber with a gas (e.g., $N_2$, $NH_3$, $CF_4$, or $CFH_3$) flow rate of about 1000 sccm to about 10000 sccm, a power of 10 Watts to 1000 Watts, and a pressure of about 1 Torr to about 1000 Torr for a period of about 1 second to about 360 seconds and at a temperature of less than 500° C.

At act S210 of FIG. 35, a third annealing process 189 is performed on the channel layer 192' and the ferroelectric layer 190'. In some embodiments, the third annealing process 189 includes a spike annealing process. The spike annealing process may be performed using the following process parameters or conditions: a peak annealing temperature that is maintained to be in a range between about 380° C. and about 420° C., an annealing time (or duration) (during which the peak temperature is maintained) that is in a range between about 1 second and about 60 seconds, and an annealing pressure that is in a range between about 50 torr and about 760 torr. These process parameters above of the annealing process are not arbitrarily chosen but rather are carefully tuned to active the species in the channel layer 192' and the ferroelectric layer 190'. As a result, a species concentration of the channel layer 192' may be in a range of about $1E17/cm^3$ to about $1E20/cm^3$, and a species concentration of the ferroelectric layer 190' may be in a range of about $1E17/cm^3$ to about $1E20/cm^3$, for example.

As illustrated in FIGS. 34C and 34D, in some embodiments, the ferroelectric layer 190' and the channel layer 192' have a varying concentration of the species (e.g., fluorine, nitrogen, or the like). For example, the ferroelectric layer 190' may have a tri-portion structure comprising a bottom ferroelectric portion 190B having a thickness T11, a middle ferroelectric portion 190M having a thickness T12 and a top ferroelectric portion 190T having a thickness T13. The bottom ferroelectric portion 190B is in contact with the conductive line 172, and the middle ferroelectric portion 190M is located between the bottom ferroelectric portion 190B and the top ferroelectric portion 190T. The channel layer 192' may have a tri-portion structure comprising a bottom channel portion 192B having a thickness T14, a middle channel portion 192M having a thickness T15, and a top channel portion 192T having a thickness T16. The bottom channel portion 192B is in contact with the conductive line 172, and the middle channel portion 192M is located between the bottom channel portion 192B and the top channel portion 192T. These portions of channel layer 192' and the ferroelectric layer 190' have different species concentrations and oxygen concentrations.

In FIG. 34D, a graph of the species concentration versus positions of the channel layer 192', the ferroelectric layer 190' and the conductive line 72 is shown. The y-axis indicates the species concentration and the oxygen concentration. The x-axis indicates the depth for the channel layer 192', the ferroelectric layer 190' and the conductive line 72. The curve [O22] indicates the oxygen concentration of the channel layer 192'; the curve [O21] indicates the oxygen concentration of the ferroelectric layer 190' and the curve [S2] indicates the species concentration.

In some embodiments, the curve [O22] shows a middle channel portion 192M of the channel layer 192' has the maximum oxygen concentration, and a top channel portion 192T and a bottom channel portion 192B of the channel layer 192' has an oxygen concentration lower than the oxygen concentration of the middle channel portion 192M of the channel layer 192'.

The curve [O21] shows a part of the middle ferroelectric portion 190M near the bottom ferroelectric portion 190B has the maximum oxygen concentration. The maximum oxygen concentration of the ferroelectric layer 190' is higher than the maximum oxygen concentration of the channel layer 192'. The top ferroelectric portion 190T has an oxygen concentration lower than the oxygen concentration of the bottom ferroelectric portion 190B and the middle ferroelectric portion 190M.

The curves [S2] shows the top channel portion 192T, the middle channel portion 192M and the bottom channel portion 192B, the top ferroelectric portion 190T, the middle ferroelectric portion 190M and the bottom ferroelectric portion 190B have the species. The channel layer 192' has the maximum species concentration. A ratio of a distribution range of the species to a distribution range of oxygen in the channel layer 192' (e.g., the oxide semiconductor layer) is greater than a ratio of a distribution range of the species to a distribution range of oxygen in the ferroelectric layer 190'.

The maximum species concentration is between the maximum oxygen concentration of the channel layer 192' and the maximum oxygen concentration of the ferroelectric layer 190'. The bottom channel portion 192B has the maximum species concentration. The species concentration increases from the top channel portion 192T to the bottom channel portion 192B of the channel layer 192'. The species concentration decreases from the bottom channel portion 192B of the channel layer 192' to the bottom ferroelectric portion 190B of the ferroelectric layer 190'. The interface IF4 between the bottom channel portion 192B and the top ferroelectric portion 190T has the species concentration higher than a species concentration of the interface IF3 between the bottom ferroelectric portion 190B and the conductive lines 72.

The species concentration of the interface IF4 between the bottom channel portion 192B and the top ferroelectric portion 190T is higher than the oxygen concentration thereof. The species concentrations of the bottom channel portion 192B is higher than the oxygen concentrations thereof. The species concentrations of the top ferroelectric portion 190T is higher than the oxygen concentrations thereof.

Figure 36:
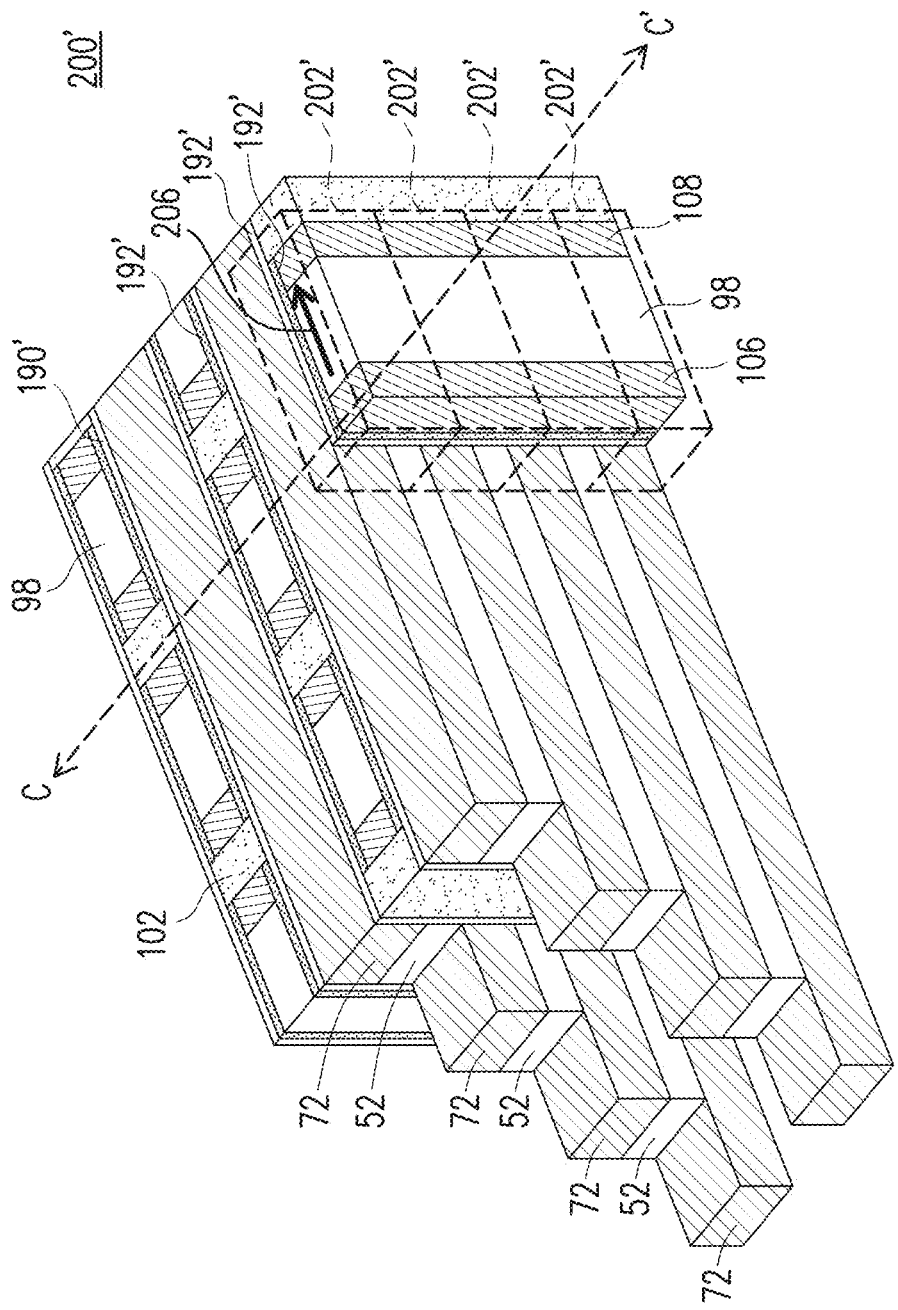

After the channel layer 192' is formed, the channel layer 192' is patterned and the subsequent processes are performed according to the aforementioned method so as to form memory array 200' including a plurality of memory cells 202' as shown in FIG. 36.

FIG. 36 illustrates a simplified perspective view of a ferroelectric memory device in accordance with some embodiments. The memory array 200' is similar to the memory array 200, and the memory cells 202' is similar to the memory cells 202 of FIG. 1A, but the oxide semiconductor layer 192' has a wider distribution range of the species than the channel layer 92 (e.g., the oxide semiconductor layer).

Figure 37:
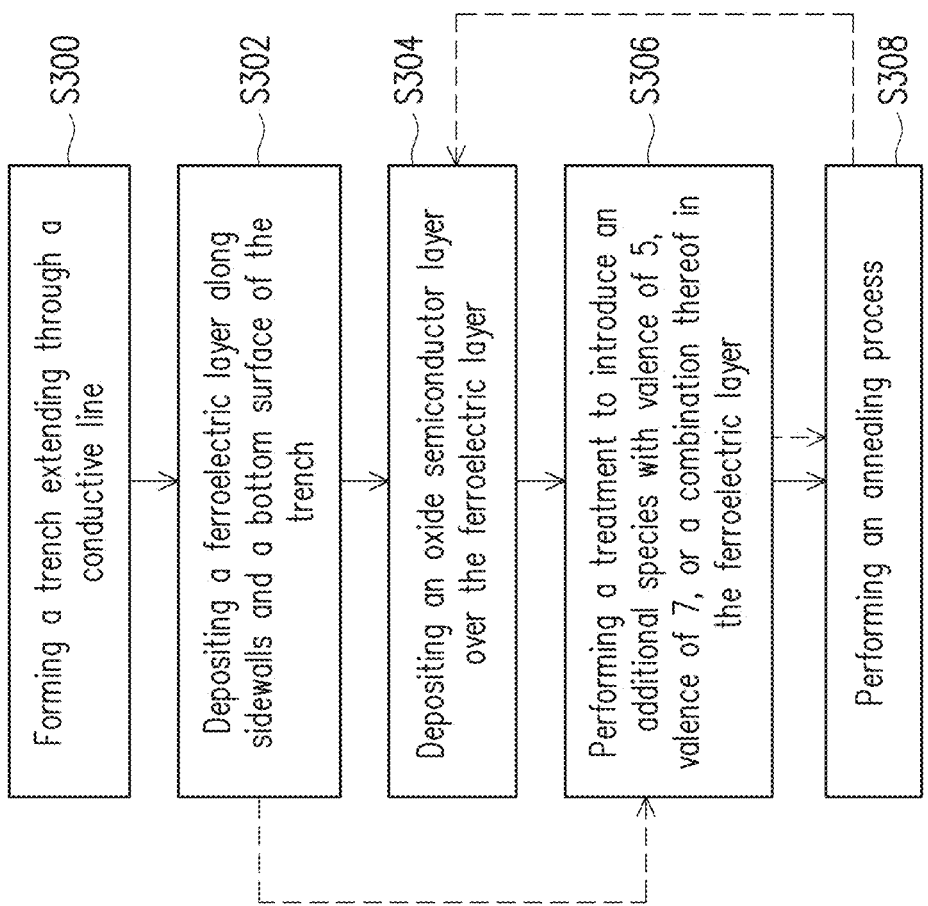
FIG. 37 illustrates a method of forming a ferroelectric memory device in accordance with some embodiments.

FIG. 37 illustrates a method of forming a ferroelectric memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 16A:
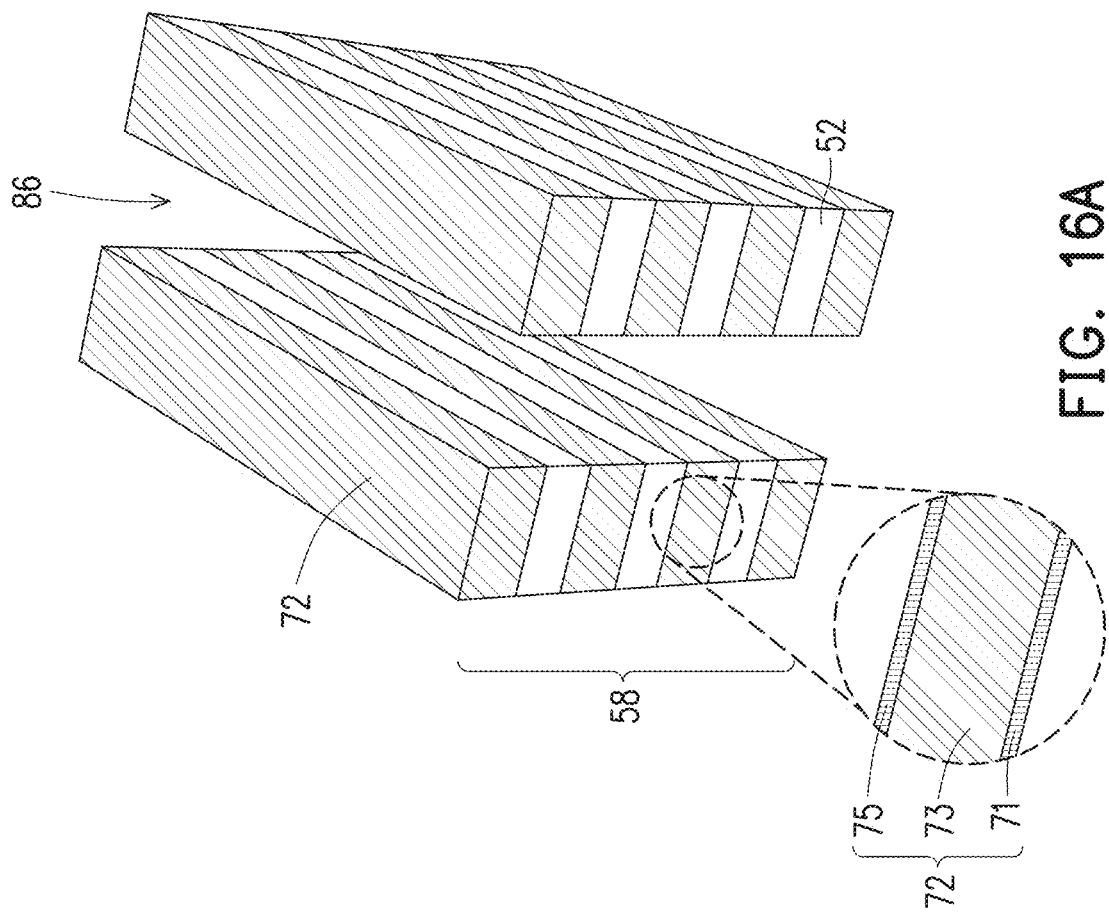
Figure 16B:
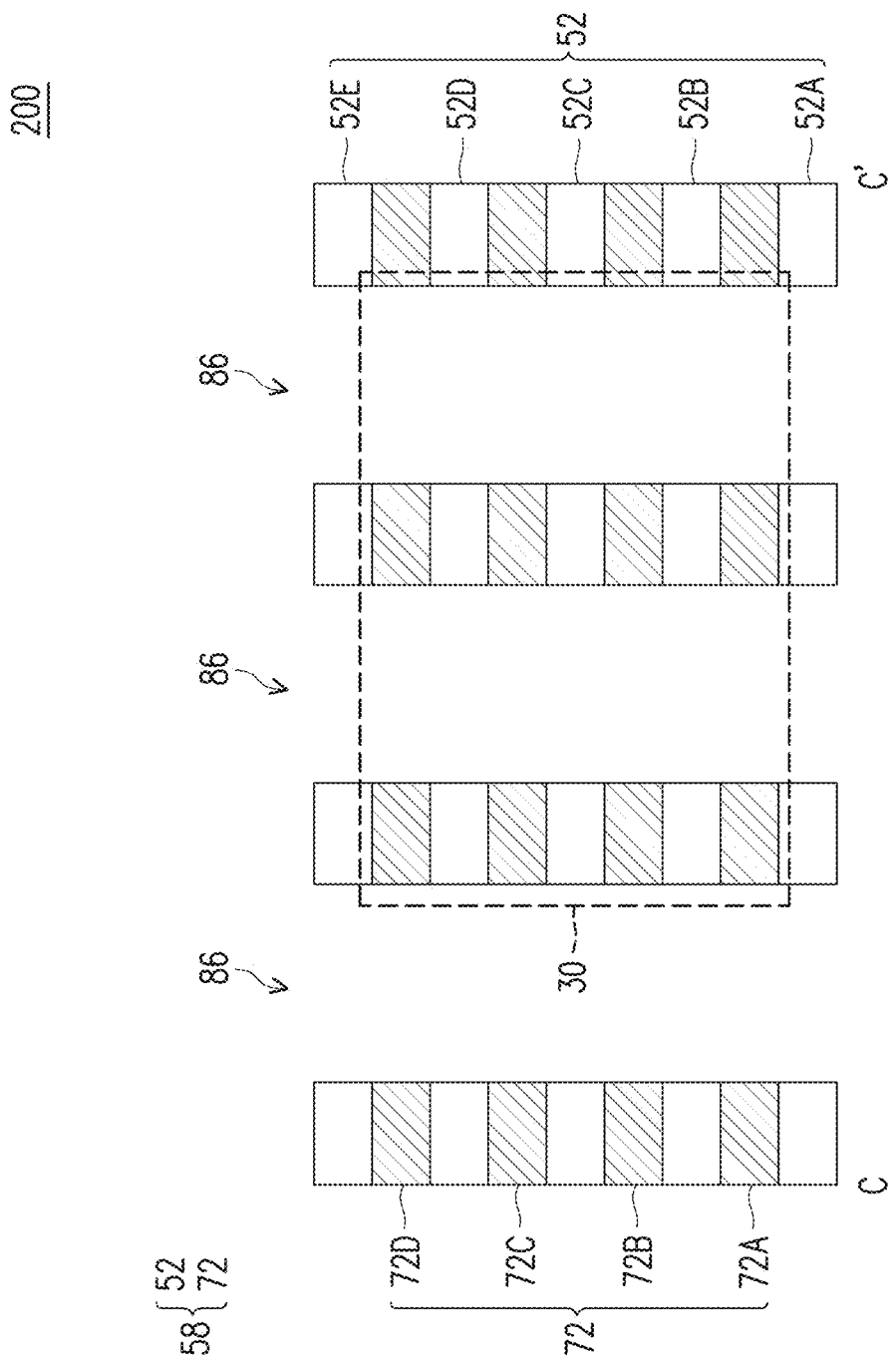

At act S300, a trench is formed extending through a conductive line. FIG. 16A to FIG. 16B illustrate varying views corresponding to some embodiments of act S300.

At act S302, a ferroelectric layer is deposited along sidewalls and a bottom surface of the trench. FIG. 17A to FIG. 17B and FIG. 32A and FIG. 32B illustrate varying views corresponding to some embodiments of act S302.

At act S304, an oxide semiconductor layer is deposited over the ferroelectric layer. The oxide semiconductor layer extends along the sidewalls and the bottom surface of the trench. FIG. 20A to FIG. 20B and FIG. 32A and FIG. 32B illustrate varying views corresponding to some embodiments of act S304.

At act S306, a treatment is performed to introduce a species with valence of 5, valence of 7, or a combination thereof in the ferroelectric layer. FIGS. 18A, 18B, 33A and 33B illustrate varying views corresponding to some embodiments of act S306. The treatment process is an ion implantation process, a plasma process, or combinations thereof, for example. In some embodiments, the treatment is performed between the ferroelectric layer and the oxide semiconductor layer are deposited. In alternative embodiments, the treatment is performed after the oxide semiconductor layer is deposited.

At act S308, an annealing process is performed after the treatment is performed. FIGS. 19A,19B, 34A and 34B illustrate varying views corresponding to some embodiments of act S308.

Although the embodiments of FIGS. 1A through 30B and FIGS. 32A through 36 illustrate the staircase structure is formed before the trenches 86 are formed, other timings are also possible. For example, the staircase structure is formed after the conductive pillars 106 and 108 are formed and before the IMD 74 is formed.

Various embodiments provide a 3D memory array with vertically stacked memory cells. The memory cells each comprise a TFT with a FE gate dielectric material and an oxide semiconductor channel region. In some embodiments, the ferroelectric layer 90'/190' and/or the oxide semiconductor layer 92/192' may contain a species with valence of 5, valence of 7, or a combination thereof. For example, the species with valence of 5 is nitrogen, and the species with valence of 7 is fluorine. The inclusion of the species may allow for the ferroelectric layer 90' to eliminate or block traps or defects in the interface IF2 between the ferroelectric layer 90'/190' and the channel layer 92/192', and/or to occupy oxygen vacancies in the interface IF2, the ferroelectric layer 90'/190' and the channel layer 92/192' and serve as a passivation to suppress interdiffusion of oxygen, hydrogen and vacancies so that the intrinsic fatigue performance and endurance of the ferroelectric layer 90'/190' may be improved. Accordingly, various embodiments improve reliability of the resulting device and manufacturing ease.

In accordance with some embodiments of the present disclosure, a memory cell includes a transistor over a semiconductor substrate, the transistor comprising: a ferroelectric layer arranged along a sidewall of a word line, the ferroelectric layer comprising a species with valence of 5, valence of 7, or a combination thereof; and an oxide semiconductor layer electrically coupled to a source line and a bit line, wherein the FE layer is disposed between the oxide semiconductor layer and the word line.

In accordance with alternative embodiments of the present disclosure, a device includes a semiconductor substrate; a first memory cell over the semiconductor substrate, the first memory cell comprising a first transistor, wherein the first transistor comprises: a first portion of a ferroelectric layer, the first portion of the ferroelectric layer being on a sidewall of a first word line, and the ferroelectric layer comprising a species with valence of 5, valence of 7, or a combination thereof; and a first channel region on a sidewall of the ferroelectric layer, the first channel region comprising an oxide semiconductor layer, wherein a first interface between the first channel region and the first portion of the ferroelectric layer has a species has valence of 5, valence of 7, or a combination thereof, and; a second memory cell over the first memory cell.

In accordance with yet alternative embodiments of the present disclosure, a method includes forming a trench extending through a conductive line; depositing a ferroelectric layer along sidewalls and a bottom surface of the trench; depositing an oxide semiconductor layer over the ferroelectric layer, the oxide semiconductor layer extending along the sidewalls and the bottom surface of the trench; and performing a treatment to introduce a species with valence of 5, valence of 7, or a combination thereof in the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a trench extending through a conductive line;
    depositing a ferroelectric layer along sidewalls and a bottom surface of the trench;
    depositing an oxide semiconductor layer over the ferroelectric layer, the oxide semiconductor layer extending along the sidewalls and the bottom surface of the trench; and
    performing a treatment to introduce a species with valence of 5, valence of 7, or a combination thereof in the ferroelectric layer.

2. The method of claim 1, wherein the species with valence of 5 is nitrogen, and the species with valence of 7 is oxygen.

3. The method of claim 1, wherein the treatment comprises an ion implantation process, a plasma process, or combinations thereof.

4. The method of claim 1, wherein the treatment is performed between the depositing the ferroelectric layer and the depositing the oxide semiconductor layer.

5. The method of claim 1, further comprising:
    performing an anneal process after the performing the treatment.

6. A method comprising:
    forming a plurality of conductive lines over a substrate, wherein the plurality of conductive lines are stacked onto one another and are vertically separated from one another by dielectric layers interleaved between adjacent ones of the plurality of conductive lines;
    forming a ferroelectric layer along sidewalls of the plurality of conductive lines and the dielectric layers;
    forming an oxide semiconductor layer to cover a sidewall of the ferroelectric layer, wherein the ferroelectric layer separates the oxide semiconductor layer from the sidewalls of the plurality of conductive lines;
    forming a plurality of conductive pillars along a sidewall of the oxide semiconductor layer that faces away from the ferroelectric layer; and
    forming a species within the ferroelectric layer prior to forming the oxide semiconductor layer, wherein the species has a concentration that decreases along a direction extending from the oxide semiconductor layer towards the plurality of conductive lines.

7. The method of claim 6, wherein the concentration of the species is between about $1E17/cm^3$ and $1E20/cm^3$.

8. The method of claim 6, wherein the ferroelectric layer comprises a first portion in contact with the plurality of conductive lines, a second portion on a sidewall of the first portion, and a third portion in contact with a second sidewall of the oxide semiconductor layer, the second portion and the third portion having a greater concentration of the species than the first portion.

9. The method of claim 8, wherein a maximum concentration of the species within the ferroelectric layer is positioned between opposing sides of the third portion.

10. The method of claim 9, wherein the first portion has a first species concentration that is in a first range of less than 1% of the maximum concentration of the species, the second portion has a second species concentration that is in a second range of between about 1% to about 40% of the maximum concentration of the species, and the third portion has a third species concentration that is in a third range of about 50% to about 100% of the maximum concentration of the species.

11. The method of claim 6, wherein the species is further disposed within the oxide semiconductor layer.

12. A method comprising:
forming a stack comprising alternating sacrificial layers and dielectric layers;
patterning the stack to define trenches exposing sidewalls of the sacrificial layers and the dielectric layers;
replacing portions of the sacrificial layers with a plurality of conductive lines;
forming a ferroelectric layer on sidewalls of the plurality of conductive lines and the dielectric layers;
performing a treatment to introduce a species into the ferroelectric layer;
forming an oxide semiconductor layer along a sidewall of the ferroelectric layer, wherein the oxide semiconductor layer separates the ferroelectric layer from the plurality of conductive lines;
forming a dielectric material onto the oxide semiconductor layer and within the trenches;
patterning the dielectric material to form a first opening; and
filling the first opening with a conductive material to form a conductive pillar along a sidewall of the oxide semiconductor layer.

13. The method of claim 12, further comprising:
patterning the dielectric material and the oxide semiconductor layer prior to patterning the dielectric material to form a second opening; and
filling the second opening with an insulating material to form an isolation pillar.

14. The method of claim 13, wherein the isolation pillar has a sidewall that contacts sidewalls of the conductive pillar and the oxide semiconductor layer.

15. The method of claim 12, wherein the species is nitrogen or fluorine.

16. The method of claim 12, wherein the oxide semiconductor layer is formed to directly contact the sidewall and an upper surface of the ferroelectric layer.

17. The method of claim 12, wherein a first interface between the ferroelectric layer and the oxide semiconductor layer has a first concentration of the species that is higher than a second concentration of the species at a second interface between the ferroelectric layer and the plurality of conductive lines.

18. The method of claim 12, wherein the species has one or more of a valence of 5 and a valence of 7.

19. The method of claim 12, wherein a ratio of a distribution range of the species to a distribution range of oxygen in the ferroelectric layer is greater than a ratio of a distribution range of the species to a distribution range of oxygen in the oxide semiconductor layer.

20. The method of claim 12, wherein the treatment comprises a plasma treatment performed at a power that is in a range of between 15 watts and 500 watts.

* * * * *